United States Patent
Montorsi et al.

(10) Patent No.: US 9,794,104 B1
(45) Date of Patent: Oct. 17, 2017

(54) METHOD AND APPARATUS FOR QUADRATURE SIGNAL MODULATION

(71) Applicant: Huawei Technologies Co., Ltd., Shenzhen (CN)

(72) Inventors: Guido Montorsi, Turin (IT); Sergio Benedetto, Turin (IT); Yan Xin, Kanata (CA); Min Yan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/095,787

(22) Filed: Apr. 11, 2016

Related U.S. Application Data

(63) Continuation of application No. PCT/CN2016/078101, filed on Mar. 31, 2016.

(51) Int. Cl.
*H04L 27/34* (2006.01)
*H04L 27/36* (2006.01)
*H04B 1/02* (2006.01)

(52) U.S. Cl.
CPC ............ *H04L 27/36* (2013.01); *H04B 1/02* (2013.01)

(58) Field of Classification Search
USPC .......................................... 375/298; 455/296
See application file for complete search history.

(56) References Cited

U.S. PATENT DOCUMENTS

| | | | |
|---|---|---|---|
| 9,338,044 B2 * | 5/2016 | Bhardwaj | ......... H04L 25/03159 |
| 2003/0104797 A1 * | 6/2003 | Webster | ............ H04L 25/03159 455/296 |
| 2016/0080192 A1 | 3/2016 | Stadelmeier et al. | |

FOREIGN PATENT DOCUMENTS

| | | |
|---|---|---|
| CN | 101340412 A | 1/2009 |
| WO | 2011016835 A1 | 2/2011 |

OTHER PUBLICATIONS

"IEEE Computer Society Part II: Wireless LAN Medium Access Control (MAC) and Physical Layer (PHY) Specifications; Amendment 3: Enhancements for Very High Throughput in the 60 Ghz Band," IEEE Standard for Information Technology—Telecommunications and Information Exchange Between Systems Local and Metropolitan Area Networks—Specific Requirements, Dec. 28, 2012, pp. 1-628.

* cited by examiner

*Primary Examiner* — Eva Puente
(74) *Attorney, Agent, or Firm* — Slater Matsil, LLP

(57) ABSTRACT

Methods and apparatus for facilitating wireless communication using digital Quadrature Amplitude Modulation are disclosed. A mapping module electronic component of a wireless communication device utilizes a signal constellation for quadrature modulating a signal for transmission or quadrature demodulating a received signal. The signal constellation includes multiple constellation symbols and associated bit sequences. Specific signal constellations are disclosed. The signal constellations may be obtained through an optimization procedure which accounts for both phase noise and power amplifier nonlinearity.

18 Claims, 39 Drawing Sheets

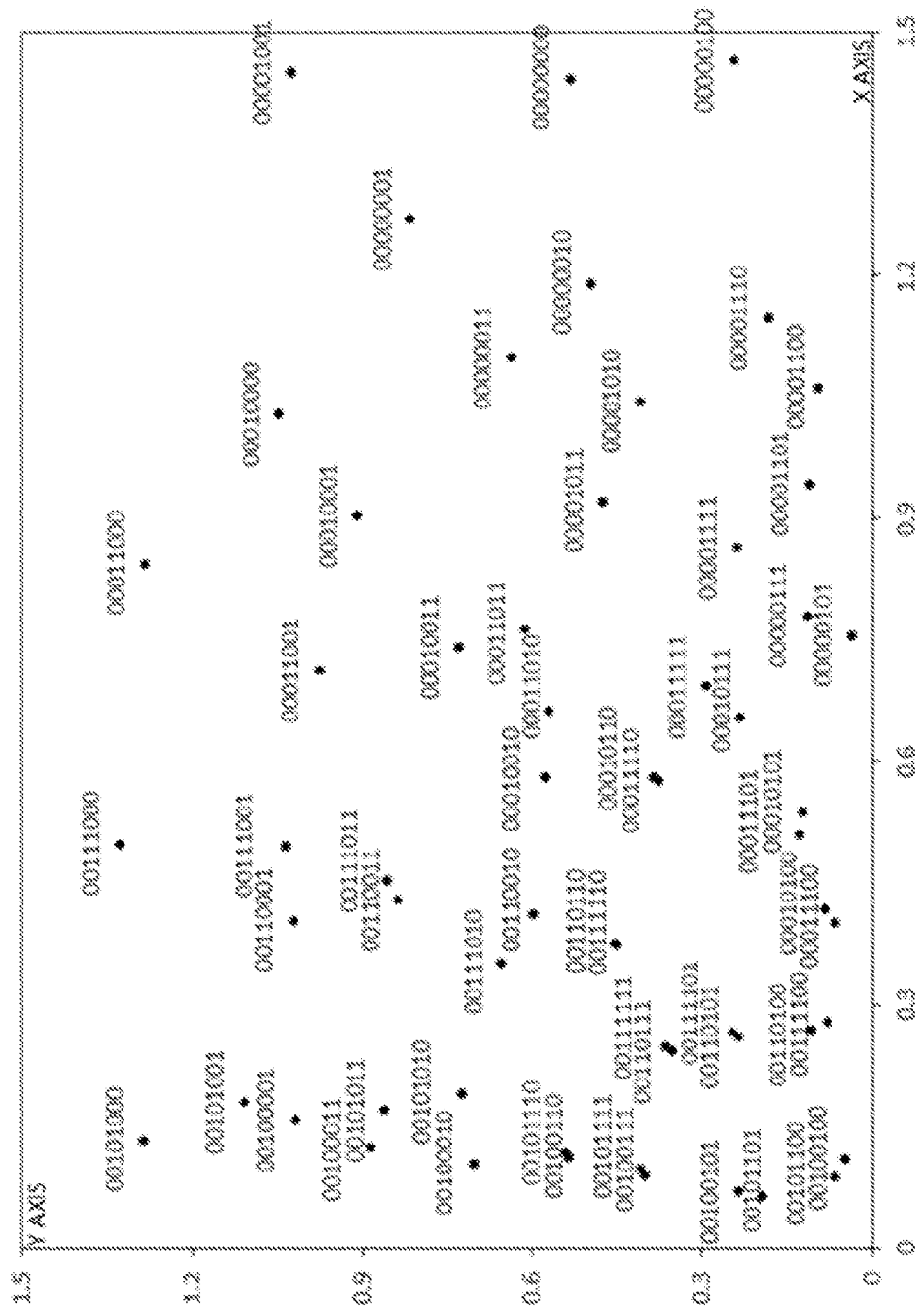

METHOD AND APPARATUS FOR QUADRATURE SIGNAL MODULATION

This application is a continuation of PCT Application No. PCT/CN2016/078101, entitled "Method and Apparatus for Quadrature Signal Modulation," filed on Mar. 31, 2016, which application is hereby incorporated herein by reference.

TECHNICAL FIELD

The present invention pertains to the field of wireless communications, and in particular to a method and apparatus for performing quadrature amplitude modulation, using particular quadrature amplitude modulation constellations.

BACKGROUND

Quadrature amplitude modulation (QAM) has found extensive applications in wired and wireless digital communications systems. In a digital QAM scheme, the QAM constellations are specified by both their amplitude and phase in a quadrature coordination. Phase-shift keying (PSK) modulation can be considered as a special case of QAM where the amplitude of a PSK modulation scheme is constant and the PSK constellations are equally spaced on a circle.

The aim of digital QAM is to communicate a message from a transmitter to a receiver. However, such communication must contend with the presence of noise, such as thermal noise and phase noise, as well as other limitations such as transmitter power limitations. Phase noise (frequency offset) is particularly problematic at higher frequencies, such as 60 GHz and above, and can be generated due to imperfect oscillators in both transmitter and receiver. Use of higher-order QAM in the presence of thermal noise, phase noise, and other limitations, can result in unacceptably high error rates, particularly for higher-frequency communication systems.

Therefore, there is a need for a method and apparatus for quadrature amplitude modulation that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide a method and apparatus for quadrature signal modulation in a wireless communication system. In accordance with embodiments of the present invention, there is provided a method for facilitating wireless communication using digital Quadrature Amplitude Modulation, the method comprising: translating between constellation symbols and bit sequences corresponding to the constellation symbols using a mapping module electronic component of a wireless communication device, in accordance with a signal constellation having a specified number of constellation points, the constellation symbols used in modulating a signal for transmission or detected in a received signal, or both, wherein each of the constellation symbols is specified in a row of one of Tables 17-26C as set forth herein, wherein normalized magnitudes of in-phase components of the constellation symbols are specified in one of the "X" and "Y" columns of said one of the tables and normalized magnitudes of quadrature components of the constellation symbols are specified to a in a different one of the "X" and "Y" columns of said one of the tables. In various embodiments, the signal constellation is specified by the values in the Tables as rounded or truncated to three, four, five or six decimal places. In some embodiments, the signal constellation may be selected from one of a plurality of Tables 17-26C. In various embodiments, the particular bit sequences associated with the constellation symbols are as listed in Tables 17-26C, or are derived from the bit sequences listed in Tables 17-26C by adding a constant binary value to the listed bit sequences, by applying consistent bit reordering operation to the listed bit sequences, or both.

In accordance with embodiments of the present invention, there is provided an apparatus for a wireless communication device configured for wireless communication using digital Quadrature Amplitude Modulation, the apparatus comprising: a mapping module electronic component configured to translate between bit sequences and corresponding constellation symbols in accordance with a signal constellation having a specified number of constellation points, the constellation symbols used in generating a signal for transmission or detected in a received signal, or both, wherein each of the constellation symbols is specified in a row of a one of Tables 17-26C as set forth herein, wherein normalized magnitudes of in-phase components of the constellation symbols are specified in one of the "X" and "Y" columns of said one of the tables and normalized magnitudes of quadrature components of the constellation symbols are specified to a in a different one of the "X" and "Y" columns of said one of the tables. In various embodiments, the signal constellation is specified by the values in the tables as rounded or truncated to three, four, five or six decimal places. In some embodiments, the signal constellation may be selected from one of a plurality of Tables 17-26C. In various embodiments, the particular bit sequences associated with the constellation symbols are as listed in Tables 17-26C, or are derived from the bit sequences listed in Tables 17-26C by adding a constant binary value to the listed bit sequences, by applying consistent bit reordering operation to the listed bit sequences, or both.

BRIEF DESCRIPTION OF THE DRAWINGS

Further features and advantages of the present invention will become apparent from the following detailed description, taken in combination with the appended drawings, in which:

FIG. 12A illustrates the first quadrant of a 256-point signal constellation in accordance with an embodiment of the present invention.

It will be noted that throughout the appended drawings, like features are identified by like reference numerals.

DETAILED DESCRIPTION OF ILLUSTRATIVE EMBODIMENTS

Embodiments of the present invention are directed to a method and apparatus for wireless communication using a digital QAM signal constellation as described herein. The method includes modulating and/or demodulating a signal according to the described constellation, using a wireless transmitter and/or receiver, or associated signal processing electronics. The apparatus includes a wireless transmitter and/or receiver, or associated signal processing electronics, configured to modulate and/or demodulate a signal according to the described constellation. As used herein, QAM refers generally to any amplitude modulation which includes an in-phase component and a quadrature component, for modulating two carrier signals which are in quadrature with each other. For example, phase-shift keying is regarded as a particular form of QAM.

Embodiments of the present invention may be used to wirelessly communicate information between a transmitter and receiver. The information can include control plane data, application data, or user messaging data, for example. On the transmitter side, the information is initially represented as a plurality of binary digits (bits), and modulating the signal comprises mapping a given number m of bits at a time to a corresponding symbol in the signal constellation. On the receiver side, the information is represented via a quadrature modulated waveform, and demodulating the signal comprises mapping portions of the waveform corresponding to a symbol in the signal constellation to an associated sequence of m bits.

Embodiments of the present invention apply high order modulation schemes, in which each of $M=2^m$ symbols in a QAM modulation represents multiple (m>1) bits. Table 1 shows the spectral efficiency $r=mr_c$ and required minimum Signal to Noise Ratio (SNR) based on the Shannon capacity limit, corresponding to different code rates $r_c$ and to different cardinalities of constellation sets $M=2^m$, $m=2, \ldots, 8$.

|  |  | \multicolumn{14}{c}{m} |  |  |  |  |  |  |  |  |  |  |
|---|---|---|---|---|---|---|---|---|---|---|---|---|---|---|---|
|  |  | 2 | | 3 | | 4 | | 5 | | 6 | | 7 | | 8 | |
|  |  | r | min SNR | r | min SNR | r | min SNR | r | min SNR | r | min SNR | r | min SNR | r | min SNR |
| $r_c$ | ½ | 1.00 | 0.0 | 1.50 | 2.6 | 2.00 | 4.8 | 2.50 | 6.7 | 3.00 | 8.5 | 3.50 | 10.1 | 4.00 | 11.8 |
|  | ⅝ | 1.25 | 1.4 | 1.88 | 4.3 | 2.50 | 6.7 | 3.13 | 8.9 | 3.75 | 11.0 | 4.38 | 13.0 | 5.00 | 14.9 |
|  | ¾ | 1.50 | 2.6 | 2.25 | 5.7 | 3.00 | 8.5 | 3.75 | 11.0 | 4.50 | 13.4 | 5.25 | 15.7 | 6.00 | 18.0 |
|  | ⅞ | 1.75 | 3.7 | 2.63 | 7.1 | 3.50 | 10.1 | 4.38 | 13.0 | 5.25 | 15.7 | 6.13 | 18.4 | 7.00 | 21.0 |

Figure 1:
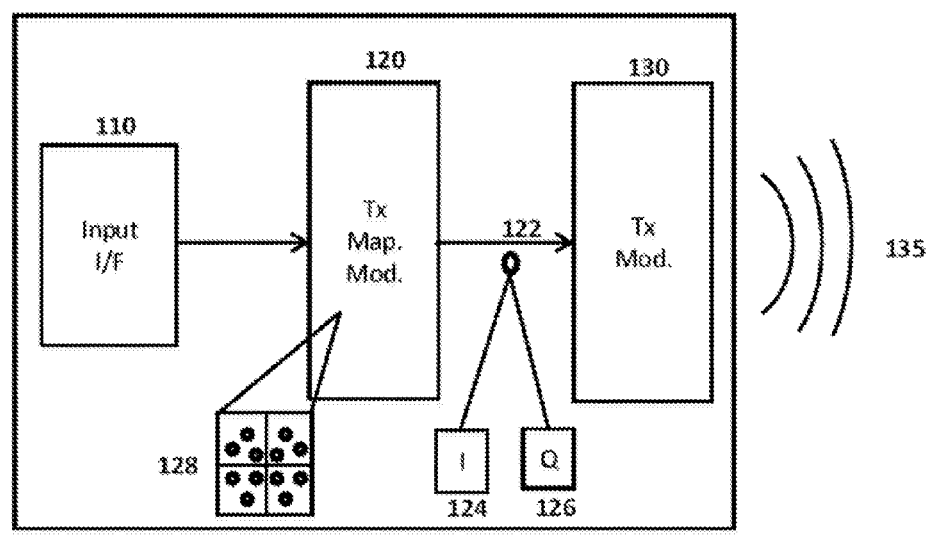
FIG. 1 illustrates a wireless transmitter communication apparatus in accordance with an embodiment of the present invention.

In accordance with embodiments of the present invention, and with reference to FIG. 1, a wireless communication apparatus comprising an input interface 110, a transmitter mapping module 120, and a transmitter module 130 is disclosed. The input interface 110 is configured to receive data to be wirelessly transmitted. The data may be represented in binary, and may include at least m bits, where m is the base-2 logarithm of the modulation order of the quadrature modulation constellation being used. The transmitter mapping module 120 is configured to receive one or more bit sequences. Each bit sequence is representative of a portion of the data of length m. A bit sequence may correspond directly to m contiguous bits of the data, or it may be derived from the data by applying operations such as scrambling, interleaving, channel coding, etc. The transmitter mapping module is further configured to generate, for each bit sequence, a corresponding constellation symbol 122 having an in-phase component 124 and a quadrature component 126. Correspondence between a bit sequence and the generated constellation symbol is given according to a particular signal constellation 128, as described herein. Typically, multiple bit sequences representative of the input data are used to generate a sequence of constellation symbols. The transmitter module 130 is configured to generate and transmit a wireless signal 135 based on the constellation symbols generated by the mapping module.

Generation of wireless signals based on constellation symbols can be performed in a manner as would be readily understood by a worker skilled in the art. For example, a sequence of in-phase components can be used to amplitude modulate a first sinusoidal carrier signal, and a corresponding sequence of quadrature components can be used to amplitude modulate a second sinusoidal carrier signal that is out of phase (in quadrature) with the first sinusoidal signal. The sequences of in-phase and quadrature components can be represented, for example, as pulse trains or other electrical signals with amplitudes varying according to the magnitudes of the in-phase and quadrature components, for example, to be used for amplitude modulation of the carrier signals. The amplitude modulated carrier signals are then added together and transmitted.

Figure 2:
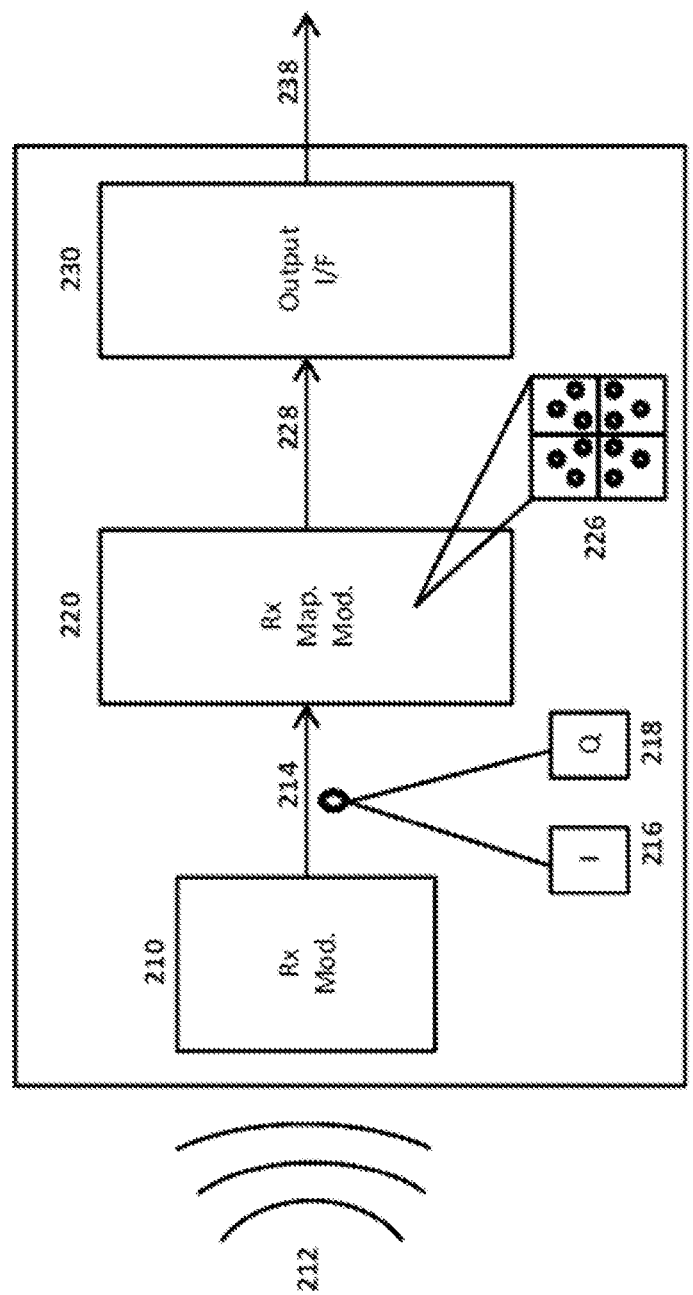
FIG. 2 illustrates a wireless receiver communication apparatus in accordance with another embodiment of the present invention.

In accordance with embodiments of the present invention, and with reference to FIG. 2, a wireless communication apparatus comprising a receiver module 210, a receiver mapping module 220, and an output interface 130 is disclosed. The receiver module is configured to receive a wireless signal 212 and generate constellation symbols 214 based on the wireless signal, each constellation symbol having an in-phase component 216 and a quadrature component 218. Generation of constellation symbols based on a received wireless signal can be performed in a manner as would be readily understood by a worker skilled in the art. For example, the received signal can be multiplied by locally generated copies of the carrier signal, low-pass filtering may be applied to the result, and the output of the low-pass filtering can be sampled to recover representations of the in-phase and quadrature components of the constellation symbols. The sampling includes quantization. For hard-decision decoding, the receiver mapping module 220 is configured to receive constellation symbols 214 and generate, for each constellation symbol, a bit sequence 228 corresponding to the constellation symbol. Correspondence between a bit sequence and a received constellation symbol is given according to a particular signal constellation 226, as described herein. The output interface 230 is configured to provide data 238, a portion of the data represented by the generated bit sequence 228 associated with a received constellation symbol. Alternatively, soft-decision decoding, such as Low Density Parity Check LDPC decoding or turbo decoding may be employed, in which a demodulator outputs a sequence of log-likelihood ratios (LLRs) rather than performing direct symbol-to-bit mapping. A decoder then uses the LLR values for decoding.

The provided group of m bits may directly represent m bits of the data, or the portion of data may be obtained at least partially from the generated bit sequence by applying operations such as descrambling, deinterleaving, decoding, etc. Typically, the received wireless signal is used to generate a sequence of constellation symbols which are passed to the receiver mapping module. The receiver mapping module then generates the data using hard-decision decoding or soft-decision decoding.

Figure 3:
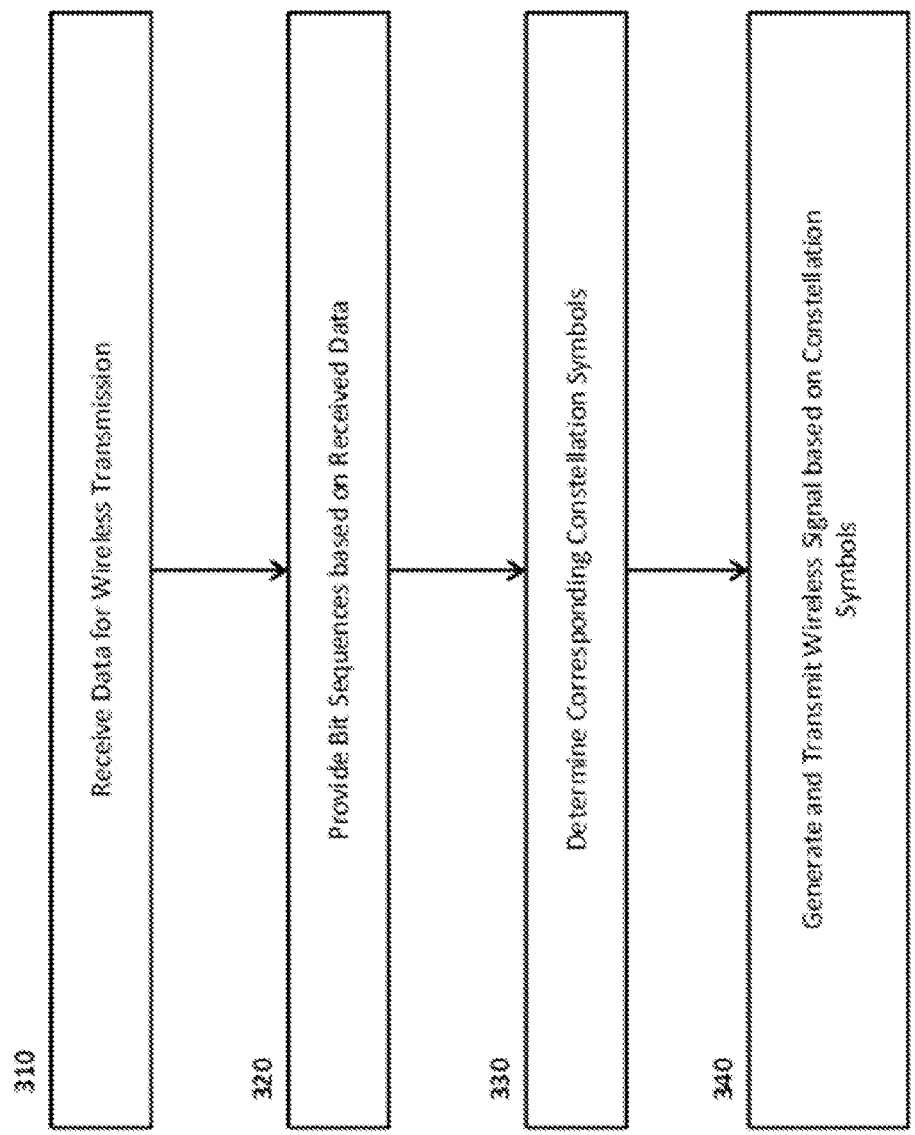
FIG. 3 illustrates a method for wireless transmission of QAM symbols, in accordance with an embodiment of the present invention.

In accordance with embodiments of the present invention, and with reference to FIG. 3, there is provided a method for facilitating wireless transmission of QAM symbols. The method includes receiving 310, via an internal input interface of a wireless communication device, data to be wirelessly transmitted. The data may include at least m bits, where m is determined by the modulation order of the quadrature modulation scheme being used. The method further includes providing 320 one or more bit sequences. Each bit sequence is representative of a portion of the data, for example subsequent to operations such as but not necessarily limited to channel coding. Each bit sequence is of length m, where m is the predetermined value corresponding to the modulation order. The method further includes determining 330, for each bit sequence, a corresponding constellation symbol having an in-phase component and a quadrature component. Correspondence between a bit sequence and the provided constellation symbol is given according to a particular signal constellation, as described herein. Typically, multiple bit sequences representative of the input data are used to generate a sequence of constellation symbols. The method may further include generating and transmitting 340 a wireless signal based on the determined constellation symbols. The generation of the wireless signal comprises modulating a carrier signal according to the generated sequence of constellation symbols.

Figure 4:
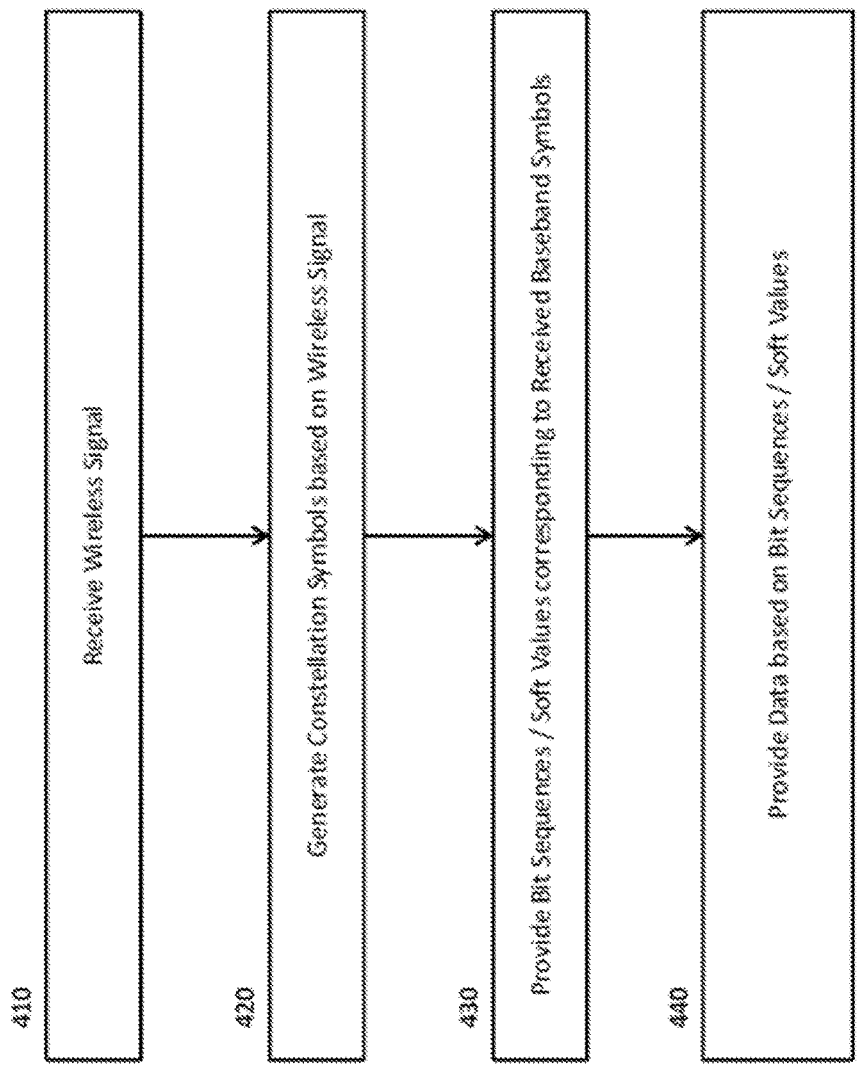
FIG. 4 illustrates a method for wireless reception of QAM symbols, in accordance with an embodiment of the present invention.

In accordance with embodiments of the present invention, and with reference to FIG. 4, there is provided a method for performing wireless reception and demodulation of QAM symbols. The method includes receiving 410 a wireless signal and generating 420 received baseband symbols based on the wireless signal, each received baseband symbol having an in-phase component and a quadrature component. The received baseband symbol can either generate a bit sequence by mapping the most likely constellation symbol to a corresponding bit sequence based on the constellation mapping, or form a sequence of bit-related soft values indicating the likelihood of bit values at the specific bit positions of a bit sequence corresponding to the selected constellation symbol. As such, the method further includes providing 430 bit sequences or soft values corresponding to the received baseband symbol. A received constellation symbol is given according to a particular signal constellation, as described herein. The method further includes providing 440 data, a portion of the data represented by the provided bit sequence or a sequence of soft values associated with a received symbol. The data may be provided, for example, by performing channel decoding and other operations on the bit sequences.

Embodiments of the present invention provide for methods and apparatus for generating constellation symbols based on bit sequences and/or generating bit sequences or sequences of bit-related soft values based on constellation symbols, according to a correspondence which is specified by a signal constellation as described herein. Such embodiments may be represented in the transmitter mapping module and receiver mapping module described above, collectively referred to as mapping modules. For example, a provided apparatus may receive groups of m bits and generate constellation symbols, including in-phase and quadrature components, corresponding to the received bit sequences. Bit sequences may be represented by digital signals, such as serial or parallel digital data signals, for example. Sequences of constellation symbols may be represented, for example, by pairs of electrical signals having amplitudes which vary with the magnitudes of the in-phase and quadrature components of the constellation symbols. As another example, sequences of constellation symbols may be represented by time-varying digital or analog signals which convey instructions for use by another electronic device to generate such pairs of electrical signals. For a reception operation, a provided apparatus may receive pairs of electrical signals having amplitudes or other characteristics which are interpreted, by the apparatus, as the magnitudes of a received sequence of in-phase and quadrature components of a received sequence of constellation symbols. The apparatus may then generate a plurality of bit sequences or plurality of bit-related soft values in a larger sequence, which correspond to the received sequence of constellation symbols.

Embodiments of the present invention therefore comprise translating, for example using mapping modules, between constellation symbols and bit sequences according to a particular signal constellation. In the case of signal transmission, the translating includes generating constellation symbols based on bit sequences. In the case of signal reception, the translating includes generating bit sequences or bit-related sequences of soft values based on constellation symbols. Other aspects of signal modulation and/or demodulation, such as varying the amplitudes of carrier signals and/or processing a received signal recover constellation symbols, may be, but are not necessarily, included in the embodiments of the present invention.

Figure 5:
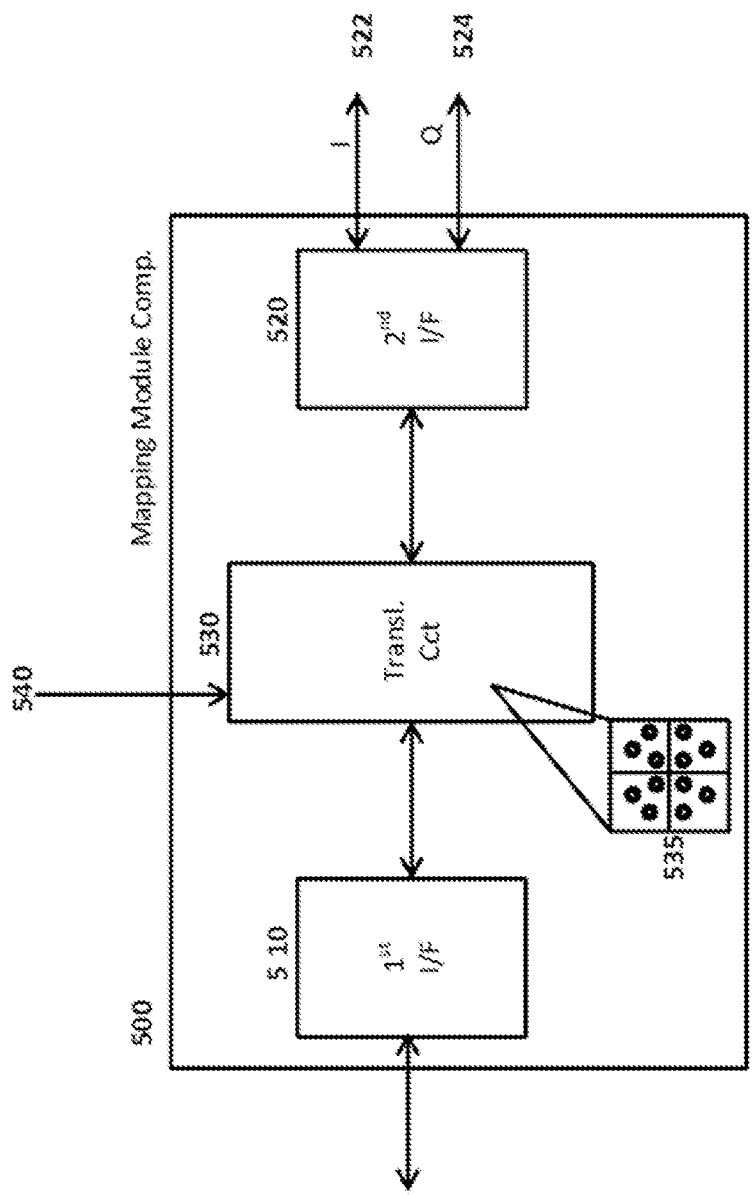
FIG. 5 illustrates a mapping module electronic component in accordance with embodiments of the present invention.

FIG. 5 illustrates a mapping module electronic component 500 provided in accordance with embodiments of the present invention. The electronic component may be provided as a semiconductor circuit, for example forming part or all of an integrated circuit package. The mapping module electronic component can be configured as a transmitter mapping module, a receiver mapping module, or both. The mapping module includes a first interface 510 configured to provide and/or receive groups of m bits. The mapping module further includes a second interface 520 configured to receive and/or provide signals indicative of constellation symbols. In some embodiments the second interface may include a first terminal 522 for receiving and/or providing in-phase components of the constellation symbols, and a second terminal 524 for receiving and/or providing quadrature components of the constellation symbols. The mapping module is configured to translate, via translation circuitry 530, between bit sequences and constellation symbols according to a signal constellation 535. The translation circuitry may be digital or analog circuitry. In some embodiments, the translation circuitry is preconfigured according to a certain signal constellation. In other embodiments, the translation circuitry is reconfigurable according to a signal constellation which can be specified or selected via a control interface 540 of the mapping module.

Embodiments of the present invention are applied for signal modulation in millimeter wave (mmWave) wireless communication systems. Some embodiments of the present invention are applicable to signal modulation in Wi-Fi™ communication systems, as specified in the IEEE 802.11 series of standards. Some embodiments of the present invention are applicable to signal modulation in wireless communication systems employing a carrier frequency around 60 GHz. It will be readily appreciated that embodiments of the present invention can be applied to other wireless communication systems, as well as to wired or optical systems, and in other communication environments.

Figure 6:
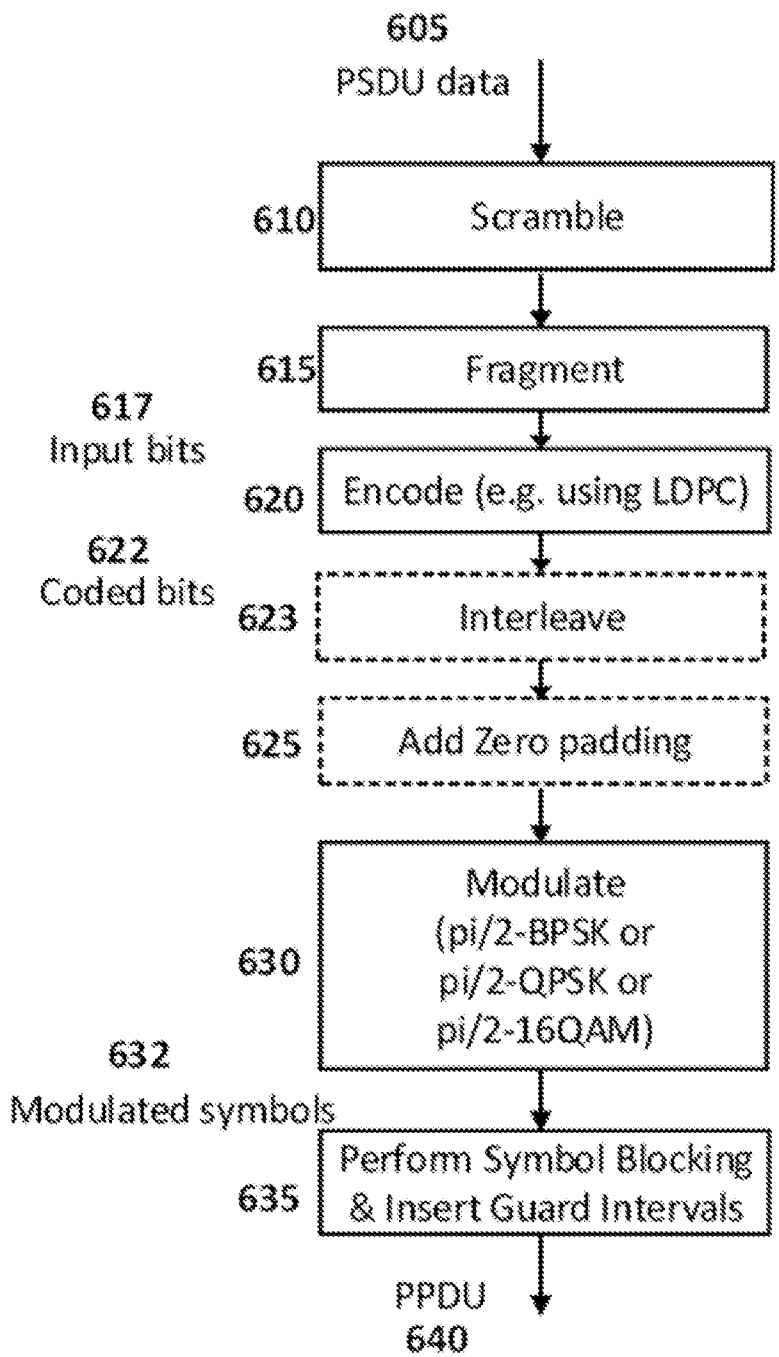
FIG. 6 illustrates the generation of a physical layer protocol data unit (PPDU) from a physical layer service data unit (PSDU) in a single carrier physical layer, in accordance with an IEEE 802.11ad wireless communication approach which may be utilized in embodiments of the present invention.

FIG. 6 illustrates the generation of a physical layer protocol data unit (PPDU) from a physical layer service data unit (PSDU) in a single carrier physical layer, in accordance with a wireless communication approach which may be utilized in embodiments of the present invention. The operations illustrated in FIG. 6 are comparable to those specified in the IEEE 802.11ad wireless local area network protocol, and details can be found in the IEEE 802.11ad-2012 standards document, published December, 2012 and having E-ISBN 978-0-7381-8096-0. The single carrier physical layer may employ low-density parity check (LDPC) codes, for example with a code word length of 672. The input PSDU data 605 undergoes scrambling 610, and the scrambled bits are fragmented 615 to provide input bits 617. The input bits are then encoded 620, for example using a LDPC code, to provide coded bits 622. An optional interleaving operation 623 can be performed following encoding. Interleaving can include shuffling encoded bits, for example. The coded and possibly interleaved bits then optionally undergo zero padding 625. The coded bits, with or without zero padding, are then modulated 630. In embodiments of the present invention, modulation may be performed using a signal constellation as described herein. The modulated symbols 632 then undergo symbol blocking and guard insertion 635, thereby providing the PPDU 640. In general, modulation operations according to the present invention may be performed after channel coding, such as LDPC coding.

Figure 7:
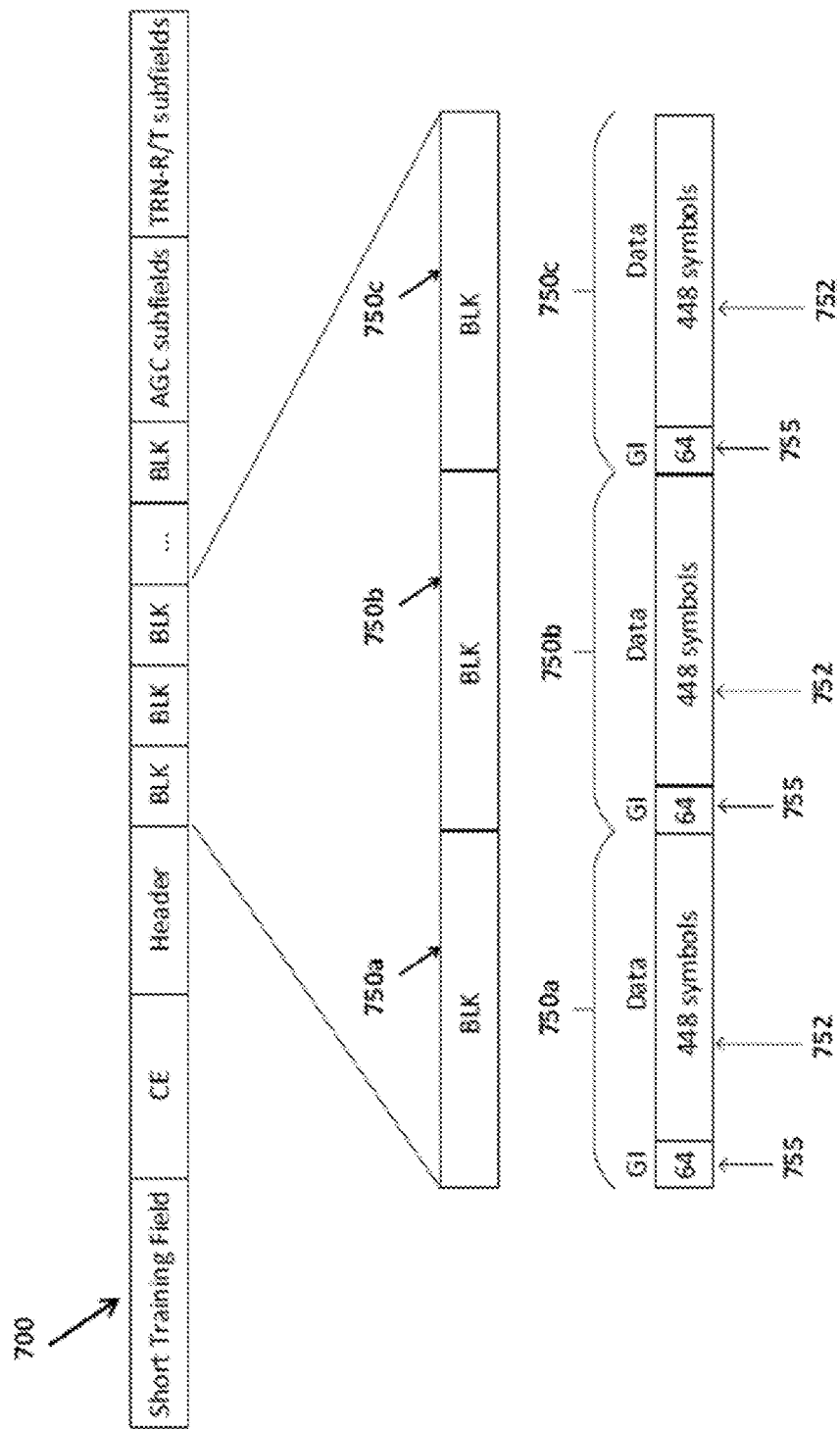
FIG. 7 illustrates an IEEE 802.11ad single carrier physical layer frame format and associated block structure which may be utilized in accordance with embodiments of the present invention.

FIG. 7 illustrates an IEEE 802.11ad single carrier physical layer frame format 700 and associated block structure which may be utilized in accordance with embodiments of the present invention. A set of three contiguous data block structures 750a, 750b, 750c are illustrated in detail. The number of data block structures can be variable. Each data block structure 750a, 750b, 750c in a PPDU includes 448 modulated data symbols 752 preceded by a guard interval (GI) 755. For multiple contiguous blocks, groups of 448 modulated data symbols 752 are thus separated by GIs 755 of the same length-64 bipolar Golay sequence. The two GIs 755 preceding and following a given group of 448 modulated data symbols 752 form a cyclic prefix permitting FFT/IFFT operations at a receiver to perform frequency-domain equalization. In addition, the known GIs can be used for other purposes such as phase noise estimation for mitigation of phase noise.

Embodiments of the present invention relate to signal modulation and/or demodulation in single carrier systems, for example using the data block structure as illustrated in FIG. 7. Embodiments of the present invention relate to signal modulation and/or demodulation in single carrier systems with other formats of data block structure.

Embodiments of the present invention relate to signal modulation and/or demodulation in communication systems with or without phase noise. Phase noise can significantly degrade the link performance in high-frequency communication systems employing high order digital QAM modulations. The power spectral density of one model of phase noise considered for IEEE 802.11ad is shown in Eq. (1):

$$PSD(f) = PSD(0)\left[\frac{1+(f/f_z)^2}{1+(f/f_p)^2}\right]. \quad (1)$$

The parameterization of this model as considered for IEEE 802.11ad is such that: PSD(0)=−90 dBc/Hz; Pole frequency $f_p$=1 MHz; Zero frequency $f_z$=100 MHz; Corresponding PSD(infinity)=−130 dBc/Hz; and impairment is modeled at both transmitter and receiver. In embodiments of the present invention, signal constellations are provided which have been configured in view of the above phase noise model.

Embodiments of the present invention relate to signal modulation and/or demodulation in communication systems with or without power amplifier nonlinearity impairments. The power constraints may include peak-to-average power ratio (PAPR) constraints. A first power amplifier nonlinearity model considered for IEEE 802.11ad is given in Equation (2):

$$G(A) = g\frac{A}{\left(1+\left(\frac{gA}{A_{sat}}\right)^{2s}\right)^{\frac{1}{2s}}} \text{ in RMS Volts}, \quad (2)$$

where g is the small signal gain, s is the smoothness factor, and $A_{sat}$ is the saturation level.

A second power amplifier nonlinearity model considered for IEEE 802.11ad is given in Equation (3):

$$\Psi(A) = \frac{\alpha A^{q_1}}{\left(1+\left(\frac{A}{\beta}\right)^{q_2}\right)}. \quad (3)$$

For Equations (2) and (3) above, CMOS power amplifier model parameters can be specified as follows. For Equation (2): g=4.65, $A_{sat}$=0.58 and s=0.81. For Equation (3): α=2560 degrees, β=0.114, $q_1$=2.4 and $q_2$=2.3.

In embodiments of the present invention, signal constellations are provided which have been configured in view of the above power amplifier nonlinearity model.

Embodiments of the present invention include signal constellations which have been generated according to a constellation optimization for two scenarios. The first scenario relates to single carrier systems with a linear channel and without a transmit power constraint. The second scenario relates to a non-linear channel with nonlinearity impairments. For both scenarios, sub-scenarios which include or exclude phase noise are considered. In some embodiments, constellations are optimized in view of both the transmit power and phase noise constraints. In various embodiments the phase noise model and the PA model used for the constellation optimization are given in Equations (1)-(3) above. Multiple sets of 16-, 32-, 64-, 128- and 256-point constellations may be generated using this optimization approach. Selected ones of these constellations are disclosed herein.

It is noted that a constellation that is considered optimal for a particular code rate is not limited for use with that code rate. Rather, a constellation can be used for various code rates, even if it has been optimized for use with a particular code rate. The use of the constellation for different code rates may result in a reduction in performance and/or loss of optimality. More generally, it is noted that a constellation that is considered optimal for a particular set of conditions can be used in other conditions, with a possible reduction in performance and/or loss of optimality. However, such a performance reduction may be acceptable. Further, the reduced complexity due to the ability to use the same constellation under different conditions may result in a benefit which offsets the performance reduction.

Various signal constellations provided in accordance with embodiments of the present invention are described in detail below. Each signal constellation represents a set of constellation symbols. A signal constellation having M points is referred to as an M-point constellation. In various embodiments, the x coordinate value of a constellation symbol indicates the (normalized) magnitude of the in-phase component of the constellation symbol, and the y coordinate value of a constellation symbol indicates the (normalized) magnitude of the quadrature component of the constellation symbol. Alternatively, the x coordinate value of a constellation symbol may indicate the (normalized) magnitude of the quadrature component of the constellation symbol, and the y coordinate value of a constellation symbol indicates the (normalized) magnitude of the in-phase component of the constellation symbol. A sequence of m bits may be associated with each constellation symbol.

In some cases, only the first quadrant of a constellation is specified. As such, in some embodiments, the locations of constellation symbols in other quadrants of the constellation can be readily obtained from the constellation symbols in the first quadrant by reflection symmetry. For reflection symmetry, given constellation symbols in the first quadrant, the locations of constellation symbols in the second quadrant can be obtained by reflection in the Y (vertical) axis. More specifically, the reflection operation can include, for each constellation symbol in the first quadrant specified by vector location (x,y), obtaining a constellation symbol in the second quadrant specified by vector location (-x, y). Similarly, given constellation symbols in the first quadrant, the locations of constellation symbol in the third quadrant can be obtained by reflection in the Y axis, followed by reflection in the X (horizontal) axis. More specifically, the reflection operation can include, for each constellation symbol in the first quadrant specified by vector location (x,y), where x and y are non-negative values, obtaining a constellation symbol in the third quadrant specified by vector location (-x,-y). Similarly, given constellation symbols in the first quadrant, the locations of constellation symbol in the fourth quadrant can be obtained by reflection in the X (horizontal) axis. More specifically, the reflection operation can include, for each constellation symbol in the first quadrant specified by vector location (x,y), obtaining a constellation symbol in the second quadrant specified by vector location (x, -y). Alternatively to obtain constellation symbols in different quadrants from those of the first quadrant by the reflection operations above, a series of reflection operations can be used. For example, the constellation symbols in the second quadrant can be obtained from those of the first quadrant by reflection in the Y axis, the constellation symbols in the third quadrant can be obtained from those of the second quadrant by reflection in the X axis, and the constellation symbols in the fourth quadrant can be obtained from those of the third quadrant by reflection in the Y axis. As used herein, the term "reflection symmetric constellation symbols" refers to a set of four constellation symbols (x,y), (x,-y), (-x,-y), (-x,y) for given values of x and y.

As used herein, the term "symmetric constellation symbols" refers to "reflection symmetric constellation symbols". A constellation consisting of reflection symmetric constellation symbols may also be referred to as a reflection symmetric constellation, or as a "symmetric constellation".

In various embodiments, the illustrated signal constellations can be scaled by a nonzero scaling factor k. Scaling of a signal constellation can be performed by mapping each constellation symbol (x,y) in the constellation to a new constellation symbol (kx,ky). The (x,y) coordinate values illustrated in FIGS. 8-17C and specified in Tables 17-26C are nominal. In Tables 17-21C constellation magnitudes are normalized such that the average power, across all constellation symbols, is equal to one. In Tables 22-26C, constellation magnitudes are normalized such that the power of each constellation symbol is less than or equal to one. The specified coordinate values may alternatively be normalized such that the peak power, among all constellation symbols, is equal to one. The present description of the specified constellations should be understood to include other scalings or normalizations thereof, for example as would be readily understood by a worker skilled in the art.

In various embodiments, the (x,y) locations of constellation symbols in the illustrated signal constellations can be varied by a limited amount. For example, when the locations of constellation symbols are specified in one embodiment with a precision of d decimal places, another embodiment may correspond to the same general locations of constellation symbols, but specified with a precision of d−1 decimal places, another embodiment correspond to the same general locations of constellation symbols but specified with a precision of d−2 decimal places, and yet another embodiment correspond to the same general locations of constellation symbols but specified with a precision of d−3 decimal places. The lower precision embodiment can be obtained from the higher precision embodiment through rounding or truncation. In various embodiments, the normalized (x,y) locations of the constellation symbols can be specified to 3, 4, 5, or 6 decimal places. A magnitude that is defined by a coordinate value to at least d decimal places of precision is a magnitude which, when measured, agrees with the coordinate value to at least d decimal places of precision, further decimal places of the measurement and/or coordinate value being either discarded via truncation or subjected to a rounding operation to the $d^{th}$ decimal place.

In some embodiments, the precision of the decimal places may be related to Error Vector Magnitude (EVM) requirement, taking into account factors such as I/Q arm amplitude and phase balance, DC offset, and phase noise. In IEEE 802.11ad, EVM is typically required to be as low as −21 dB for single carrier transmissions and −26 dB for OFDM transmissions.

As another example, when the locations of constellation symbols are specified in a first embodiment with a precision of d decimal places, a second embodiment may correspond to the same general locations of constellation symbols, but varied by up to δ units, where δ is on the order of $10^{-d}$, or alternatively $10^{-d+1}$ or $10^{-d+2}$, so that, for example, given a constellation symbol (x,y) in the first embodiment, the second embodiment may include a corresponding constellation symbol (x',y'), where (x−δ,y−δ)<(x',y')<(x+δ,y+δ), or alternatively where $\|(x',y')-(x,y)\|<\delta$.

In embodiments of the present invention, the normalized magnitudes of the constellation symbols are defined by coordinates which fall anywhere within a rectangular region, including along a boundary of the rectangular region. For each constellation symbol, the rectangular region is defined by a first corner specified by a first coordinate pair and a second corner specified by a second coordinate pair. The second corner is diagonally opposite the first corner. For a signal constellation as specified in one of Tables 17-26C, and for each listed coordinate pair in the table, the first coordinate pair (specifying the first corner of the rectangular region) can be derived from the listed coordinate pair by rounding down both X and Y values of the listed coordinate pair. The second coordinate pair (specifying the second corner of the rectangular region) can be derived from the listed coordinate pair by rounding up both X and Y values of the listed coordinate pair. In some embodiments, rounding is performed to the nearest thousandth, as would be readily understood by a worker skilled in the art. In some embodiments, rounding is performed to the nearest ten thousandth. In some embodiments, rounding is performed to the nearest hundred thousandth.

As such, for each of original Tables 17-26C, a new table can be defined in which the "X" column of the original table is replaced with a pair of columns "Xmin" and "Xmax," and the "Y" column of the original table is replaced with a pair of columns "Ymin" and "Ymax." The "Xmin" and "Ymin" columns list the X and Y values of the first coordinate pairs, and the "Xmax" and "Ymax" columns list the X and Y values of the second coordinate pairs. The new table indicates a set of ranges for the constellation symbols, such that the normalized magnitude of each constellation symbol has an X coordinate value lying between a value specified in a corresponding row of the "Xmin" column and a value specified in the same row of the "Xmax" column, and further such that the normalized magnitude of the constellation symbol has a Y coordinate value lying between a value specified in the same row of the "Ymin" column and a value specified in the same row of the "Ymax" column. Such new tables are not explicitly listed in the present disclosure for the sake of brevity, however they can be readily derived as described above by a person skilled in the art.

In some embodiments, rather than determining the corners of the rectangular regions via rounding, the first corner of the rectangular region can be derived from the listed coordinate pair by subtracting a first predetermined value from the X value of the listed coordinate pair, and subtracting a second predetermined value from the Y value of the listed coordinate pair. The second coordinate pair specifying the second corner of the rectangular region can be derived from the listed coordinate pair by adding the first predetermined value to the X value of the listed coordinate pair, and adding the second predetermined value to the Y value of the listed coordinate pair. The first and second predetermined values can be values which are less than or equal to 0.0005, for example.

In addition to specifying the vector locations of the constellation symbols in the XY plane, embodiments of the present invention specify the bit sequences corresponding to each of the constellation symbols. As will be readily understood by a worker skilled in the art, given an input group of m bits, modulation includes identifying a symbol in the signal constellation corresponding to the bit sequence, and modulating a signal according to the identified symbol. Similarly, demodulation of a received signal includes identifying a symbol in the signal constellation most closely corresponding to a given portion of the received signal, and outputting the bit sequence corresponding to the identified symbol or the bit-related sequence of soft values corresponding to the constellation. The correspondence between a signal and a constellation symbol may be such that, where the signal is locally describable by the function $A\cos(\omega t)+B\sin(\omega t)$, the corresponding constellation symbol is the closest constellation symbol in the XY plane to point (A,B).

In various embodiments, each group of m bits includes two quadrant-specifying bits. The quadrant-specifying bits may be at fixed locations in the bit sequence. For example, the first two bits (most significant bits) of a bit sequence may be the quadrant-specifying bits. The remaining m−2 bits of a bit sequence are referred to as quadrant non-specific bits. In some embodiments, the quadrant specifying bits corresponding to all constellation symbols in the first quadrant are 00, the quadrant specifying bits corresponding to all constellation symbols in the second quadrant are 10, the quadrant specifying bits corresponding to all constellation symbols in the third quadrant are 11, and the quadrant specifying bits corresponding to all constellation symbols in the fourth quadrant are 01.

In various embodiments, the quadrant non-specific bits (for example the m−2 least significant bits) of each given constellation symbol may be identical to the quadrant non-specific bits of each other constellation symbol within the same set of symmetric constellation symbols as the given constellation symbol.

It will be readily understood that the correspondence between bit sequences and constellation symbols can be varied in several ways. For example, each of the illustrated bit values inverted, such that a "0" bit becomes a "1" and vice versa. As another example, the illustrated bit positions can be re-ordered. The reordering may be a consistent bit reordering, i.e. in which the same reordering is applied to all bit sequences in a constellation. A simple example of a reordering is a reversal of all bits, for example such that group abcd is replaced by group dcba. As yet another example, a constant value can be added to each of the illustrated bit sequences using a modulo-M binary addition operation, where $M=2^m$ and m is the number of bits in each bit sequence. It is noted that bit inversion corresponds to addition of a particular constant value consisting of all binary ones. A combination of bit reordering and addition of a constant value may also be performed.

In some embodiments, for an index value k ranging from k=1 to k=$2^{m-2}$ inclusive, where m is the number of bits in each bit sequence: the quadrant non-specific bits of the bit sequence corresponding to the constellation symbol defined by a $k^{th}$-listed one of the coordinate pairs are equal to: a binary representation of k−1; the binary representation of k−1 added to a constant value under Modulo-$2^{m-2}$ addition; the binary representation of k−1 subjected to a consistent bit reordering, or the binary representation of k−1 added to a constant value under Modulo-$2^{m-2}$ addition and subjected to the consistent bit reordering.

It is noted that, in Tables 17-26C, the bit sequences associated with the constellation symbols correspond to binary representations of the position of the constellation symbol in the list. For example, the first-listed constellation symbol is associated with bit sequence '0 . . . 000', the second-listed constellation symbol is associated with bit sequence '0 . . . 001', etc.

In various embodiments, bit sequences are assigned to constellation symbols using a Gray mapping. Gray mapping comprises associating bit patterns (bit sequences) with constellation symbols, such that the bit sequences associated with adjacent constellation symbols differ by only one bit. That is, the bit sequences assigned to the constellation symbols closest to a first constellation symbol differ by one bit from the bit sequence assigned to the first constellation symbol. Two dimensional Gray mapping comprises associating bit sequences with constellation symbols, such that the bit sequences associated with adjacent constellation symbols differ by only one bit, and the bit sequences associated with the next nearest constellation symbols differ by two bits. The term "adjacent" can be taken to mean closest in terms of a distance metric applied to constellation points in the signal constellation.

Figure 8:
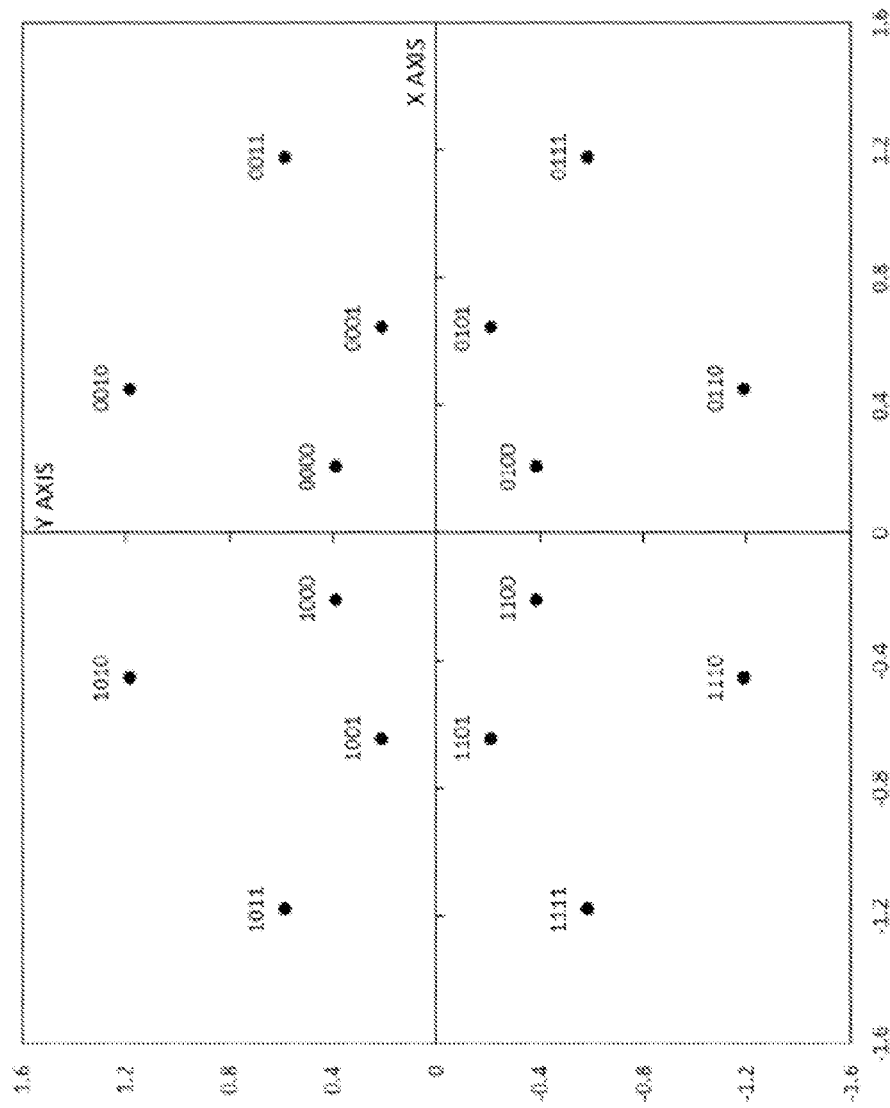
FIG. 8 illustrates a 16-point signal constellation in accordance with an embodiment of the present invention.

FIG. 8 illustrates a 16-point signal constellation provided in accordance with an embodiment of the present invention. The corresponding (x,y) coordinate values of the constellation symbols illustrated in FIG. 8 are provided to six decimal places in Table 17. The signal constellation of FIG. 8 is optimized for use with a code rate of 3/4, and is also suitable for use with other code rates. The code rate corresponds to a channel code which is applied to the bit sequences prior to mapping to constellation symbols for transmission, and which is used for decoding to recover the coded information bits. In FIGS. 8-17C, bit sequences (according to some embodiments of the present invention) are shown generally above their corresponding constellation points. Ambiguities can be resolved by reference to the corresponding tables.

Figure 9:
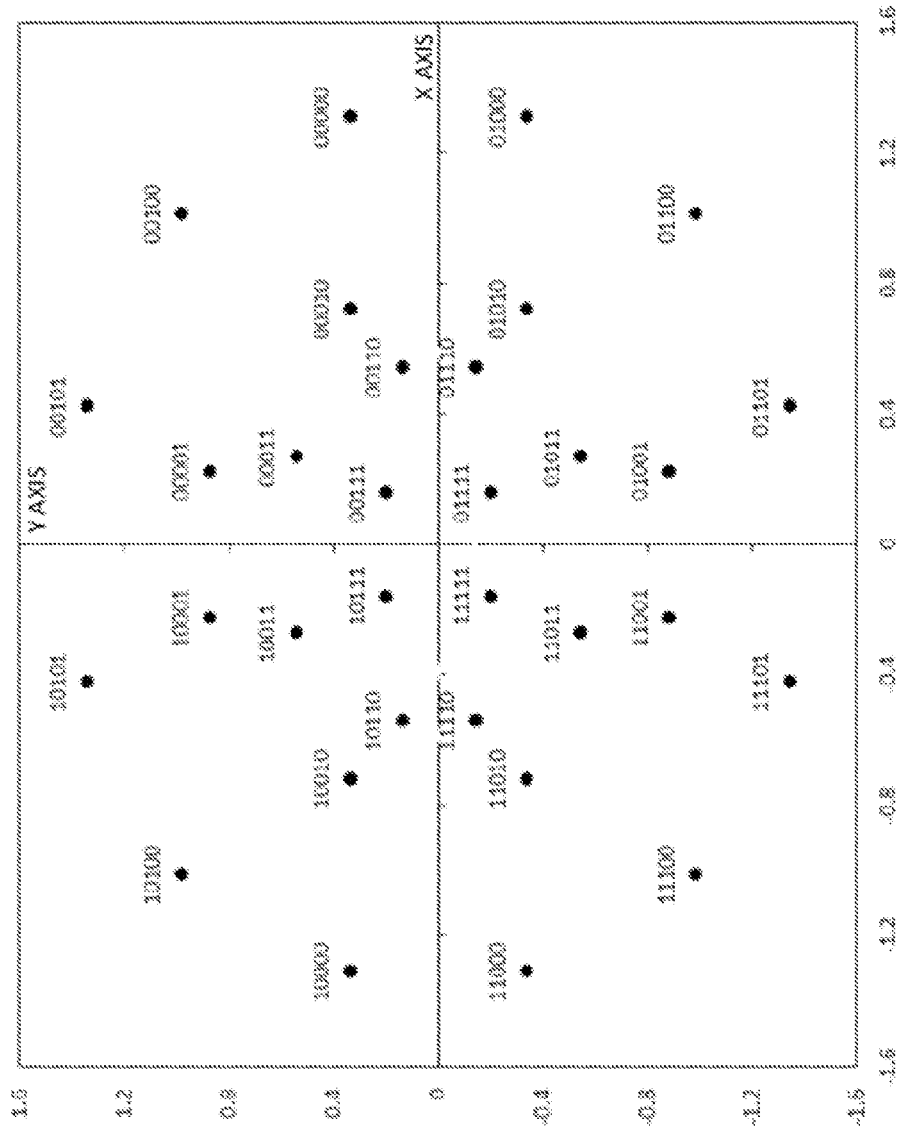
FIG. 9 illustrates a 32-point signal constellation in accordance with an embodiment of the present invention.

FIG. 9 illustrates a 32-point signal constellation provided in accordance with an embodiment of the present invention. The corresponding (x,y) coordinate values of the constellation symbols illustrated in FIG. 9 are provided to six decimal places in Table 18. The signal constellation of FIG. 9 is optimized for use with a code rate of 3/4 and is also suitable for use with other code rates.

Figure 10A:
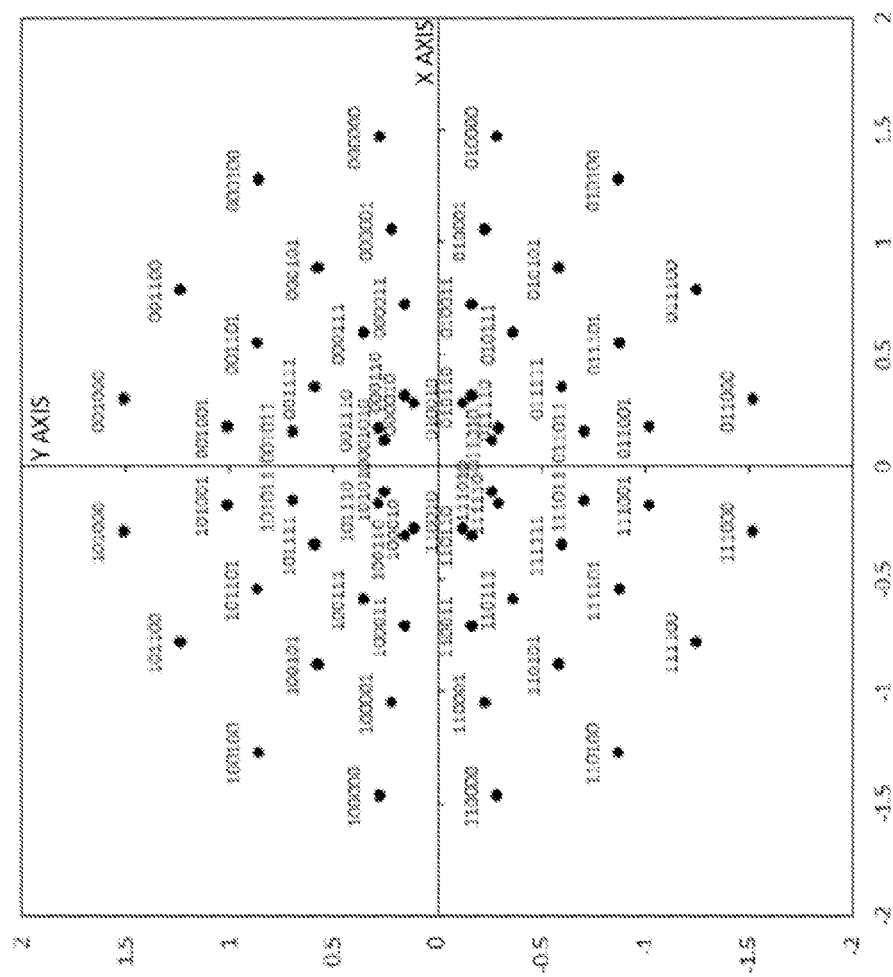
FIG. 10A illustrates a 64-point signal constellation in accordance with an embodiment of the present invention.
Figure 10B:
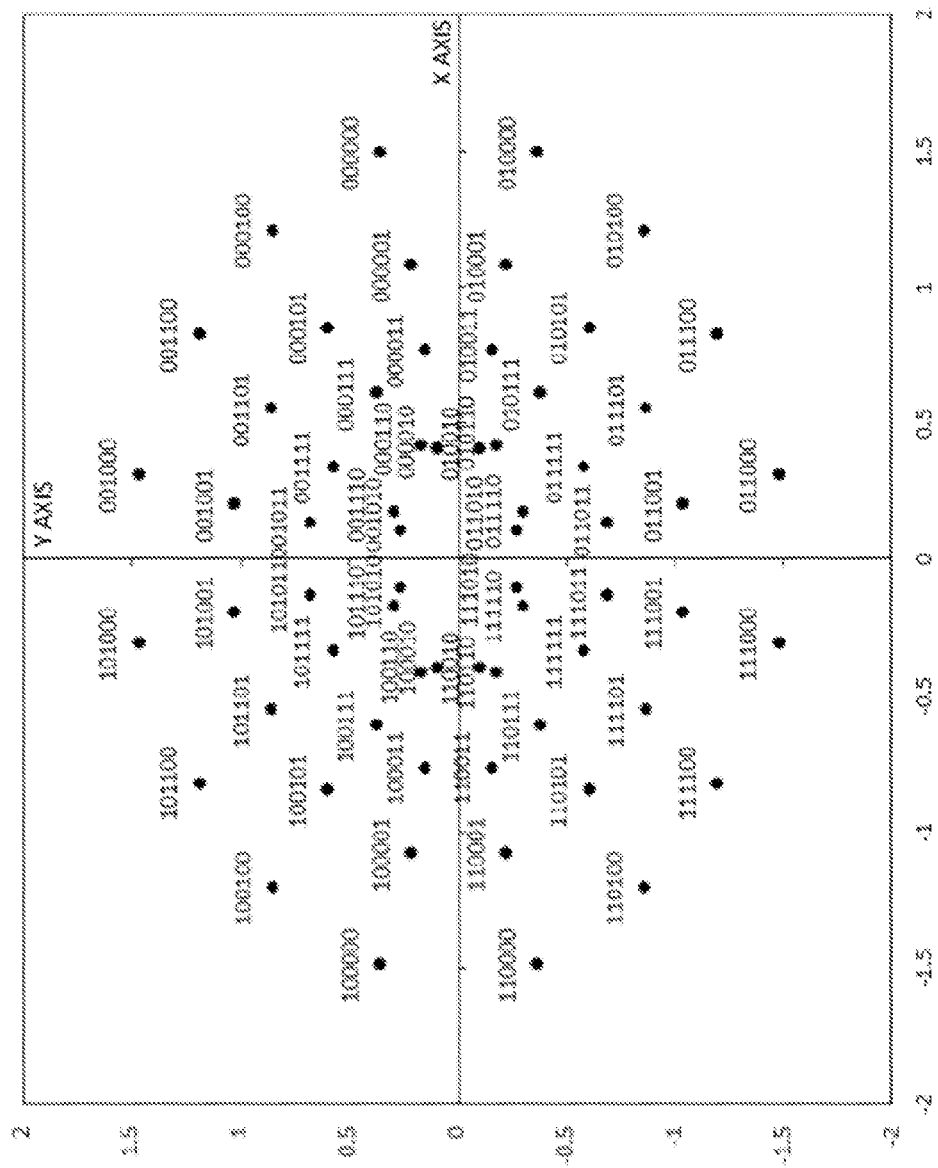
FIG. 10B illustrates a 64-point signal constellation in accordance with another embodiment of the present invention.
Figure 10C:
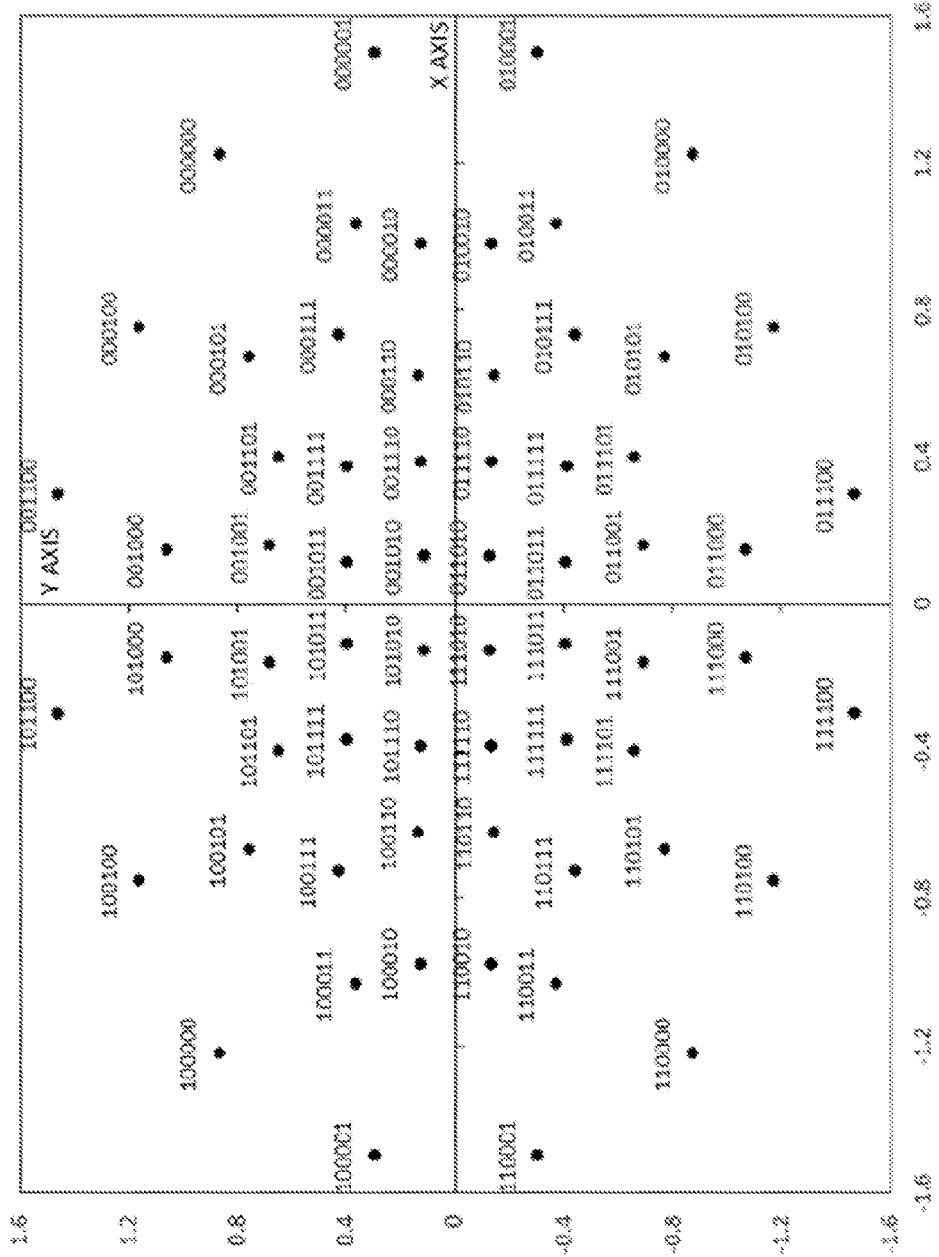
FIG. 10C illustrates a 64-point signal constellation in accordance with another embodiment of the present invention.
Figure 10D:
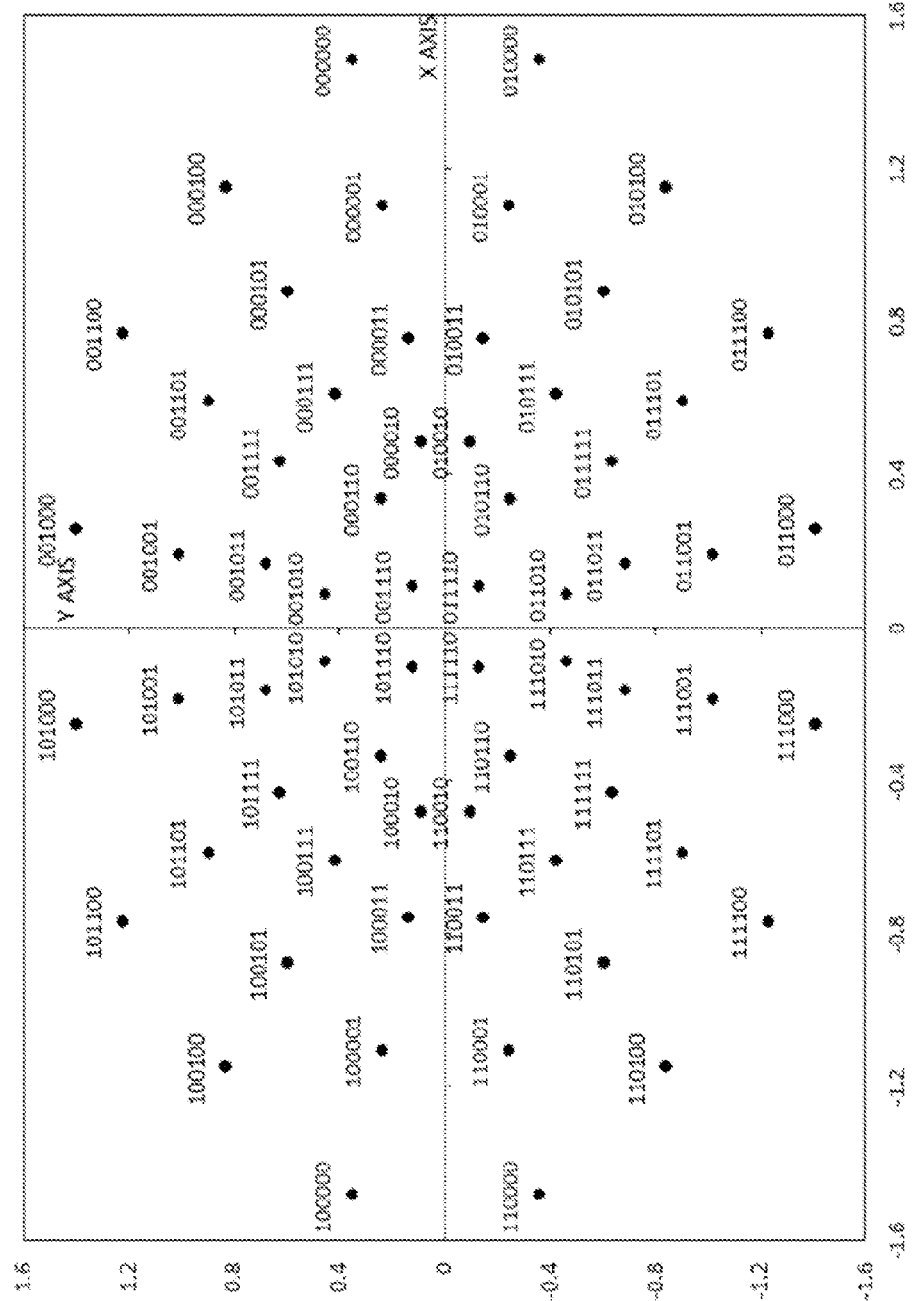
FIG. 10D illustrates a 64-point signal constellation in accordance with another embodiment of the present invention.

FIGS. 10A to 10D illustrate four different 64-point signal constellations provided in accordance with embodiments of the present invention. The corresponding (x,y) coordinate values of the constellation symbols illustrated in FIGS. 10A to 10D are provided to six decimal places in Tables 19A to 19D, respectively. The signal constellation of FIG. 10A is optimized for use with a code rate of 5/8 and is also suitable for use with other code rates. The signal constellation of FIG. 10B is optimized for use with a code rate of 3/4 and is also suitable for use with other code rates. The signal constellation of FIG. 10C is optimized for use with a code rate of 13/16 and is also suitable for use with other code rates. The signal constellation of FIG. 10D is optimized for use with a code rate of 7/8 and is also suitable for use with other code rates.

Figure 11A:
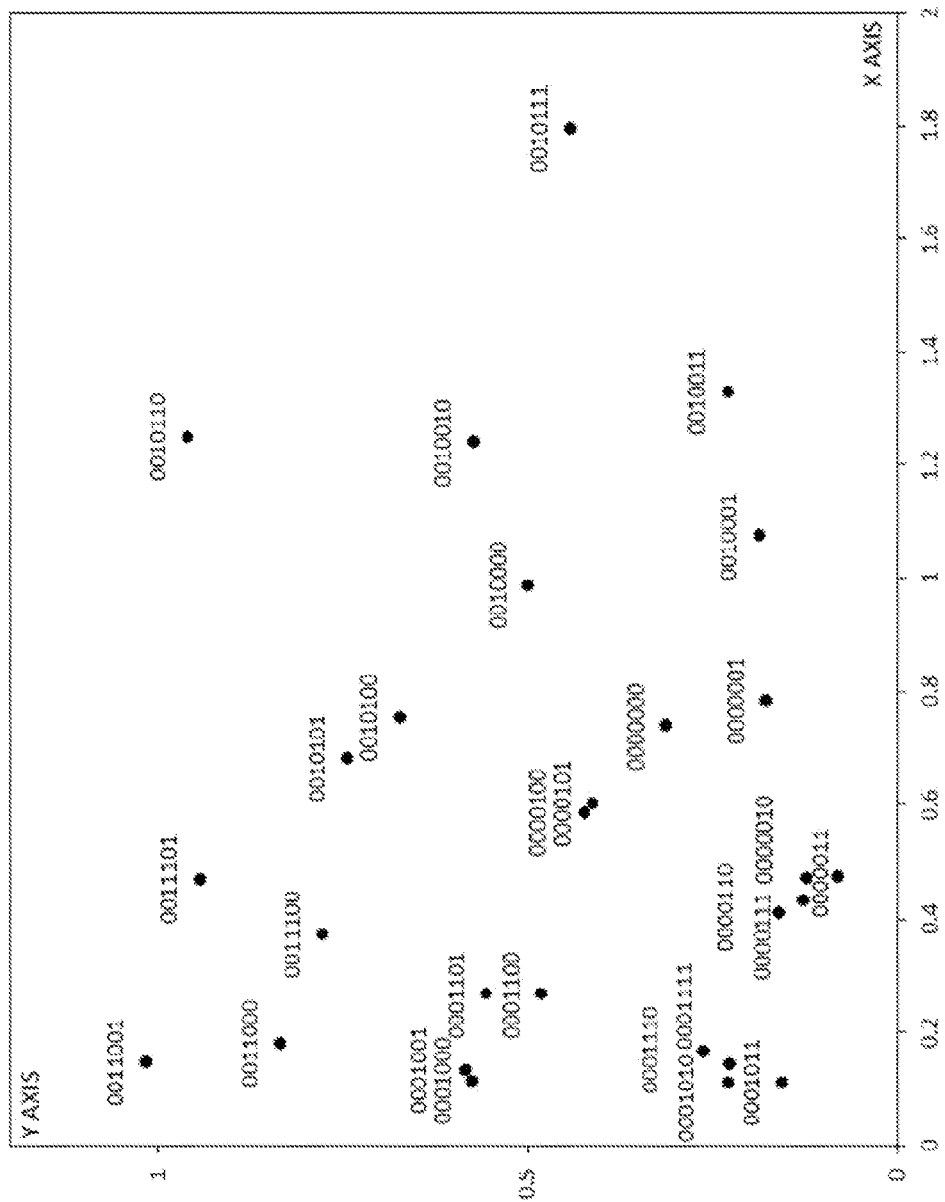
FIG. 11A illustrates the first quadrant of a 128-point signal constellation in accordance with an embodiment of the present invention.
Figure 11B:
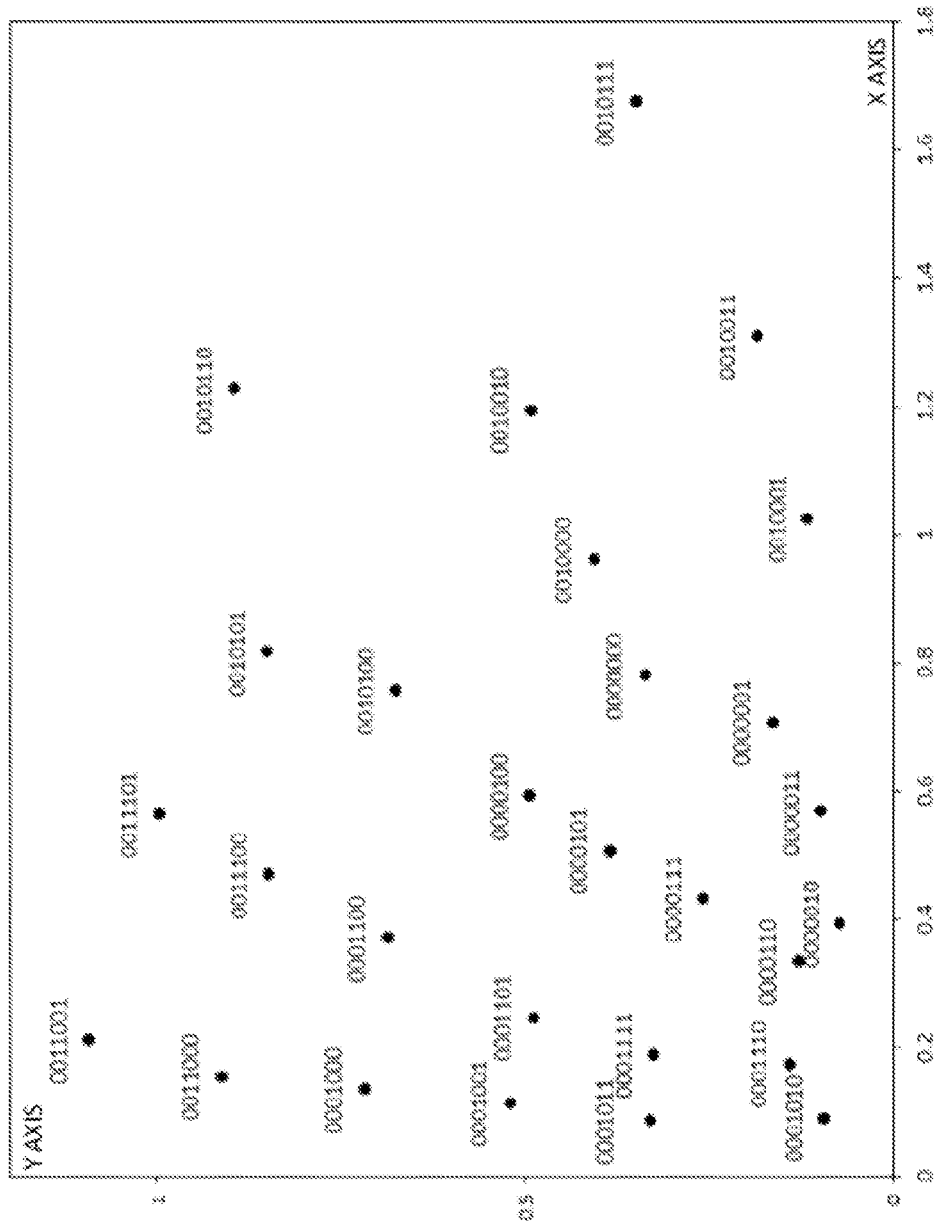
FIG. 11B illustrates the first quadrant of a 128-point signal constellation in accordance with another embodiment of the present invention.
Figure 11C:
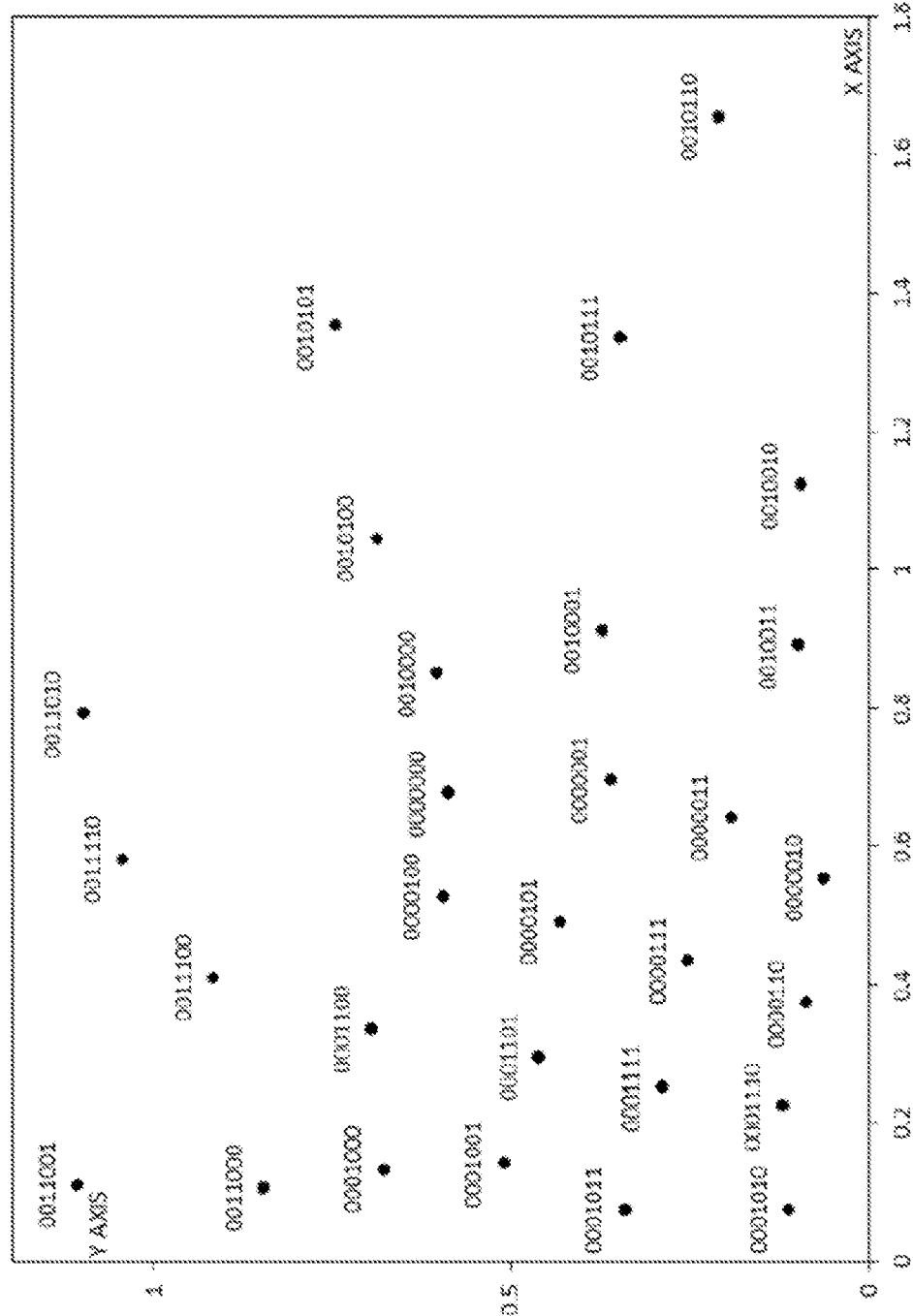
FIG. 11C illustrates the first quadrant of a 128-point signal constellation in accordance with another embodiment of the present invention.
Figure 11D:
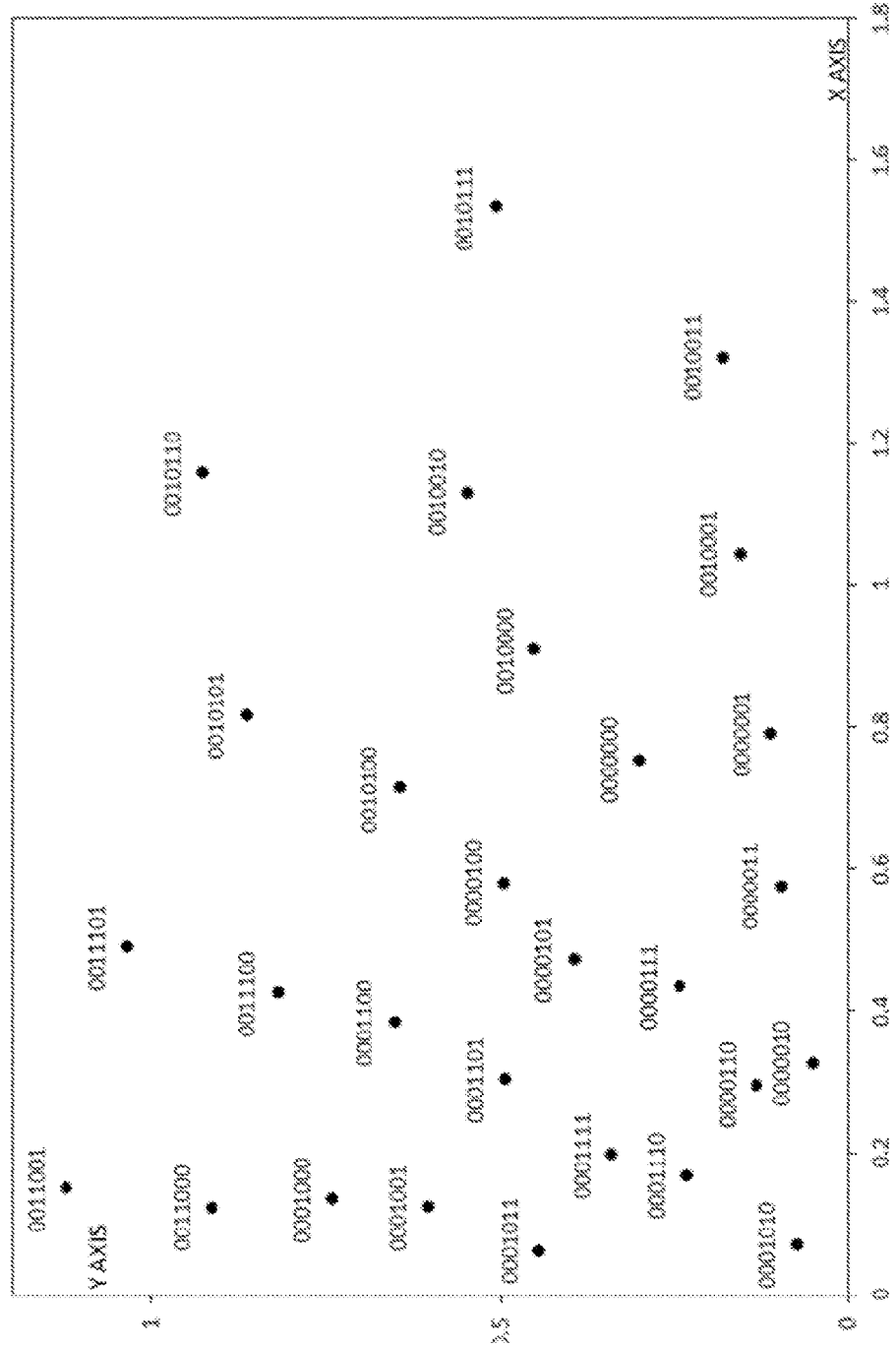
FIG. 11D illustrates the first quadrant of a 128-point signal constellation in accordance with another embodiment of the present invention.

FIGS. 11A to 11D illustrate the first quadrants of four different 128-point signal constellations provided in accordance with embodiments of the present invention. The corresponding (x,y) coordinate values of the constellation symbols illustrated in FIGS. 11A to 11D are provided to six decimal places in Tables 20A to 20D, respectively. The signal constellation of FIG. 11A is optimized for use with a code rate of 5/8 and is also suitable for use with other code rates. The signal constellation of FIG. 11B is optimized for use with a code rate of 3/4 and is also suitable for use with other code rates. The signal constellation of FIG. 11C is optimized for use with a code rate of 13/16 and is also suitable for use with other code rates. The signal constellation of FIG. 11D is optimized for use with a code rate of 7/8 and is also suitable for use with other code rates.

Figure 12B:
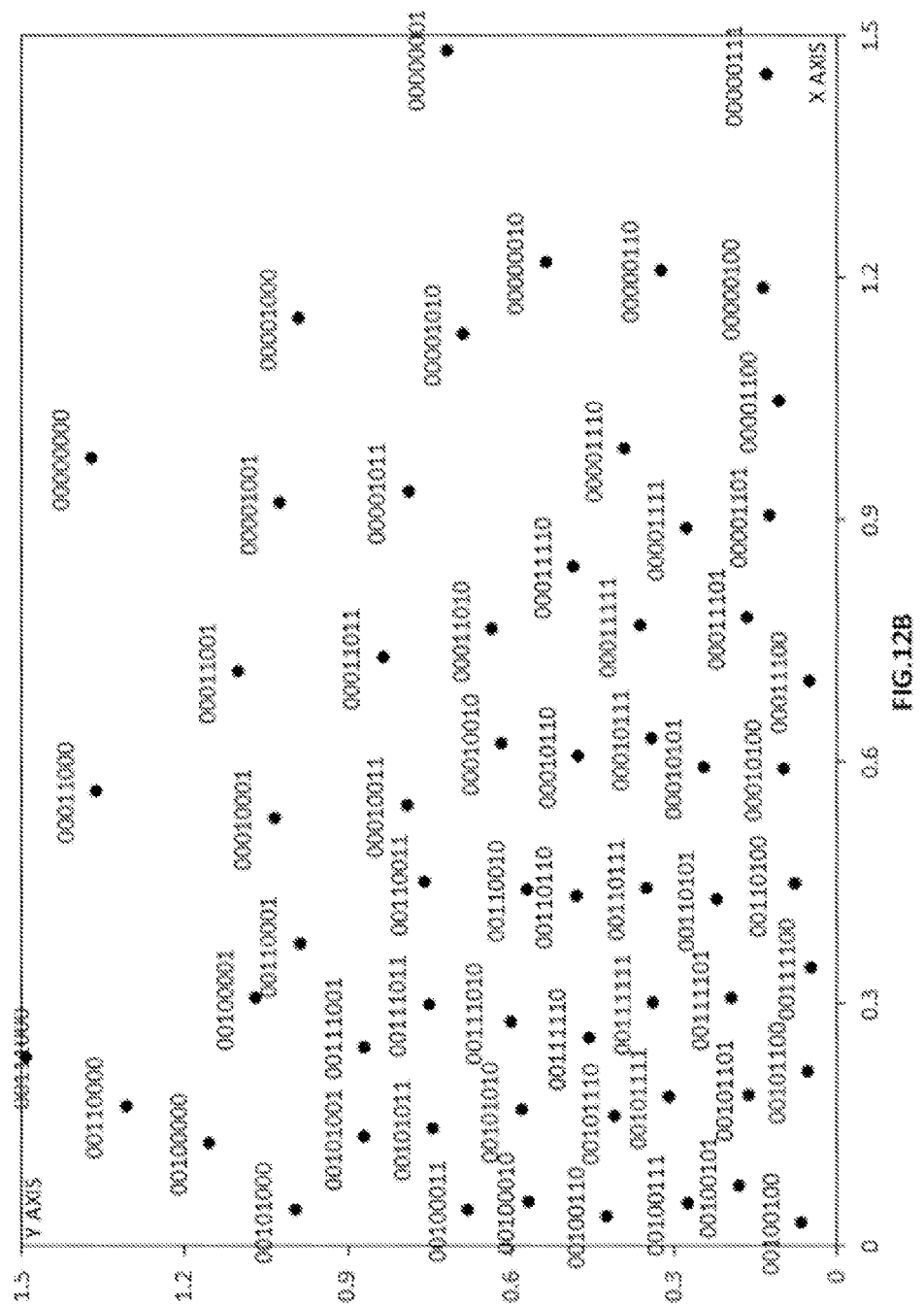
FIG. 12B illustrates the first quadrant of a 256-point signal constellation in accordance with another embodiment of the present invention.
Figure 12C:
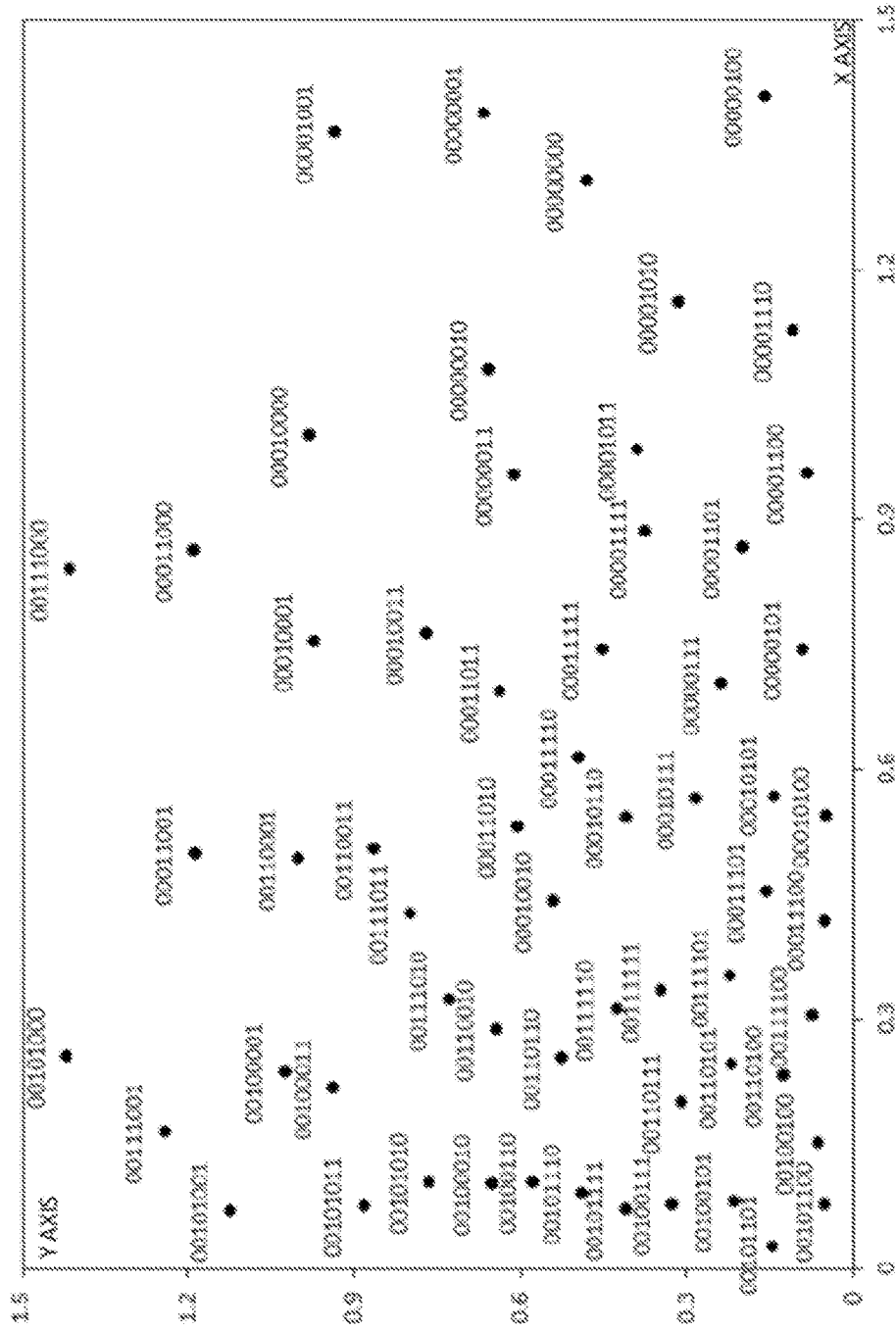
FIG. 12C illustrates the first quadrant of a 256-point signal constellation in accordance with another embodiment of the present invention.

FIGS. 12A to 12C illustrate the first quadrants of three different 256-point signal constellations provided in accordance with embodiments of the present invention. The corresponding (x,y) coordinate values of the constellation symbols illustrated in FIGS. 12A to 12C are provided to six decimal places in Tables 21A to 21C, respectively. The signal constellation of FIG. 12A is optimized for use with a code rate of 3/4 and is also suitable for use with other code rates. The signal constellation of FIG. 12B is optimized for use with a code rate of 13/16 and is also suitable for use with other code rates. The signal constellation of FIG. 12C is optimized for use with a code rate of 7/8 and is also suitable for use with other code rates.

The constellations described above with respect to FIGS. 8-12C and Tables 17-21C were initially derived by an optimization operation which produced signal constellations optimized for single carrier scenarios exhibiting phase noise impairment, but without power amplifier nonlinearity. However, the constellations are not necessarily limited to use in such scenarios.

Figure 13:
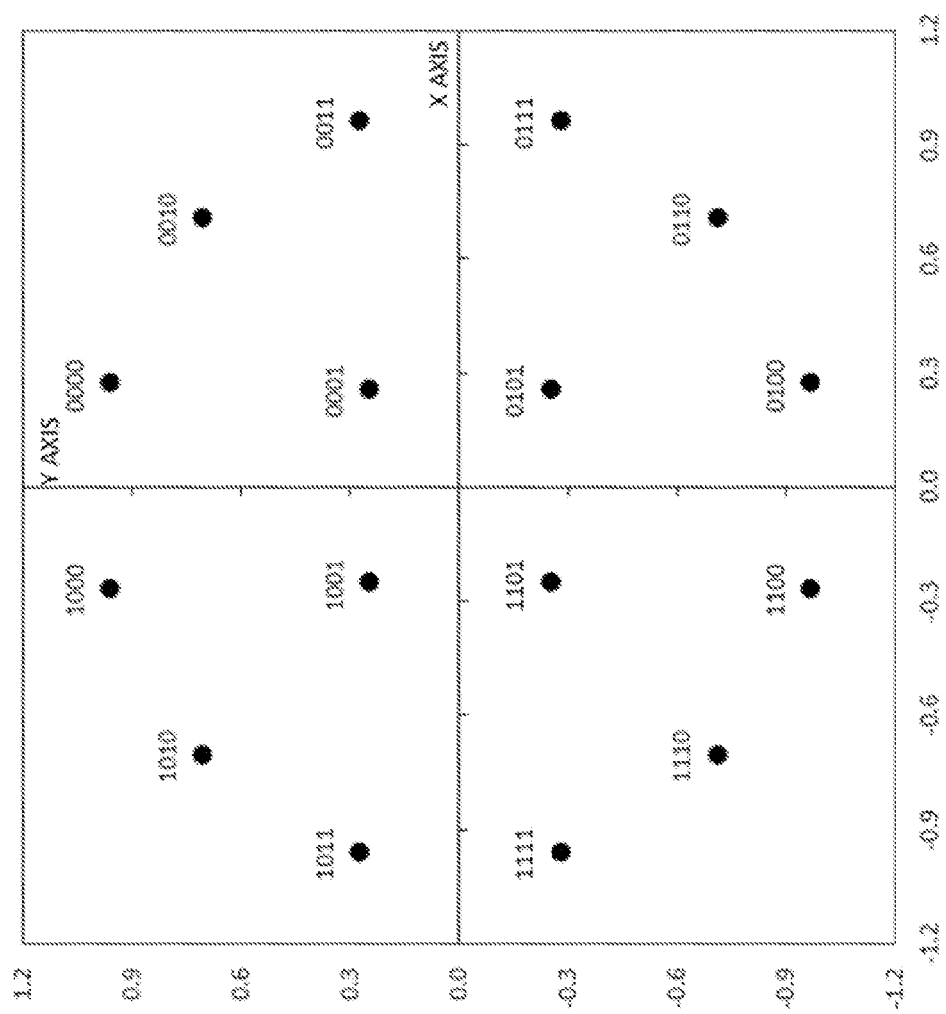
FIG. 13 illustrates a 16-point signal constellation in accordance with another embodiment of the present invention.

FIG. 13 illustrates a 16-point signal constellation provided in accordance with an embodiment of the present invention. The corresponding (x,y) coordinate values of the constellation symbols illustrated in FIG. 13 are provided to six decimal places in Table 22. The signal constellation of FIG. 13 is optimized for use with a code rate of 3/4 and is also suitable for use with other code rates.

Figure 14:
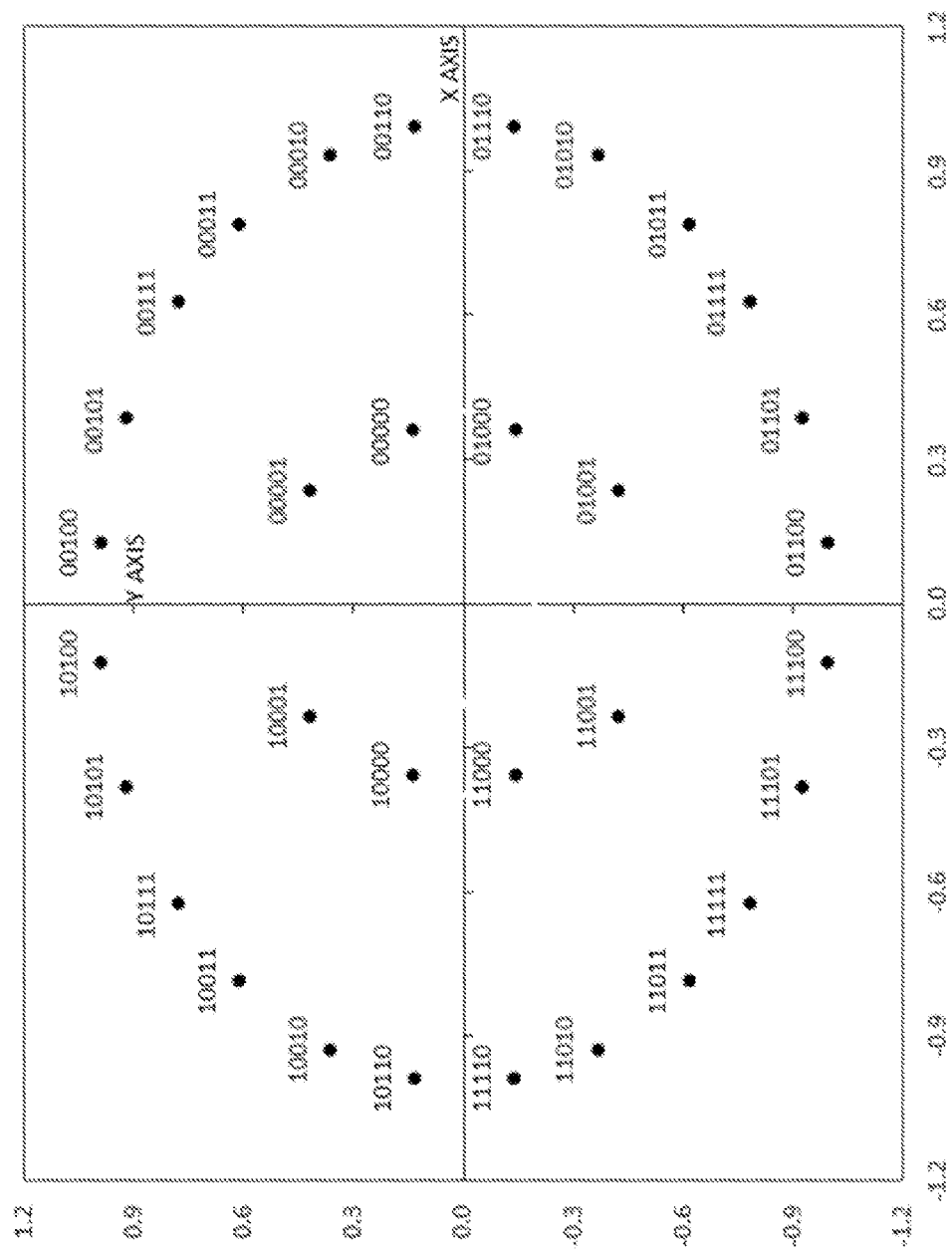
FIG. 14 illustrates a 32-point signal constellation in accordance with another embodiment of the present invention.

FIG. 14 illustrates a 32-point signal constellation provided in accordance with an embodiment of the present invention. The corresponding (x,y) coordinate values of the constellation symbols illustrated in FIG. 14 are provided to six decimal places in Table 23. The signal constellation of FIG. 14 is optimized for use with a code rate of 3/4 and is also suitable for use with other code rates.

Figure 15A:
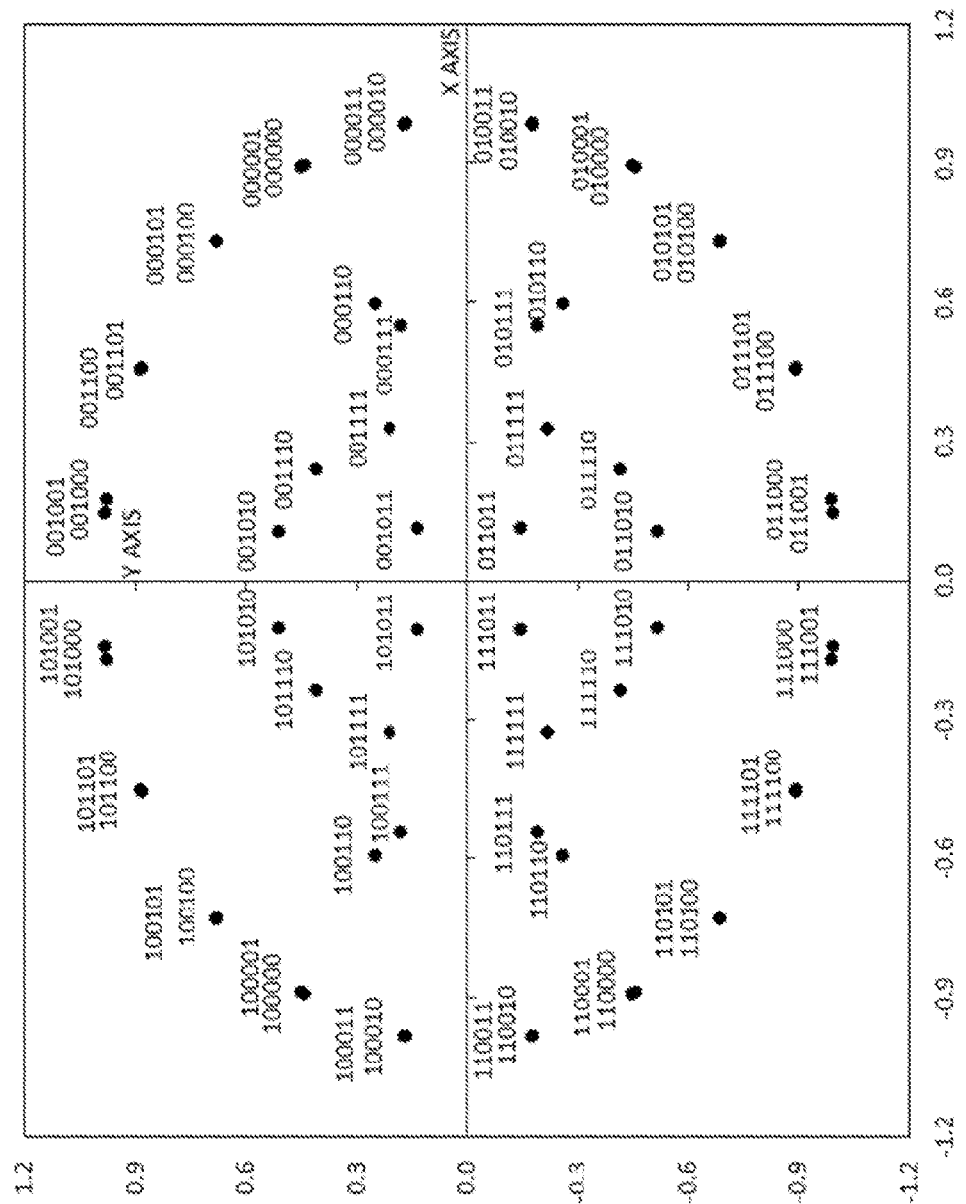
FIG. 15A illustrates a 64-point signal constellation in accordance with another embodiment of the present invention.
Figure 15B:
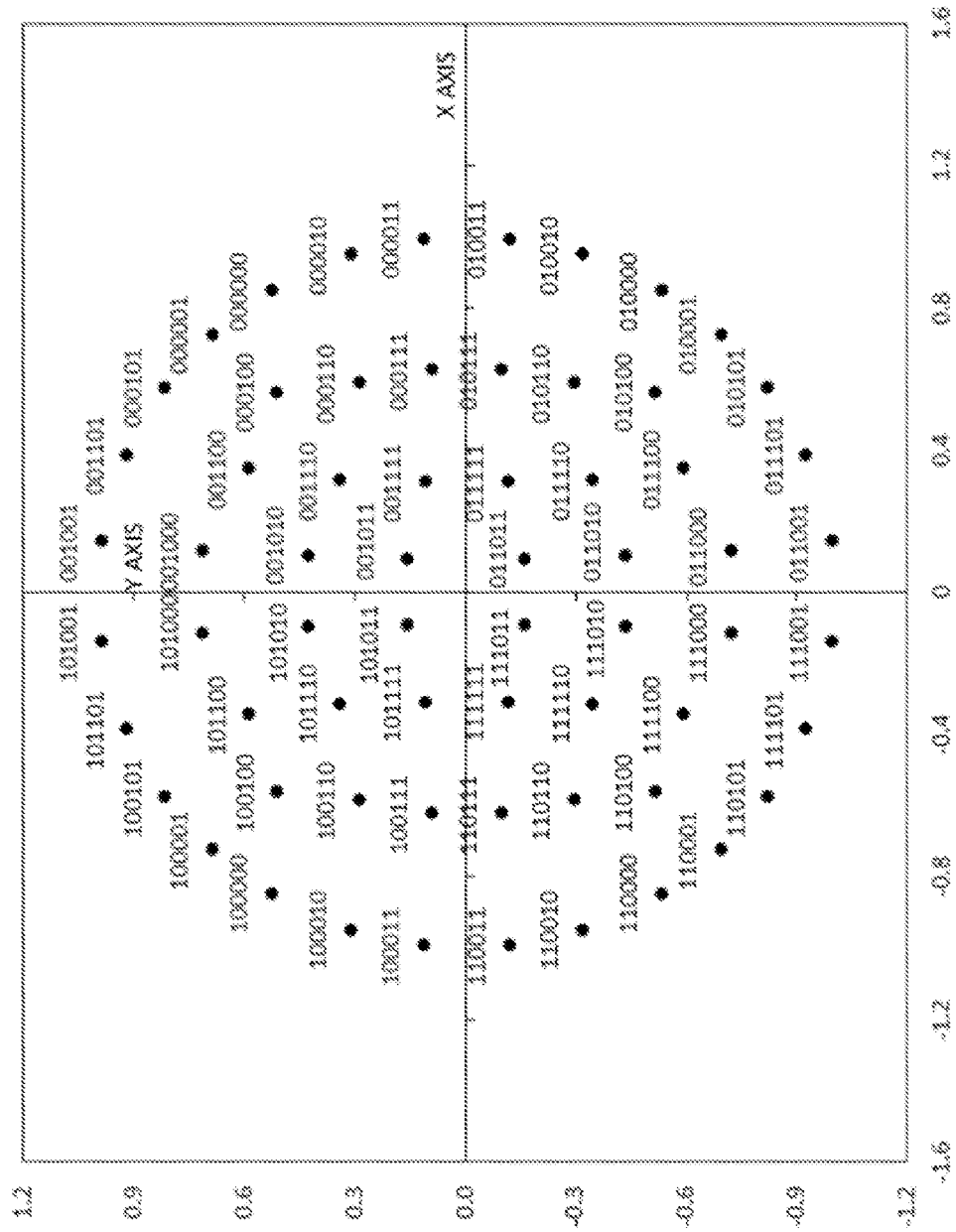
FIG. 15B illustrates a 64-point signal constellation in accordance with another embodiment of the present invention.
Figure 15C:
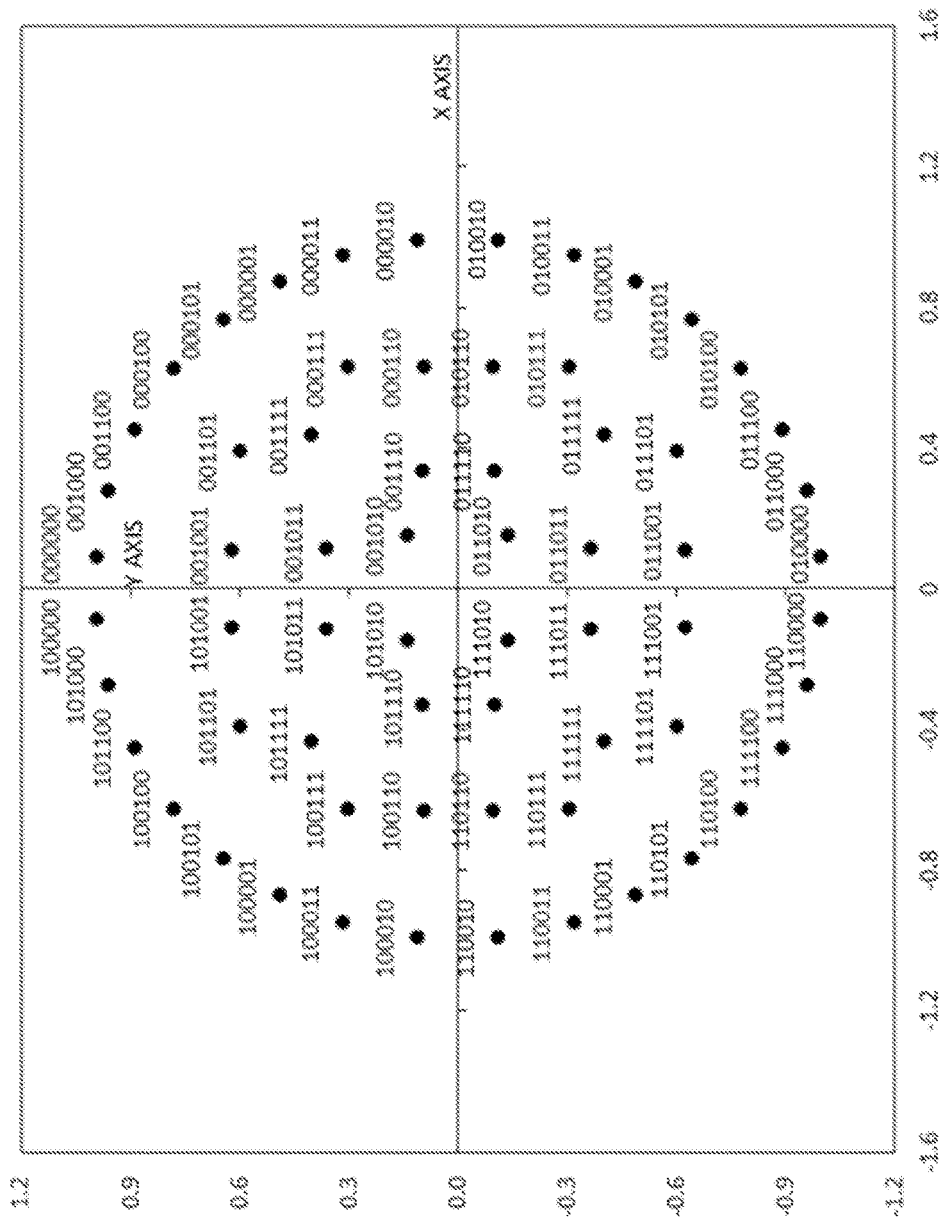
FIG. 15C illustrates a 64-point signal constellation in accordance with another embodiment of the present invention.
Figure 15D:
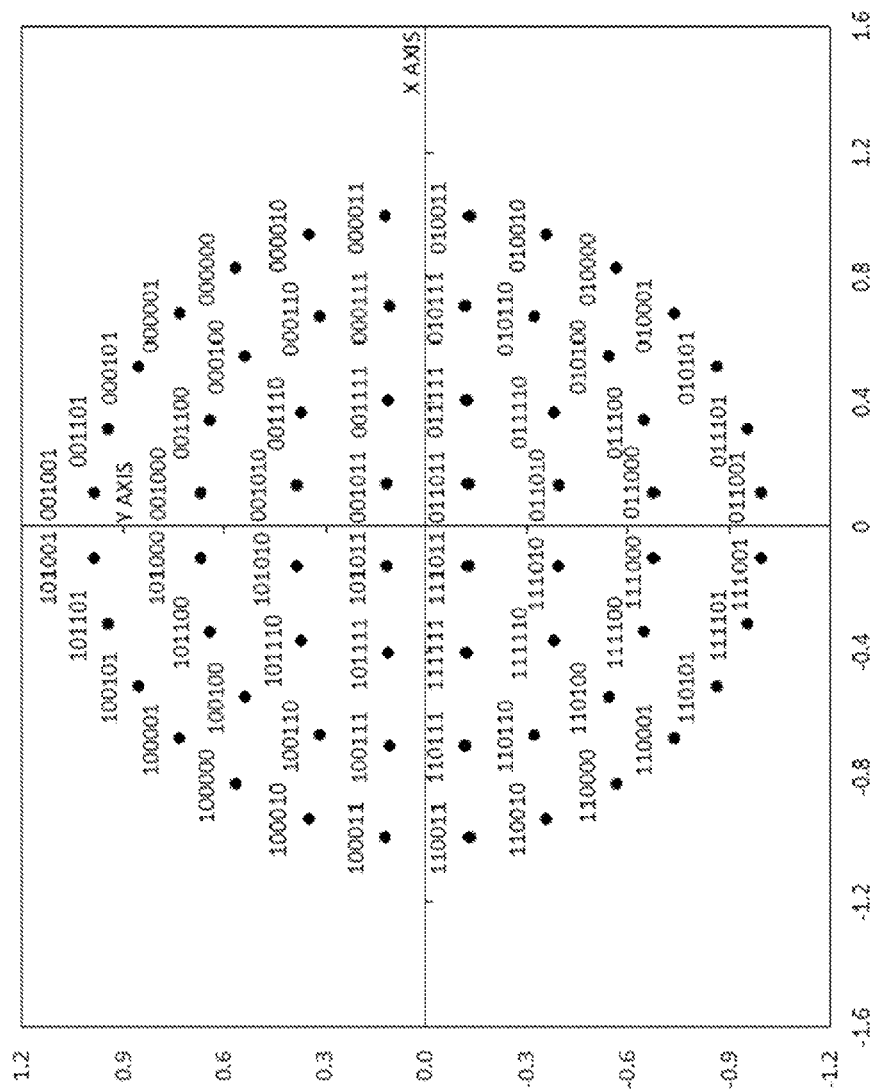
FIG. 15D illustrates a 64-point signal constellation in accordance with another embodiment of the present invention.

FIGS. 15A to 15D illustrate four different 64-point signal constellations provided in accordance with embodiments of the present invention. The corresponding (x,y) coordinate values of the constellation symbols illustrated in FIGS. 15A to 15D are provided to six decimal places in Tables 24A to 24D, respectively. The signal constellation of FIG. 15A is optimized for use with a code rate of 5/8 and is also suitable for use with other code rates. The signal constellation of FIG. 15B is optimized for use with a code rate of 3/4 and is also suitable for use with other code rates. The signal constellation of FIG. 15C is optimized for use with a code rate of 13/16 and is also suitable for use with other code rates. The signal constellation of FIG. 15D is optimized for use with a code rate of 7/8 and is also suitable for use with other code rates.

Figure 16A:
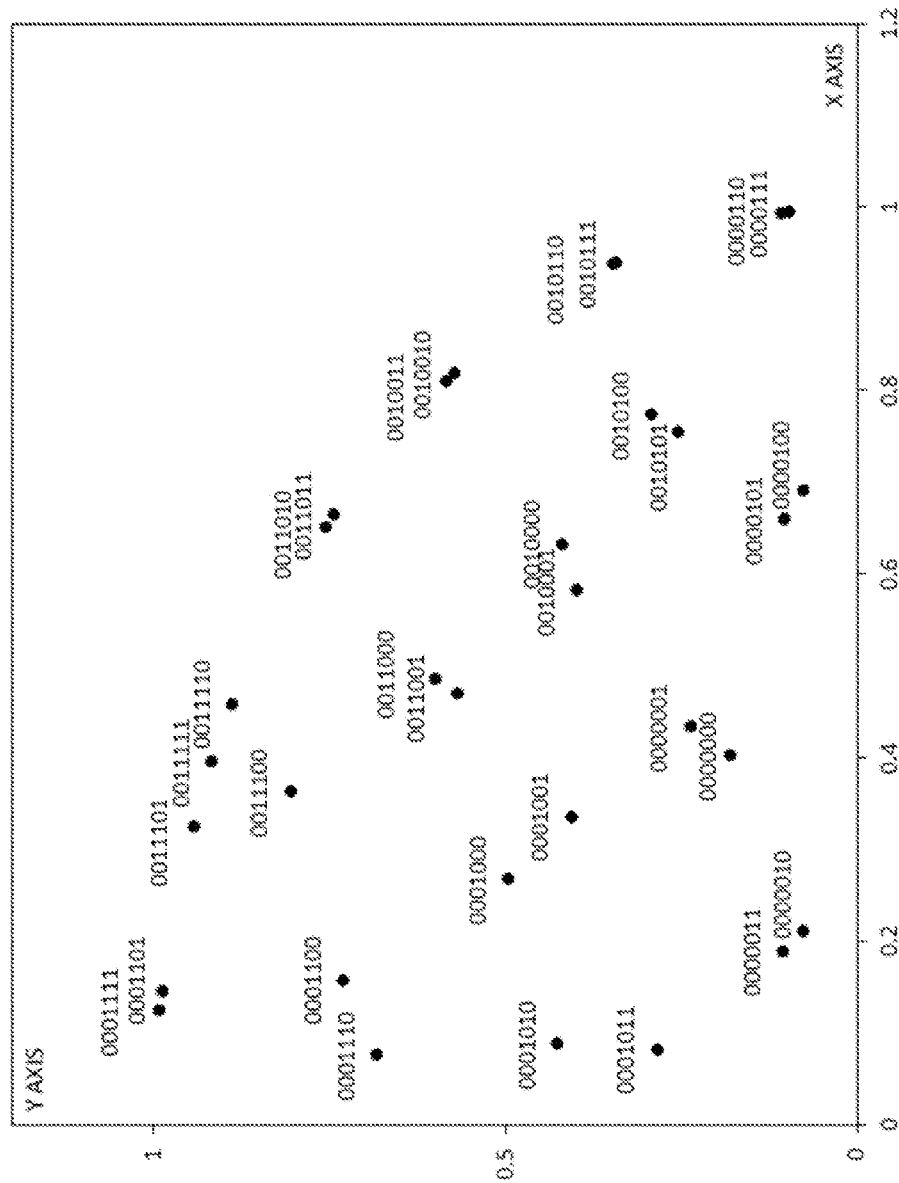
FIG. 16A illustrates the first quadrant of a 128-point signal constellation in accordance with another embodiment of the present invention.
Figure 16B:
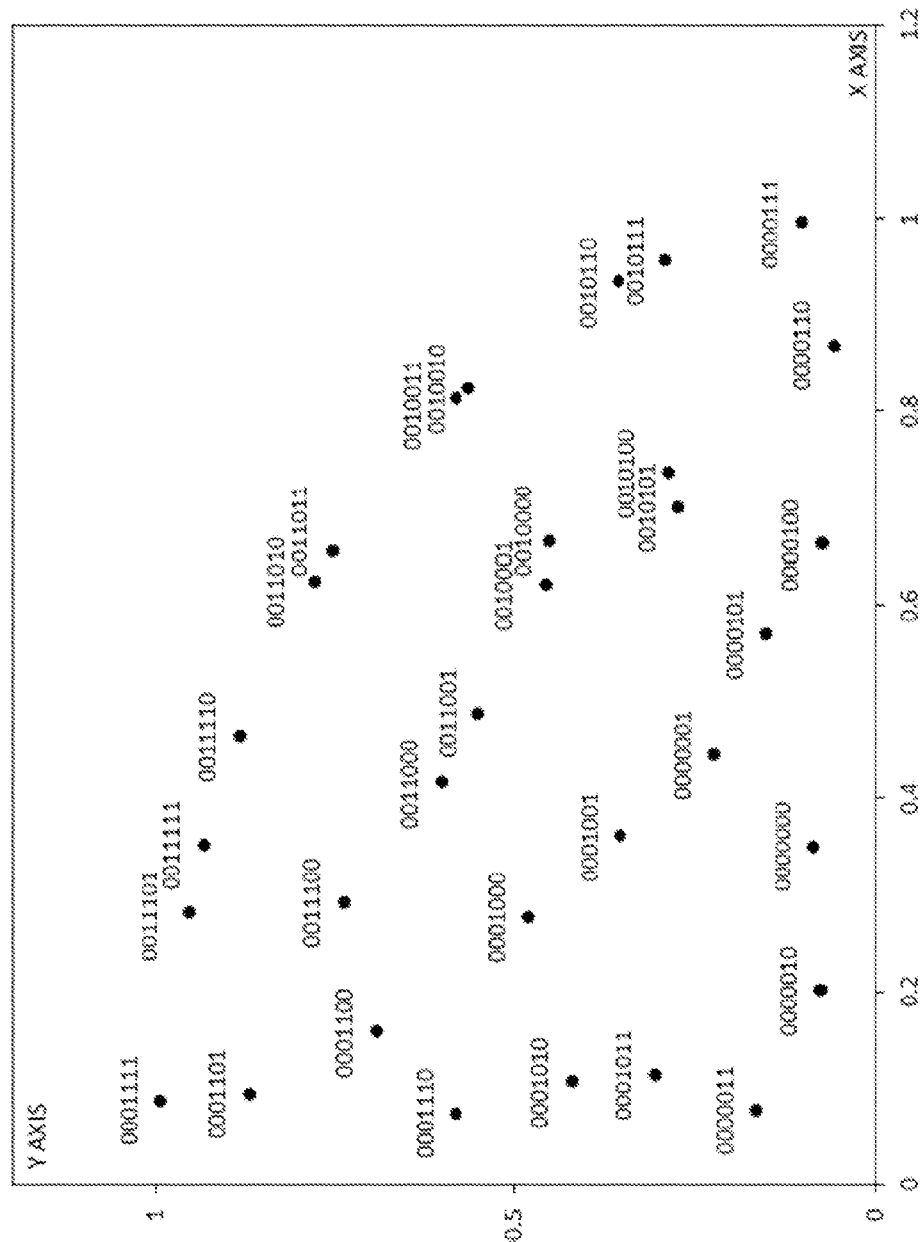
FIG. 16B illustrates the first quadrant of a 128-point signal constellation in accordance with another embodiment of the present invention.
Figure 16C:
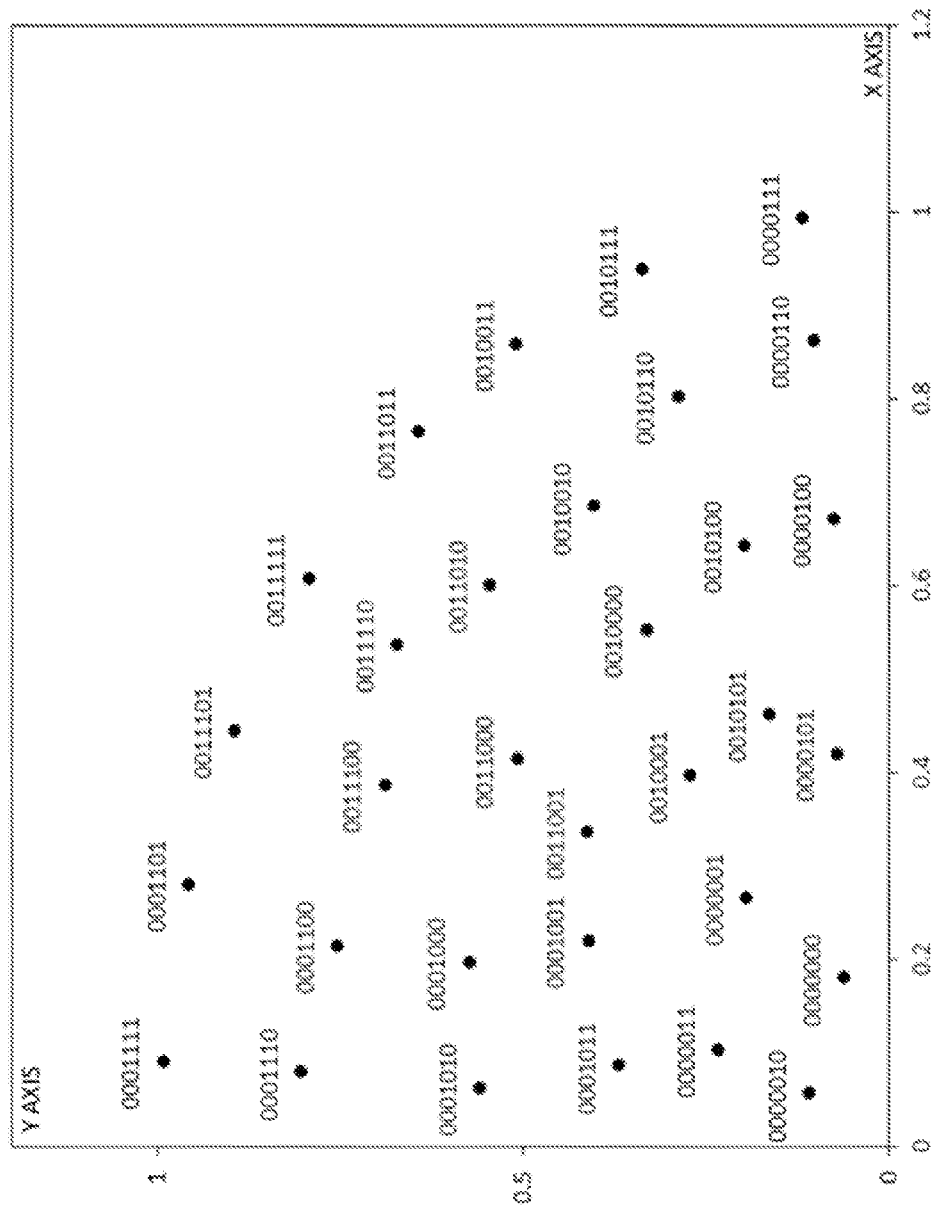
FIG. 16C illustrates the first quadrant of a 128-point signal constellation in accordance with another embodiment of the present invention.
Figure 16D:
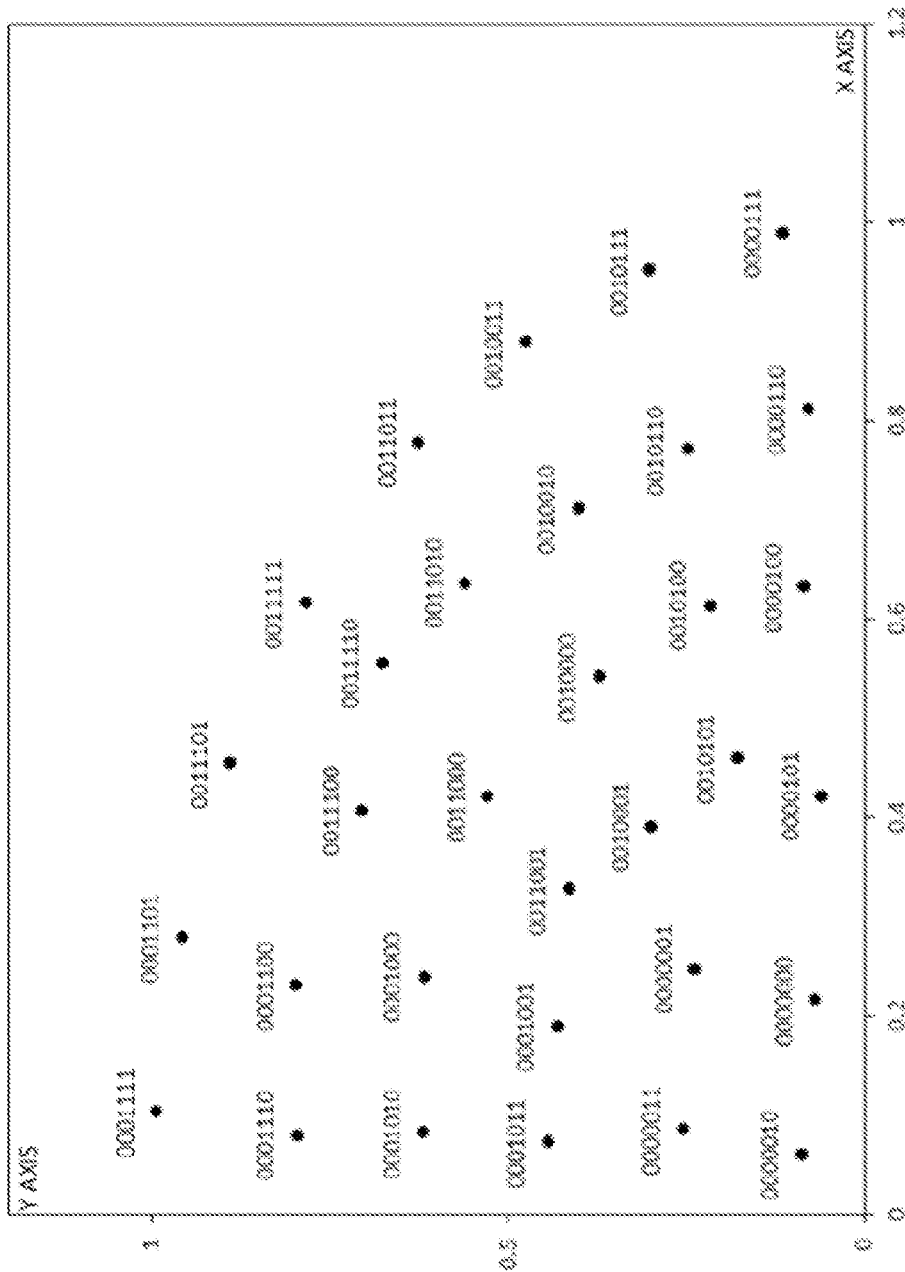
FIG. 16D illustrates the first quadrant of a 128-point signal constellation in accordance with another embodiment of the present invention.

FIGS. 16A to 16D illustrate the first quadrants of four different 128-point signal constellations provided in accordance with an embodiment of the present invention. The corresponding (x,y) coordinate values of the constellation symbols illustrated in FIGS. 16A to 16D are provided to six decimal places in Tables 25A to 25D, respectively. The signal constellation of FIG. 16A is optimized for use with a code rate of 5/8 and is also suitable for use with other code rates. The signal constellation of FIG. 16B is optimized for use with a code rate of 3/4 and is also suitable for use with other code rates. The signal constellation of FIG. 16C is optimized for use with a code rate of 13/16 and is also suitable for use with other code rates. The signal constellation of FIG. 16D is optimized for use with a code rate of 7/8 and is also suitable for use with other code rates.

Figure 17A:
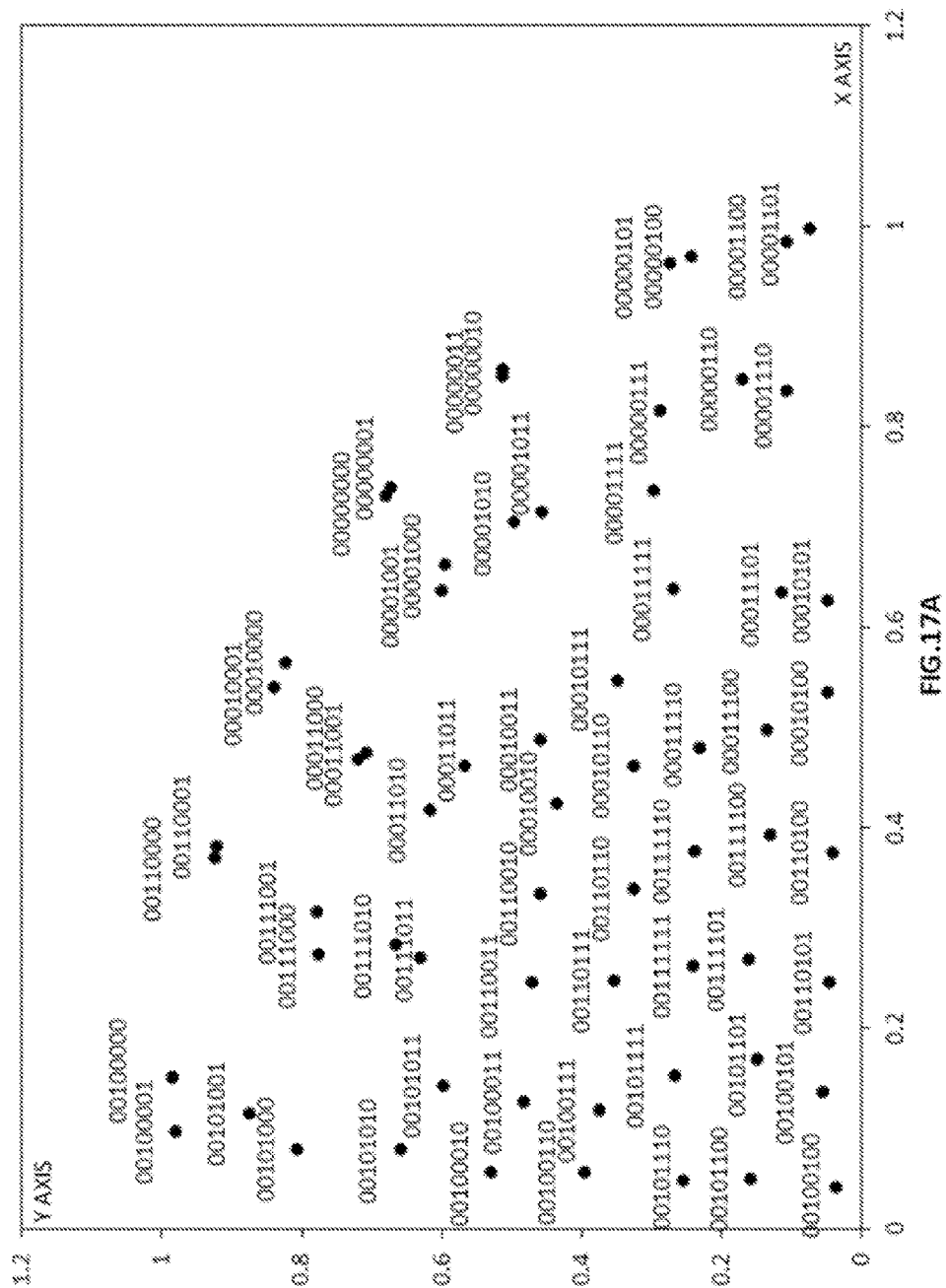
FIG. 17A illustrates the first quadrant of a 256-point signal constellation in accordance with another embodiment of the present invention.
Figure 17B:
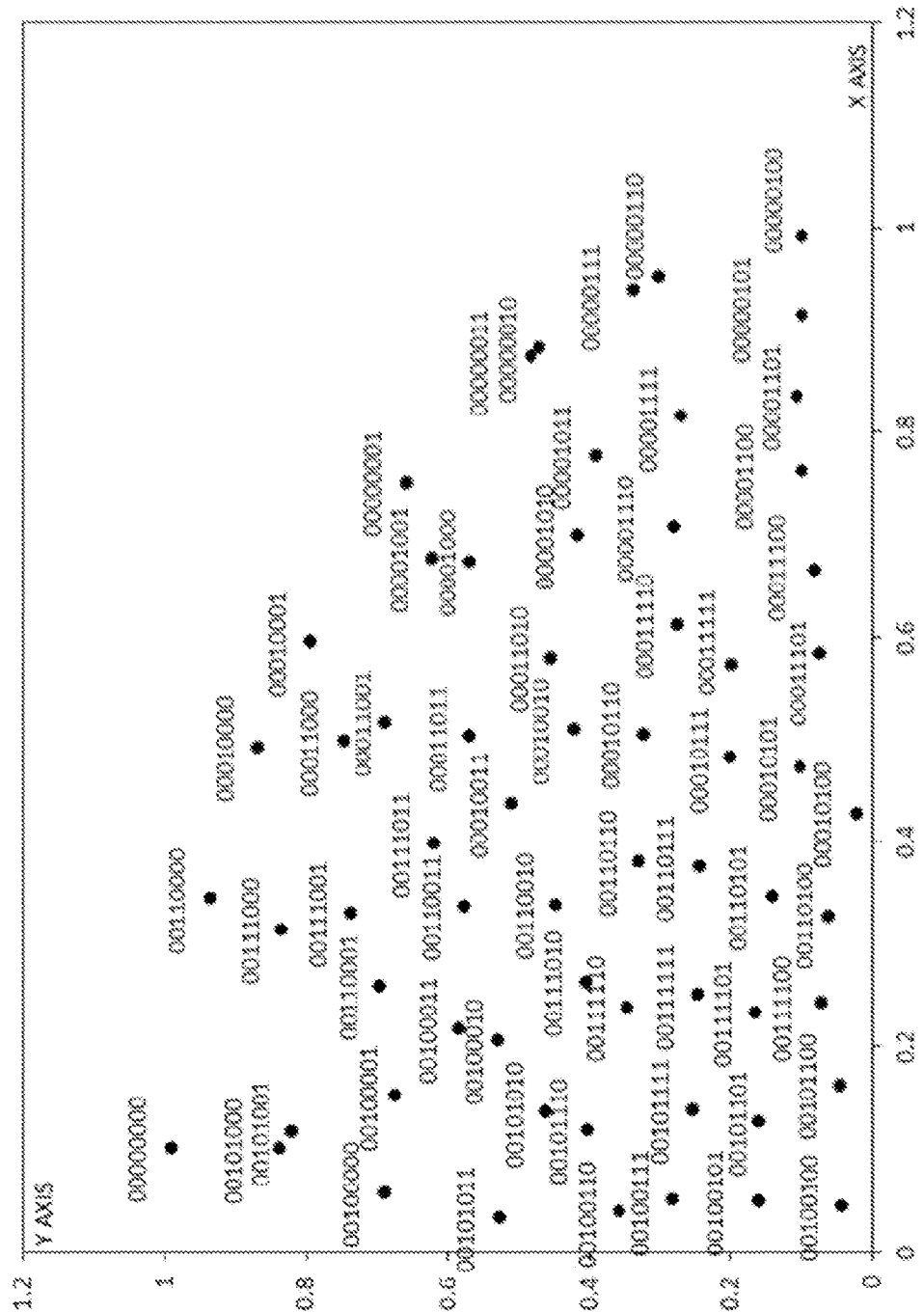
FIG. 17B illustrates the first quadrant of a 256-point signal constellation in accordance with another embodiment of the present invention.
Figure 17C:
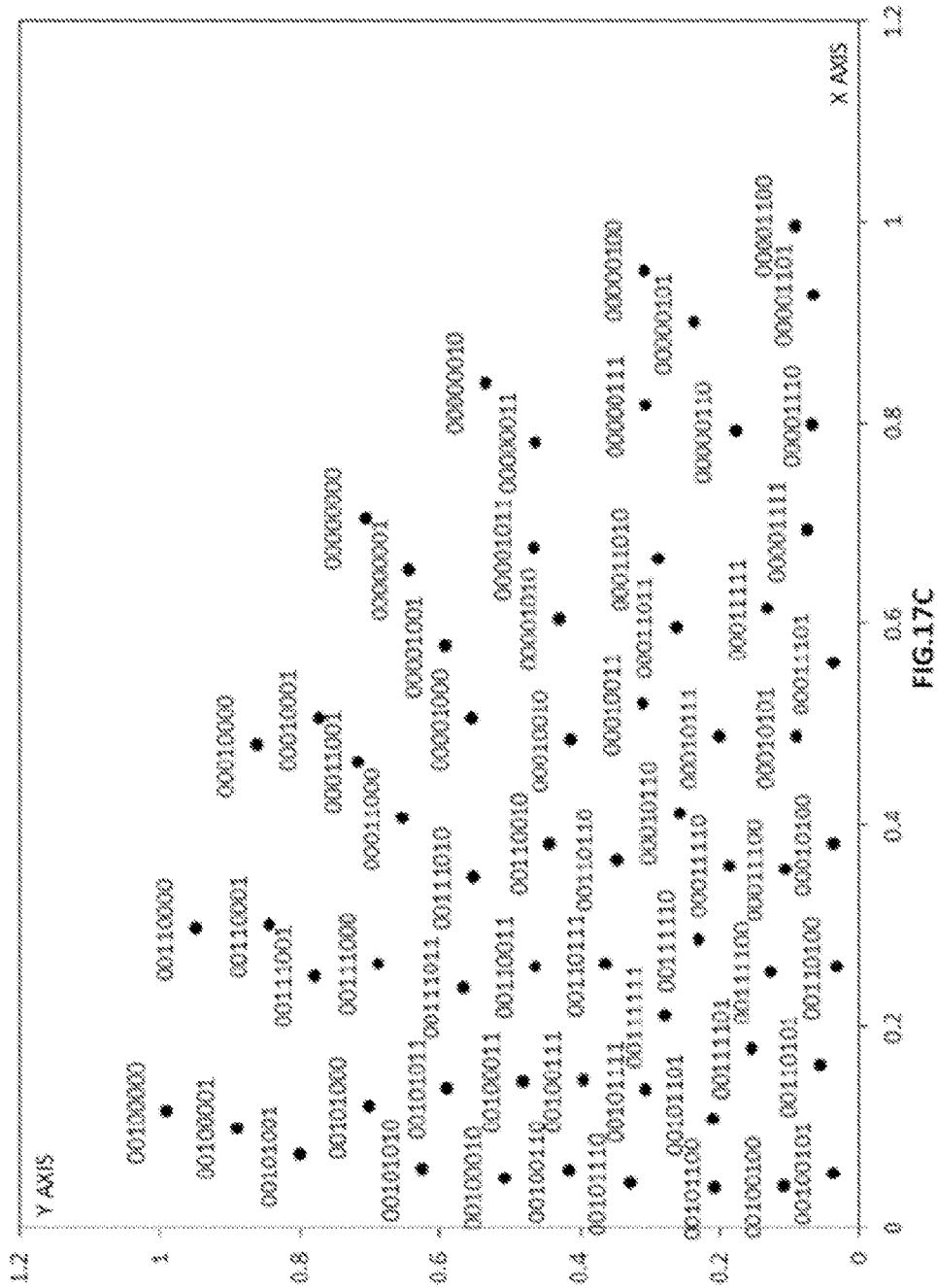
FIG. 17C illustrates the first quadrant of a 256-point signal constellation in accordance with another embodiment of the present invention.

FIGS. 17A to 17C illustrate the first quadrants of three different 256-point signal constellation provided in accordance with embodiments of the present invention. The corresponding (x,y) coordinate values of the constellation symbols illustrated in FIGS. 17A to 17C are provided to six decimal places in Tables 26A to 26C, respectively. The signal constellation of FIG. 17A is optimized for use with a code rate of 3/4 and is also suitable for use with other code rates. The signal constellation of FIG. 17B is optimized for use with a code rate of 13/16 and is also suitable for use with other code rates. The signal constellation of FIG. 17C is optimized for use with a code rate of 7/8 and is also suitable for use with other code rates.

The constellations described above with respect to FIGS. 13-17C and Tables 22-26C were initially derived by an optimization operation which produced signal constellations which were believed to be optimal for single carrier scenarios exhibiting both phase noise and power amplifier nonlinearity impairments. However, the constellations are not necessarily limited to use in such scenarios.

The (x,y) coordinate values provided in Tables 17-26C are specified to a level of precision of six decimal places. In some embodiments, the coordinate values of the constellation symbols illustrated in FIGS. 8-17C and shown in Tables 17-26C can be truncated to a level of precision of three, four, or five decimal places.

Embodiments of the present invention provide for a method and apparatus for performing wireless communication using digital Quadrature Amplitude Modulation. The method and apparatus involve utilizing, by a mapping module electronic component of a wireless communication device, a signal constellation for modulating a signal for transmission or demodulating a received signal, the signal constellation comprising a plurality of constellation symbols. The signal constellation may be obtained using an optimization procedure for example as described below. It is noted that the optimization procedure below is not intended to limit the disclosed signal constellations. Rather, the optimization procedure is provided as an example of how these and similar constellations may be obtained, and the circumstances under which they may be expected to perform well.

In a practical system, phase noise may be said to have a memory. That is, the state of the phase noise at a given time may depend on the state of the phase noise at previous times. As such, according to embodiments of the present invention, the residual phase error caused by the imperfect cancellation for phase noise with memory is obtained based on the specified pilot distribution and the methods for phase estimation and phase noise mitigation. The residual phase error is assumed to be a white random process. Therefore, with the aid of transformation of phase noise with memory to the memoryless residual phase error, methods for constellation optimization with white phase noise constraint and white Gaussian noise can be applied to constellation optimization in the presence of a constraint representing phase noise with memory.

One embodiment of the present invention provides for signal constellations derived from conducting a joint signal-labeling optimization for the optimized modulation symbol constellations either with phase noise constraint only or with both phase noise and power constraints with a simplified optimization algorithm in order to obtain the constellations of higher order modulation such those having 128 or 256 points.

Another embodiment of the present invention provides for signal constellations derived from the optimization of pilot sequence distribution in a single carrier system, which depends on a given phase noise model such as described in Equation (1) as well as particular SNR level, overhead ratio, and phase estimate and phase noise mitigation algorithms.

According to an embodiment of the present invention, a simple and efficient algorithm for the estimation of the phase noise based on the presence of a pilot field of length L every W transmitted symbols, with a pilot overhead OH=L/W may be utilized. The output of the channel affected by the phase noise $\theta_k$ and thermal noise $n_k$ may be written as:

$$r_k = e^{j\theta_k} p_k + n_k$$

If the known pilot symbols are placed in contiguous positions $$k \in [nW-L/2, nW+L/2],$$

with arbitrary integer n, a phase estimate corresponding to the middle of the pilot field can be calculated as follows:

$$\hat{\theta}_{nW} = \tan^{-1}\left(\frac{\sum_{k=nW-L/2}^{nW+L/2-1} \Im(r_k p_k^*)}{\sum_{k=nW-L/2}^{nW+L/2-1} \Re(r_k p_k^*)}\right). \quad (4)$$

To derive a sequence of phases between two consecutive phase estimates calculated using Equation (4), that is the $(nW)^{th}$ and $((n+1)W)^{th}$ phase estimates, the following linear interpolation formula is used:

$$\hat{\theta}_{nW+m} = \left[\frac{W-m}{W}\right]\hat{\theta}_{nW} + \left[\frac{m}{W}\right]\hat{\theta}_{(n+1)W} \quad m=1,\ldots,W-1. \quad (5)$$

For a given overhead OH=L/W, the optimal length of the pilot field L can be obtained by trading off accuracy of the estimation Equation (4) versus accuracy of interpolation Equation (5). As shown in FIG. 7, in an IEEE 802.11ad Single Carrier (SC) block, the pilot field length L=64 and the single SC block length W=512. Therefore, OH=64/512=12.5%.

Figure 18:
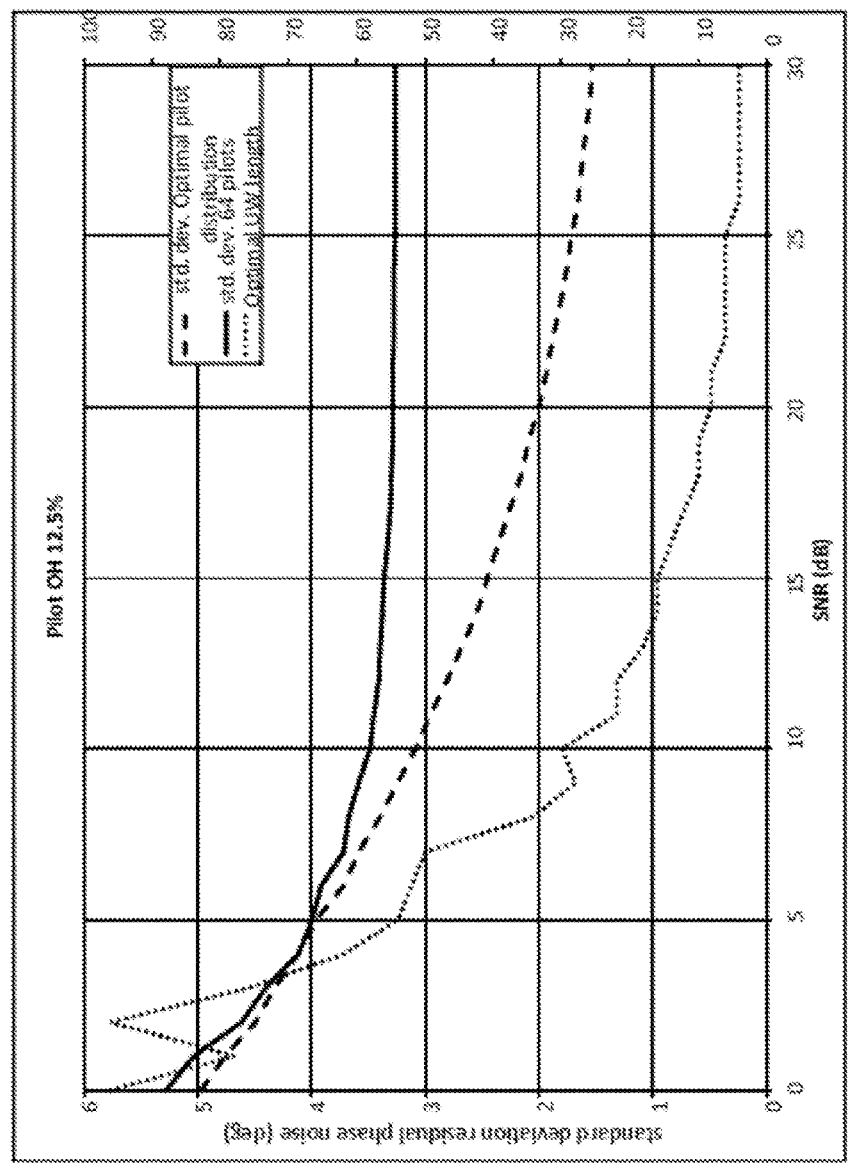
FIG. 18 illustrates the standard derivation of residual phase noise vs. SNR using a linear interpolation phase noise mitigation method in accordance with an embodiment of the present invention.

After mitigation of phase noise, the power spectral density (PSD) of the residual phase error is assumed to be white. Standard deviation of residual phase noise $\sigma_\phi$ is used to evaluate the phase errors after a phase noise mitigation process and is used to optimize the constellations. FIG. 18 shows the standard derivation of residual phase noise vs. SNR using the linear interpolation phase noise mitigation method (5). The standard deviation of the residual phase noise (left vertical axis) versus SNR for a system baud rate $R_s=2$ GHz, and a pilot overhead of 12.5% is shown. The solid line curve corresponds to the 802.11ad SC frame structure (L=64, W=512). The dashed curve corresponds to the optimal pilot distribution. The dotted curve shows the optimal pilot field length (to be read in the right vertical axis).

Performance of a given signal constellation over a channel under ideal detection and decoding can be computed using the Mutual Information (MI):

$$MI = E\left[\log \frac{P(Z|W)}{P(Z)}\right] \quad (6)$$

or using the Pragmatic Mutual Information (PMI):

$$PMI = \sum_{i=1}^{m} E\left[\log \frac{P(Z|B_i)}{P(Z)}\right]. \quad (6)$$

Figure 19:
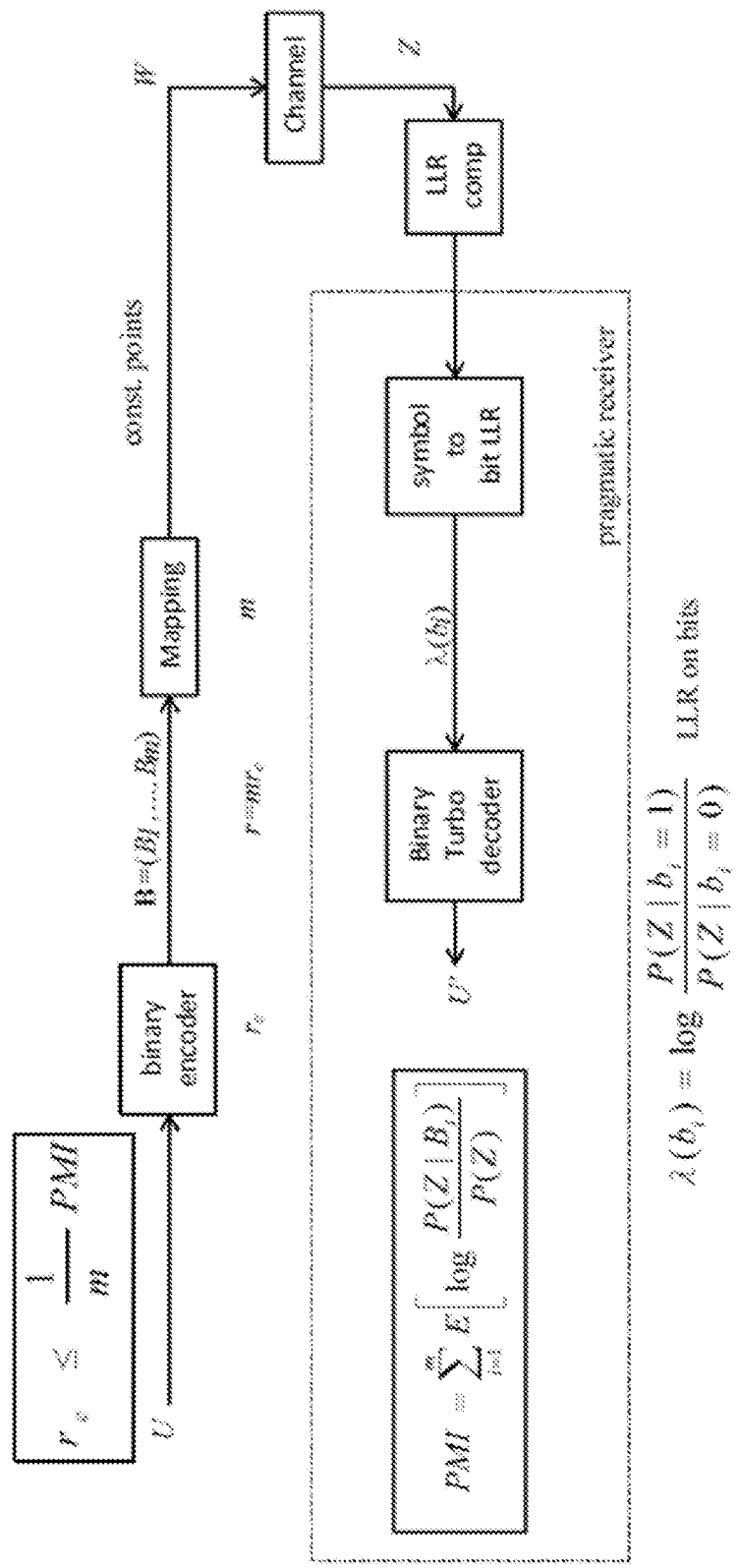
FIG. 19 illustrates transmitter and receiver systems in accordance with an embodiment of the present invention.

FIG. 19 illustrates transmitter and receiver systems bounded by the PMI. In the FIG. 19 as well as the above Equations (6) and (7), W and Z represent the input and output of channel respectively and $B_i$ is the $i^{th}$ bit in W. The MI provides an upper bound on the maximum spectral efficiency, defined as $r=mr_c$, where m is the number of bits associated to each modulation symbol and $r_c$ is the binary code rate. However, in practical systems optimization of signal constellations is performed under the PMI approach. To improve the performance of pragmatic systems, the mapping of bits to constellation can be suitably optimized, for example using Gray mapping. Although the PMI can be in general quite different from the MI, the difference can be reduced significantly when using optimized constellations and bit-to-signal mappings.

The computation of PMI can be performed with numerical techniques when the conditional distribution of the channel P(Z|W) is known. When the channel is memoryless, the output at a given time instant only depends on the corresponding input at the same time and the computation of PMI becomes easier. Practical memoryless channel models include AWGN and White phase noise channels.

Figure 20:
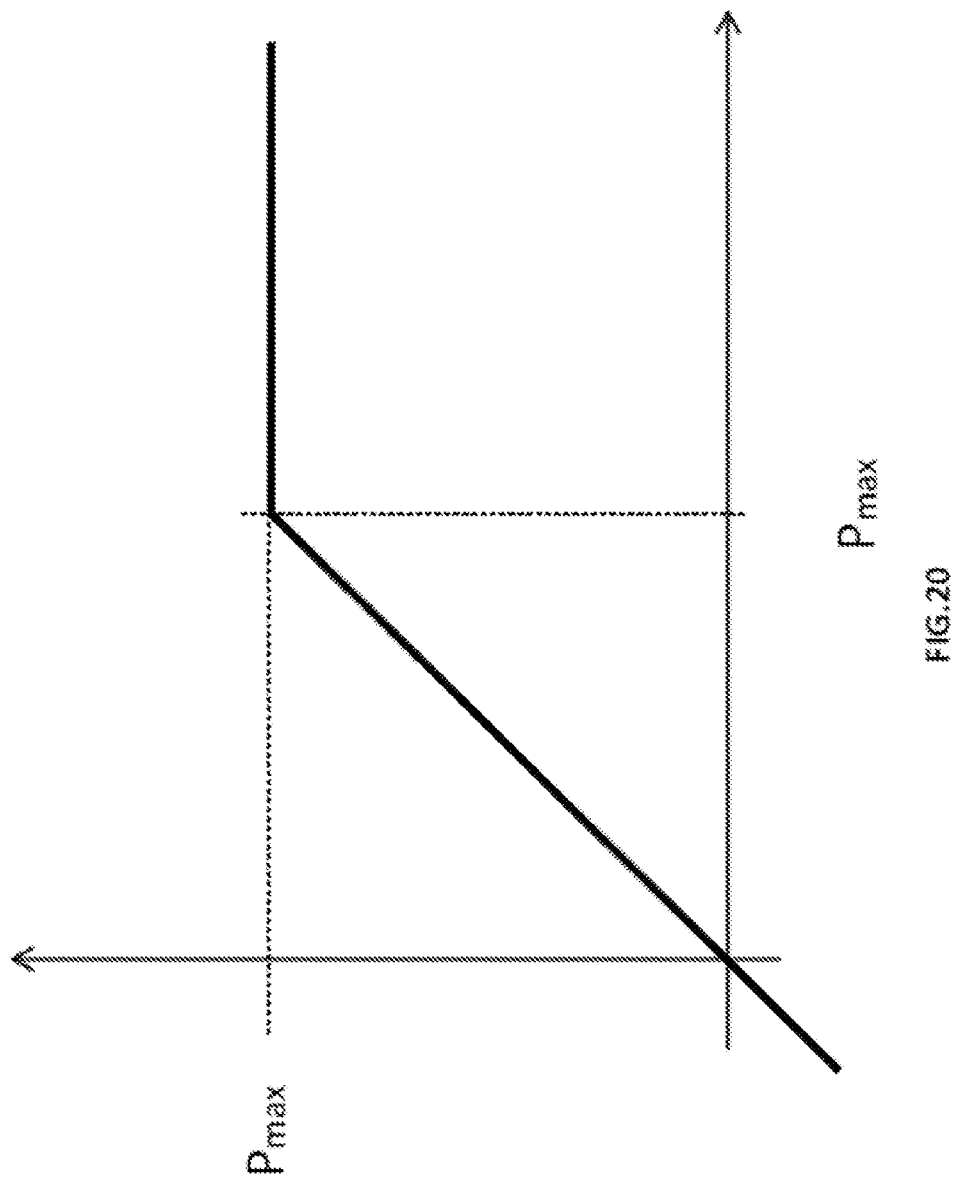
FIG. 20 illustrates a simplified soft limiter for enforcing a peak power constraint, in accordance with an embodiment of the present invention.

In channels constrained by the use of a nonlinear amplifier the optimization of the constellation may be appropriately modified. In these cases, the AM/AM curve of the nonlinearity may be represented using the simplified soft limiter shown FIG. 20 by enforcing a peak power constraint. Peak power of the constellation may then become a relevant parameter.

The following system conditions were used in the computation of signal constellations according to an optimization procedure. Signal constellations with 16, 32, 64, 128 and 256 modulation points were considered. Five code rates: $r_c=1/2, 5/8, 3/4, 13/16, 7/8$ were considered. Channel scenarios were considered corresponding to AWGN without phase noise, AWGN with minimal residual phase noise corresponding to the optimal pilot distribution, AWGN with residual phase noise corresponding to the standard (64/512) pilot distribution; AWGN with non linearity, AWGN with non linearity and minimal residual phase noise corresponding to optimal pilot distribution, and AWGN with non linearity and residual phase noise corresponding to the standard (64/512) pilot distribution. The non linearity is represented using a Peak Signal-to-Noise ratio (PSNR) constraint.

According to embodiments of the present invention, for each pair of code rate and constellation size, as well as for various levels of the residual phase noise, a constellation and the corresponding binary labeling are designed to achieve a PMI larger than the target spectral efficiency $r=mr_c$ with the minimum possible SNR or PSNR.

Figure 21:
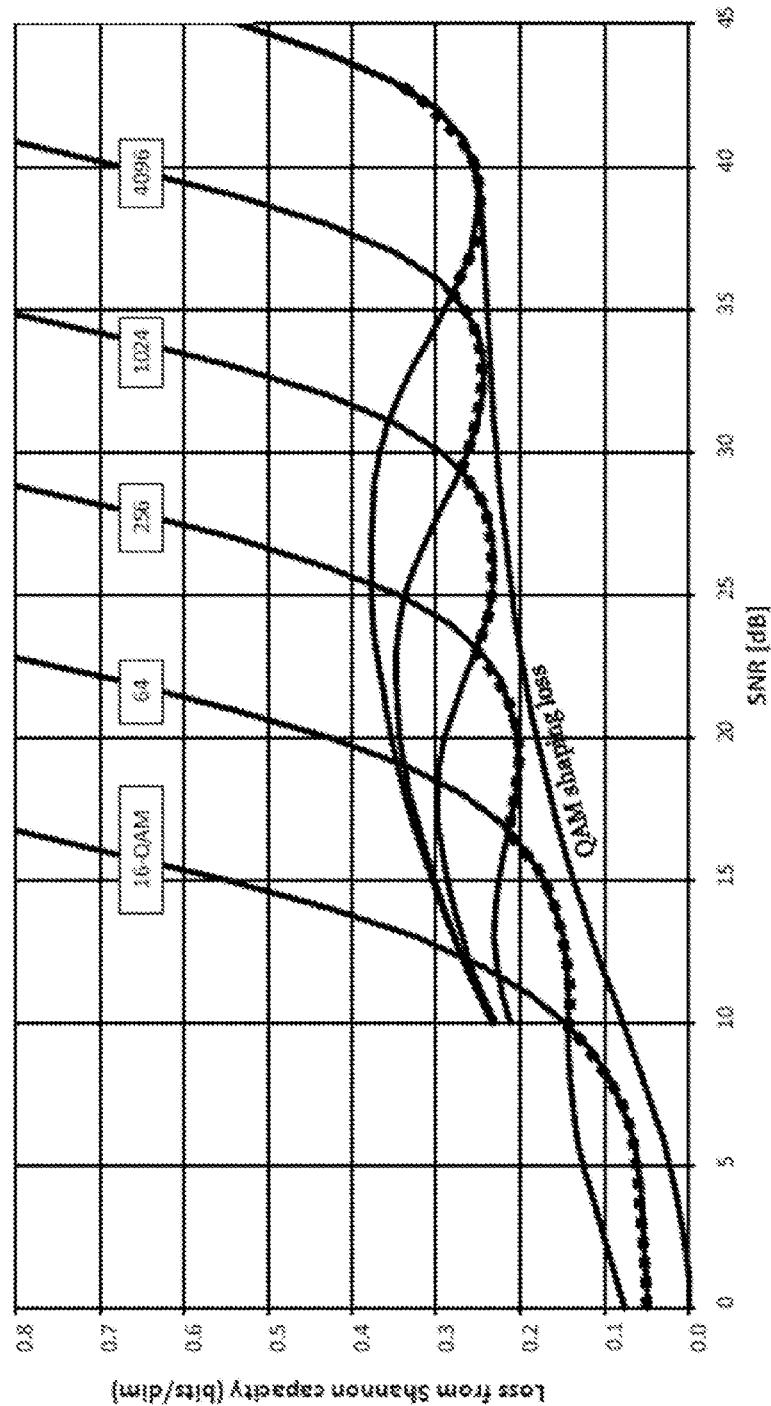
FIG. 21 illustrates a theoretical spectral efficiency according to an embodiment of the present invention.

FIG. 21 is a graph showing the loss in spectral efficiency (from the Shannon limit (in bits per dimension) as a function of the channel SNR, for square QAM type constellations ($M=2^{2q}$) with Bit Interleaved Coded Modulation (BICMm) (a Pragmatic Mutual Information (PMI) approach), according to an embodiment of the present invention. The plot demonstrates that when using a BICM approach, each constellation set has an optimal range of SNR for practical uses.

Figure 22:
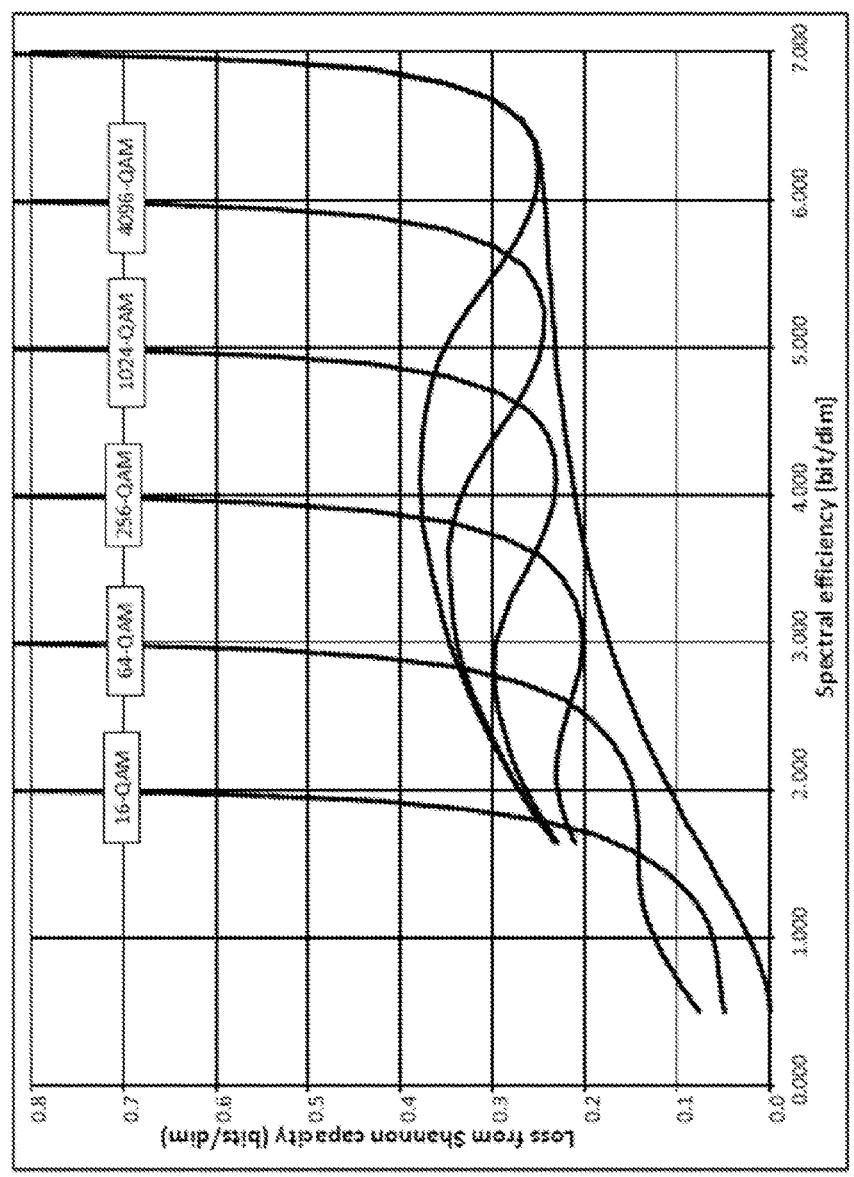
FIG. 22 illustrates a theoretical spectral efficiency according to another embodiment of the present invention.

FIG. 22 is a graph showing the loss in spectral efficiency from the Shannon limit (in bits per dimension) as a function of the spectral efficiency, according to an embodiment of the present invention. In FIG. 22 it is observed that the crossing point for optimality between the different constellation happens roughly at spectral efficiencies $r=(q-0.4)$ bit per dimension, where q is the number of bits associated to each signal of the constellation.

From this observation it is possible to determine the optimal range of coding rates for $2^{2q}$ QAM constellation with BICM:

$$(q-1.4)/q < r_c^q < (q-0.4)/q.$$

In some embodiments, the optimal range may be further reduced by also implementing the cross QAM constellations with size $M=2^{2q+1}$. That is, non-square QAM constellations may be utilized in addition to square QAM constellations.

In some embodiments, a 16-point constellation or a 32-point constellation, for example having a code rate of 3/4, is used when $0.3 < r_c^q < 0.8$. In some embodiments, a 64-point constellation or a 128-point constellation, for example having a code rate of 5/8, 3/4, 13/16 or 7/8 is used when $0.53 < r_c^q < 0.87$. In some embodiments, a 256-point constellation, for example having a code rate of 3/4, 13/16 or 7/8 is used when $0.65 < r_c^q < 0.9$.

Figure 23:
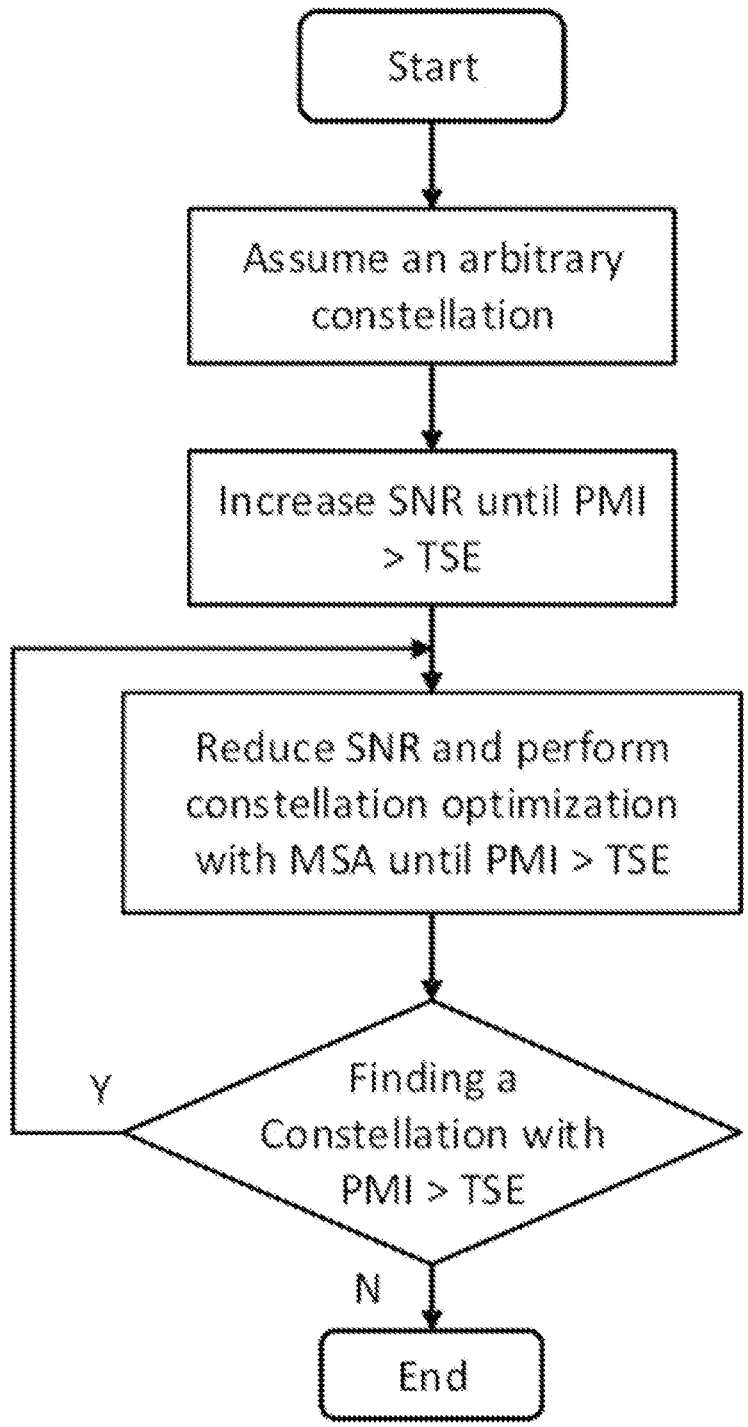
FIG. 23 illustrates a constellation optimization procedure according to an embodiment of the present invention.

Given modulation format, code rate and channel scenario, constellation and bit sequence labeling can be optimized to minimize SNR to achieve a PMI greater than the target spectral efficiency $r=mr_c$. FIG. 23 illustrates an applicable constellation optimization procedure using a simulated annealing (SA) technique, according to an embodiment of the present invention. Embodiments of the present invention involve providing a signal constellation which is derived from a simulating annealing algorithm which is applied to maximize Pragmatic Mutual Information. The algorithm may use a logarithmic, polynomial, or other cooling function. The polynomial cooling function may be particularly appropriate for higher order modulations, such as order 64 and above.

Tables 2-16 illustrate numerical results indicative of performance of the corresponding signal constellations disclosed herein in Tables 17-26C and FIGS. 8-17C, compared to the performance of conventional QAM constellations. These signal constellations were evaluated numerically to obtain the illustrated results. The results were obtained under certain assumptions and are provided by way of example only, and with the understanding that performance may vary in practice.

Performance in Tables 2-16 is reported in terms of SNR or PSNR, as appropriate, to achieve the target spectral efficiencies, for the QAM and selected optimized constellations. Tables 2-4 relate to 16-point constellations, Tables 5-7 relate to 32-point constellations, Tables 8-10 relate to 64-point constellations, Tables 11-13 relate to 128-point constellations, and Tables 14-16 relate to 256-point constellations. Tables 2, 5, 8, 11 and 14 show the performance of square QAM constellations used as a basis for comparison. Tables 3, 6, 9, 12 and 15 show the performance of the selected (optimized) constellations according to embodiments of the invention. Tables 4, 7, 10, 13 and 16 show the gains in dB of the selected (optimized) constellations disclosed herein with respect to their closest corresponding QAM constellation and each of these tables can be obtained by subtraction performed on the two tables immediately preceding it.

In Tables 2-16 each performance result has been obtained using a constellation optimized for the system scenario corresponding to the phase noise, pilot signal, and power amplifier conditions indicated in the table.

Tables 2-16 show performance gains that are believed to be significant in a significant number of cases, especially in the case of PSNR.

TABLE 1

Performance (I) of QAM versus selected optimized constellations with 16 points.
SQUARE QAM CONSTELLATION

| CODE RATE | SNR | | | PSNR | | |
|---|---|---|---|---|---|---|
| | NO PN | PN OPT | PN STD | NO PN | PN OPT | PN STD |
| 1/2 | 5.33 | 5.38 | 5.38 | 7.86 | 7.96 | 7.96 |
| 5/8 | 7.30 | 7.40 | 7.42 | 9.87 | 9.93 | 9.99 |
| 3/4 | 9.29 | 9.44 | 9.51 | 11.89 | 11.95 | 12.01 |
| 13/16 | 10.36 | 10.52 | 10.54 | 12.89 | 13.02 | 13.11 |
| 7/8 | 11.57 | 11.73 | 11.82 | 14.10 | 14.23 | 14.35 |

TABLE 3

Performance (II) of QAM versus selected optimized constellations with 16 points.
EMBODIMENT CONSTELLATION

| CODE RATE | SNR | | | PSNR | | |
|---|---|---|---|---|---|---|
| | NO PN | PN OPT | PN STD | NO PN | PN OPT | PN STD |
| 1/2 | 5.21 | 5.33 | 5.33 | 6.51 | 6.58 | 6.61 |
| 5/8 | 7.17 | 7.27 | 7.27 | 8.52 | 8.65 | 8.65 |
| 3/4 | 9.26 | 9.33 | 9.39 | 10.57 | 10.70 | 10.76 |
| 13/16 | 10.42 | 10.52 | 10.55 | 11.66 | 11.86 | 11.89 |
| 7/8 | 11.87 | 11.98 | 12.07 | 12.88 | 13.10 | 13.23 |

TABLE 4

Performance (III) of QAM versus selected optimized constellations with 16 points.
DIFFERENCE

| CODE | SNR | | | PSNR | | |
|---|---|---|---|---|---|---|
| RATE | NO PN | PN OPT | PN STD | NO PN | PN OPT | PN STD |
| 1/2 | 0.13 | 0.05 | 0.05 | 1.36 | 1.38 | 1.34 |
| 5/8 | 0.13 | 0.13 | 0.14 | 1.34 | 1.28 | 1.34 |
| 3/4 | 0.03 | 0.11 | 0.13 | 1.32 | 1.25 | 1.25 |
| 13/16 | −0.05 | 0.00 | −0.01 | 1.23 | 1.16 | 1.22 |
| 7/8 | −0.30 | −0.25 | −0.25 | 1.23 | 1.13 | 1.13 |

TABLE 5

Performance (I) of QAM versus selected optimized constellations with 32 points.
SQUARE QAM CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 7.87 | 7.93 | 7.99 | 10.12 | 10.24 | 10.24 |
| 5/8 | 10.10 | 10.24 | 10.32 | 12.38 | 12.50 | 12.57 |
| 3/4 | 12.27 | 12.42 | 12.55 | 14.55 | 14.69 | 14.82 |
| 13/16 | 13.31 | 13.56 | 13.70 | 15.65 | 15.81 | 16.02 |
| 7/8 | 14.55 | 14.80 | 15.02 | 16.83 | 17.05 | 17.31 |

TABLE 6

Performance (II) of QAM versus selected optimized constellations with 32 points.
EMBODIMENT CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 7.37 | 7.49 | 7.49 | 8.99 | 9.12 | 9.12 |
| 5/8 | 9.50 | 9.62 | 9.69 | 11.32 | 11.49 | 11.57 |
| 3/4 | 11.77 | 11.89 | 11.95 | 13.80 | 14.05 | 14.27 |
| 13/16 | 13.02 | 13.18 | 13.27 | 15.27 | 15.59 | 15.95 |
| 7/8 | 14.57 | 14.77 | 14.89 | 16.94 | 17.52 | 18.27 |

TABLE 7

Performance (III) of QAM versus selected optimized constellations with 32 points.
DIFFERENCE

| CODE | SNR | | | PSNR | | |
|---|---|---|---|---|---|---|
| RATE | NO PN | PN OPT | PN STD | NO PN | PN OPT | PN STD |
| 1/2 | 0.50 | 0.43 | 0.50 | 1.13 | 1.13 | 1.13 |
| 5/8 | 0.60 | 0.62 | 0.63 | 1.06 | 1.01 | 1.00 |
| 3/4 | 0.50 | 0.53 | 0.60 | 0.75 | 0.64 | 0.55 |
| 13/16 | 0.28 | 0.38 | 0.43 | 0.38 | 0.22 | 0.07 |
| 7/8 | −0.02 | 0.03 | 0.13 | −0.11 | −0.47 | −0.95 |

TABLE 8

Performance (I) of QAM versus selected optimized constellations with 64 points.
SQUARE QAM CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 9.44 | 9.56 | 9.64 | 13.14 | 13.20 | 13.26 |
| 5/8 | 11.92 | 12.14 | 12.17 | 15.64 | 15.77 | 15.89 |
| 3/4 | 14.41 | 14.66 | 14.83 | 18.07 | 18.29 | 18.54 |
| 13/16 | 15.71 | 15.99 | 16.26 | 19.37 | 19.59 | 19.96 |
| 7/8 | 17.06 | 17.42 | 17.91 | 20.75 | 21.03 | 21.55 |

TABLE 9

Performance (II) of QAM versus selected optimized constellations with 64 points.
EMBODIMENT CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 9.01 | 9.07 | 9.14 | 11.01 | 11.14 | 11.19 |
| 5/8 | 11.39 | 11.55 | 11.64 | 13.77 | 13.94 | 14.06 |
| 3/4 | 13.94 | 14.16 | 14.29 | 16.54 | 16.72 | 16.97 |
| 13/16 | 15.46 | 15.62 | 15.84 | 17.84 | 18.14 | 18.59 |
| 7/8 | 16.93 | 17.16 | 17.41 | 19.28 | 19.63 | 20.25 |

TABLE 10

Performance (III) of QAM versus selected optimized constellations with 64 points.
DIFFERENCE

| CODE | SNR | | | PSNR | | |
|---|---|---|---|---|---|---|
| RATE | NO PN | PN OPT | PN STD | NO PN | PN OPT | PN STD |
| 1/2 | 0.42 | 0.49 | 0.50 | 2.13 | 2.06 | 2.08 |
| 5/8 | 0.53 | 0.59 | 0.53 | 1.88 | 1.83 | 1.83 |
| 3/4 | 0.47 | 0.50 | 0.55 | 1.53 | 1.56 | 1.57 |
| 13/16 | 0.25 | 0.38 | 0.42 | 1.53 | 1.45 | 1.38 |
| 7/8 | 0.13 | 0.27 | 0.50 | 1.47 | 1.41 | 1.30 |

TABLE 11

Performance (I) of QAM versus selected optimized constellations with 128 points.
SQUARE QAM CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 11.76 | 11.95 | 12.07 | 14.95 | 15.07 | 15.20 |
| 5/8 | 14.39 | 14.64 | 14.89 | 17.56 | 17.77 | 18.02 |
| 3/4 | 17.03 | 17.38 | 17.78 | 20.17 | 20.50 | 20.93 |
| 13/16 | 18.38 | 18.78 | 19.47 | 21.52 | 21.88 | 22.60 |
| 7/8 | 19.81 | 20.34 | 21.36 | 22.97 | 23.44 | 24.56 |

TABLE 12

Performance (II) of QAM versus selected optimized constellations with 128 points.
EMBODIMENT CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 10.70 | 10.85 | 10.88 | 13.24 | 13.45 | 13.49 |
| 5/8 | 13.52 | 13.64 | 13.77 | 16.17 | 16.39 | 16.64 |
| 3/4 | 16.41 | 16.63 | 16.88 | 19.28 | 19.63 | 20.13 |
| 13/16 | 18.10 | 18.35 | 18.72 | 20.72 | 21.10 | 21.72 |
| 7/8 | 19.73 | 19.98 | 20.47 | 22.24 | 22.69 | 23.72 |

TABLE 13

Performance (III) of QAM versus selected optimized constellations with 128 points.
DIFFERENCE

| CODE | SNR | | | PSNR | | |
|---|---|---|---|---|---|---|
| RATE | NO PN | PN OPT | PN STD | NO PN | PN OPT | PN STD |
| 1/2 | 1.06 | 1.09 | 1.20 | 1.70 | 1.63 | 1.70 |
| 5/8 | 0.88 | 1.00 | 1.13 | 1.39 | 1.38 | 1.38 |
| 3/4 | 0.63 | 0.75 | 0.91 | 0.89 | 0.88 | 0.81 |
| 13/16 | 0.28 | 0.43 | 0.75 | 0.80 | 0.78 | 0.88 |
| 7/8 | 0.08 | 0.36 | 0.89 | 0.73 | 0.75 | 0.84 |

TABLE 14

Performance (I) of QAM versus selected optimized constellations with 256 points.
SQUARE QAM CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 13.32 | 13.48 | 13.60 | 17.50 | 17.63 | 17.82 |
| 5/8 | 16.26 | 16.60 | 16.91 | 20.48 | 20.73 | 21.13 |
| 3/4 | 19.31 | 19.73 | 20.56 | 23.49 | 23.85 | 24.81 |
| 13/16 | 20.83 | 21.46 | 22.71 | 25.08 | 25.50 | 26.96 |
| 7/8 | 22.48 | 23.26 | 25.51 | 26.66 | 27.35 | 30.00 |

TABLE 15

Performance (II) of QAM versus selected optimized constellations with 256 points.
EMBODIMENT CONSTELLATION

| CODE | SNR | | | PSNR | | |
|---|---|---|---|---|---|---|
| RATE | NO PN | PN OPT | PN STD | NO PN | PN OPT | PN STD |
| 1/2 | 12.70 | 12.85 | 12.98 | 15.95 | 16.07 | 16.23 |
| 5/8 | 15.66 | 15.90 | 16.13 | 19.02 | 19.26 | 19.60 |
| 3/4 | 18.84 | 19.18 | 19.68 | 22.18 | 22.48 | 23.23 |
| 13/16 | 20.46 | 20.86 | 21.64 | 23.96 | 24.33 | 25.36 |
| 7/8 | 22.73 | 23.10 | 24.01 | 25.88 | 26.28 | 27.65 |

TABLE 16

Performance (III) of QAM versus selected optimized constellations with 256 points.
DIFFERENCE

| CODE | SNR | | | PSNR | | |
|---|---|---|---|---|---|---|
| RATE | NO PN | PN OPT | PN STD | NO PN | PN OPT | PN STD |
| 1/2 | 0.63 | 0.63 | 0.63 | 1.55 | 1.56 | 1.59 |
| 5/8 | 0.60 | 0.70 | 0.77 | 1.45 | 1.47 | 1.53 |
| 3/4 | 0.47 | 0.55 | 0.88 | 1.31 | 1.38 | 1.58 |
| 13/16 | 0.38 | 0.59 | 1.07 | 1.13 | 1.17 | 1.59 |
| 7/8 | −0.25 | 0.16 | 1.50 | 0.77 | 1.07 | 2.35 |

Tables 17-26C as referenced herein are presented below. As noted above, each table specifies a signal constellation, with each row specifying a constellation symbol in which one of the X and Y values indicates a normalized magnitude of the in-phase component of the constellation symbol and the other of the X and Y values indicates a normalized magnitude of the quadrature component of the constellation symbol. The normalized magnitudes may be scaled. The first column specifies bit sequences corresponding to the constellation symbols. In some embodiments, the entries in the first column can be reordered. In some embodiments, the entries in the second column can be varied, for example by rounding, truncating or varying by up to a predetermined amount.

TABLE 17

| COORDINATE | SYMBOL | |
|---|---|---|
| BITS | X | Y |
| 0000 | 0.208300 | 0.385859 |
| 0001 | 0.643529 | 0.210665 |
| 0010 | 0.453620 | 1.186803 |
| 0011 | 1.179606 | 0.586066 |
| 0100 | 0.208300 | −0.385859 |
| 0101 | 0.643529 | −0.210665 |
| 0110 | 0.453620 | −1.186803 |
| 0111 | 1.179606 | −0.586066 |
| 1000 | −0.208300 | 0.385859 |
| 1001 | −0.643529 | 0.210665 |
| 1010 | −0.453620 | 1.186803 |
| 1011 | −1.179606 | 0.586066 |
| 1100 | −0.208300 | −0.385859 |
| 1101 | −0.643529 | −0.210665 |
| 1110 | −0.453620 | −1.186803 |
| 1111 | −1.179606 | −0.586066 |

TABLE 18

| COORDINATE | SYMBOL | |
|---|---|---|
| BITS | X | Y |
| 00000 | 1.310029 | 0.338031 |
| 00001 | 0.224325 | 0.876872 |
| 00010 | 0.720578 | 0.336506 |
| 00011 | 0.269767 | 0.543938 |
| 00100 | 1.012286 | 0.981782 |
| 00101 | 0.423089 | 1.343637 |
| 00110 | 0.540439 | 0.139694 |
| 00111 | 0.159408 | 0.198087 |
| 01000 | 1.310029 | −0.338031 |
| 01001 | 0.224325 | −0.876872 |
| 01010 | 0.720578 | −0.336506 |
| 01011 | 0.269767 | −0.543938 |
| 01100 | 1.012286 | −0.981782 |
| 01101 | 0.423089 | −1.343637 |
| 01110 | 0.540439 | −0.139694 |

TABLE 18-continued

| COORDINATE BITS | SYMBOL X | SYMBOL Y |
|---|---|---|
| 01111 | 0.159408 | −0.198087 |
| 10000 | −1.310029 | 0.338031 |
| 10001 | −0.224325 | 0.876872 |
| 10010 | −0.720578 | 0.336506 |
| 10011 | −0.269767 | 0.543938 |
| 10100 | −1.012286 | 0.981782 |
| 10101 | −0.423089 | 1.343637 |
| 10110 | −0.540439 | 0.139694 |
| 10111 | −0.159408 | 0.198087 |
| 11000 | −1.310029 | −0.338031 |
| 11001 | −0.224325 | −0.876872 |
| 11010 | −0.720578 | −0.336506 |
| 11011 | −0.269767 | −0.543938 |
| 11100 | −1.012286 | −0.981782 |
| 11101 | −0.423089 | −1.343637 |
| 11110 | −0.540439 | −0.139694 |
| 11111 | −0.159408 | −0.198087 |

TABLE 19A

| COORDINATE BITS | SYMBOL X | SYMBOL Y |
|---|---|---|
| 000000 | 1.469392 | 0.279838 |
| 000001 | 1.056826 | 0.221924 |
| 000010 | 0.278986 | 0.118028 |
| 000011 | 0.715494 | 0.159574 |
| 000100 | 1.278954 | 0.863275 |
| 000101 | 0.881208 | 0.583362 |
| 000110 | 0.313280 | 0.160867 |
| 000111 | 0.595671 | 0.362205 |
| 001000 | 0.295098 | 1.516036 |
| 001001 | 0.173629 | 1.014971 |
| 001010 | 0.114742 | 0.259617 |
| 001011 | 0.152038 | 0.700078 |
| 001100 | 0.785642 | 1.243046 |
| 001101 | 0.550103 | 0.874280 |
| 001110 | 0.164975 | 0.288326 |
| 001111 | 0.353214 | 0.596159 |
| 010000 | 1.469392 | −0.279838 |
| 010001 | 1.056826 | −0.221924 |
| 010010 | 0.278986 | −0.118028 |
| 010011 | 0.715494 | −0.159574 |
| 010100 | 1.278954 | −0.863275 |
| 010101 | 0.881208 | −0.583362 |
| 010110 | 0.313280 | −0.160867 |
| 010111 | 0.595671 | −0.362205 |
| 011000 | 0.295098 | −1.516036 |
| 011001 | 0.173629 | −1.014971 |
| 011010 | 0.114742 | −0.259617 |
| 011011 | 0.152038 | −0.700078 |
| 011100 | 0.785642 | −1.243046 |
| 011101 | 0.550103 | −0.874280 |
| 011110 | 0.164975 | −0.288326 |
| 011111 | 0.353214 | −0.596159 |
| 100000 | −1.469392 | 0.279838 |
| 100001 | −1.056826 | 0.221924 |
| 100010 | −0.278986 | 0.118028 |
| 100011 | −0.715494 | 0.159574 |
| 100100 | −1.278954 | 0.863275 |
| 100101 | −0.881208 | 0.583362 |
| 100110 | −0.313280 | 0.160867 |
| 100111 | −0.595671 | 0.362205 |
| 101000 | −0.295098 | 1.516036 |
| 101001 | −0.173629 | 1.014971 |
| 101010 | −0.114742 | 0.259617 |
| 101011 | −0.152038 | 0.700078 |
| 101100 | −0.785642 | 1.243046 |
| 101101 | −0.550103 | 0.874280 |
| 101110 | −0.164975 | 0.288326 |
| 101111 | −0.353214 | 0.596159 |
| 110000 | −1.469392 | −0.279838 |
| 110001 | −1.056826 | −0.221924 |
| 110010 | −0.278986 | −0.118028 |
| 110011 | −0.715494 | −0.159574 |
| 110100 | −1.278954 | −0.863275 |
| 110101 | −0.881208 | −0.583362 |
| 110110 | −0.313280 | −0.160867 |
| 110111 | −0.595671 | −0.362205 |
| 111000 | −0.295098 | −1.516036 |
| 111001 | −0.173629 | −1.014971 |
| 111010 | −0.114742 | −0.259617 |
| 111011 | −0.152038 | −0.700078 |
| 111100 | −0.785642 | −1.243046 |
| 111101 | −0.550103 | −0.874280 |
| 111110 | −0.164975 | −0.288326 |
| 111111 | −0.353214 | −0.596159 |

TABLE 19B

| COORDINATE BITS | SYMBOL X | SYMBOL Y |
|---|---|---|
| 000000 | 1.492905 | 0.360756 |
| 000001 | 1.080694 | 0.217529 |
| 000010 | 0.403075 | 0.095458 |
| 000011 | 0.768391 | 0.154809 |
| 000100 | 1.206775 | 0.854056 |
| 000101 | 0.849704 | 0.601606 |
| 000110 | 0.417913 | 0.175906 |
| 000111 | 0.610015 | 0.376978 |
| 001000 | 0.309008 | 1.471972 |
| 001001 | 0.198570 | 1.031429 |
| 001010 | 0.103390 | 0.265338 |
| 001011 | 0.134876 | 0.685577 |
| 001100 | 0.824050 | 1.192733 |
| 001101 | 0.553412 | 0.861355 |
| 001110 | 0.174613 | 0.295716 |
| 001111 | 0.339582 | 0.576666 |
| 010000 | 1.492905 | −0.360756 |
| 010001 | 1.080694 | −0.217529 |
| 010010 | 0.403075 | −0.095458 |
| 010011 | 0.768391 | −0.154809 |
| 010100 | 1.206775 | −0.854056 |
| 010101 | 0.849704 | −0.601606 |
| 010110 | 0.417913 | −0.175906 |
| 010111 | 0.610015 | −0.376978 |
| 011000 | 0.309008 | −1.471972 |
| 011001 | 0.198570 | −1.031429 |
| 011010 | 0.103390 | −0.265338 |
| 011011 | 0.134876 | −0.685577 |
| 011100 | 0.824050 | −1.192733 |
| 011101 | 0.553412 | −0.861355 |
| 011110 | 0.174613 | −0.295716 |
| 011111 | 0.339582 | −0.576666 |
| 100000 | −1.492905 | 0.360756 |
| 100001 | −1.080694 | 0.217529 |
| 100010 | −0.403075 | 0.095458 |
| 100011 | −0.768391 | 0.154809 |
| 100100 | −1.206775 | 0.854056 |
| 100101 | −0.849704 | 0.601606 |
| 100110 | −0.417913 | 0.175906 |
| 100111 | −0.610015 | 0.376978 |
| 101000 | −0.309008 | 1.471972 |
| 101001 | −0.198570 | 1.031429 |
| 101010 | −0.103390 | 0.265338 |
| 101011 | −0.134876 | 0.685577 |
| 101100 | −0.824050 | 1.192733 |
| 101101 | −0.553412 | 0.861355 |
| 101110 | −0.174613 | 0.295716 |
| 101111 | −0.339582 | 0.576666 |
| 110000 | −1.492905 | −0.360756 |
| 110001 | −1.080694 | −0.217529 |
| 110010 | −0.403075 | −0.095458 |

TABLE 19B-continued

| COORDINATE BITS | SYMBOL X | SYMBOL Y |
|---|---|---|
| 110011 | −0.768391 | −0.154809 |
| 110100 | −1.206775 | −0.854056 |
| 110101 | −0.849704 | −0.601606 |
| 110110 | −0.417913 | −0.175906 |
| 110111 | −0.610015 | −0.376978 |
| 111000 | −0.309008 | −1.471972 |
| 111001 | −0.198570 | −1.031429 |
| 111010 | −0.103390 | −0.265338 |
| 111011 | −0.134876 | −0.685577 |
| 111100 | −0.824050 | −1.192733 |
| 111101 | −0.553412 | −0.861355 |
| 111110 | −0.174613 | −0.295716 |
| 111111 | −0.339582 | −0.576666 |

TABLE 19C

| COORDINATE BITS | SYMBOL X | SYMBOL Y |
|---|---|---|
| 000000 | 1.223083 | 0.871183 |
| 000001 | 1.501110 | 0.301512 |
| 000010 | 0.977190 | 0.129880 |
| 000011 | 1.034515 | 0.370077 |
| 000100 | 0.752034 | 1.165798 |
| 000101 | 0.670194 | 0.763847 |
| 000110 | 0.622485 | 0.140135 |
| 000111 | 0.728917 | 0.432979 |
| 001000 | 0.146134 | 1.065653 |
| 001001 | 0.158150 | 0.688012 |
| 001010 | 0.128341 | 0.119548 |
| 001011 | 0.111238 | 0.401943 |
| 001100 | 0.296713 | 1.461668 |
| 001101 | 0.398918 | 0.653188 |
| 001110 | 0.386998 | 0.128121 |
| 001111 | 0.372132 | 0.404640 |
| 010000 | 1.223083 | −0.871183 |
| 010001 | 1.501110 | −0.301512 |
| 010010 | 0.977190 | −0.129880 |
| 010011 | 1.034515 | −0.370077 |
| 010100 | 0.752034 | −1.165798 |
| 010101 | 0.670194 | −0.763847 |
| 010110 | 0.622485 | −0.140135 |
| 010111 | 0.728917 | −0.432979 |
| 011000 | 0.146134 | −1.065653 |
| 011001 | 0.158150 | −0.688012 |
| 011010 | 0.128341 | −0.119548 |
| 011011 | 0.111238 | −0.401943 |
| 011100 | 0.296713 | −1.461668 |
| 011101 | 0.398918 | −0.653188 |
| 011110 | 0.386998 | −0.128121 |
| 011111 | 0.372132 | −0.404640 |
| 100000 | −1.223083 | 0.871183 |
| 100001 | −1.501110 | 0.301512 |
| 100010 | −0.977190 | 0.129880 |
| 100011 | −1.034515 | 0.370077 |
| 100100 | −0.752034 | 1.165798 |
| 100101 | −0.670194 | 0.763847 |
| 100110 | −0.622485 | 0.140135 |
| 100111 | −0.728917 | 0.432979 |
| 101000 | −0.146134 | 1.065653 |
| 101001 | −0.158150 | 0.688012 |
| 101010 | −0.128341 | 0.119548 |
| 101011 | −0.111238 | 0.401943 |
| 101100 | −0.296713 | 1.461668 |
| 101101 | −0.398918 | 0.653188 |
| 101110 | −0.386998 | 0.128121 |
| 101111 | −0.372132 | 0.404640 |
| 110000 | −1.223083 | −0.871183 |
| 110001 | −1.501110 | −0.301512 |
| 110010 | −0.977190 | −0.129880 |
| 110011 | −1.034515 | −0.370077 |
| 110100 | −0.752034 | −1.165798 |

TABLE 19C-continued

| COORDINATE BITS | SYMBOL X | SYMBOL Y |
|---|---|---|
| 110101 | −0.670194 | −0.763847 |
| 110110 | −0.622485 | −0.140135 |
| 110111 | −0.728917 | −0.432979 |
| 111000 | −0.146134 | −1.065653 |
| 111001 | −0.158150 | −0.688012 |
| 111010 | −0.128341 | −0.119548 |
| 111011 | −0.111238 | −0.401943 |
| 111100 | −0.296713 | −1.461668 |
| 111101 | −0.398918 | −0.653188 |
| 111110 | −0.386998 | −0.128121 |
| 111111 | −0.372132 | −0.404640 |

TABLE 19D

| COORDINATE BITS | SYMBOL X | SYMBOL Y |
|---|---|---|
| 000000 | 1.484430 | 0.355657 |
| 000001 | 1.103689 | 0.241419 |
| 000010 | 0.483043 | 0.093713 |
| 000011 | 0.757638 | 0.144839 |
| 000100 | 1.150175 | 0.837105 |
| 000101 | 0.876141 | 0.599840 |
| 000110 | 0.335946 | 0.248000 |
| 000111 | 0.608728 | 0.420395 |
| 001000 | 0.255763 | 1.404577 |
| 001001 | 0.189712 | 1.014604 |
| 001010 | 0.088351 | 0.457627 |
| 001011 | 0.166639 | 0.679954 |
| 001100 | 0.768973 | 1.227892 |
| 001101 | 0.588939 | 0.901538 |
| 001110 | 0.105757 | 0.127560 |
| 001111 | 0.433169 | 0.631655 |
| 010000 | 1.484430 | −0.355657 |
| 010001 | 1.103689 | −0.241419 |
| 010010 | 0.483043 | −0.093713 |
| 010011 | 0.757638 | −0.144839 |
| 010100 | 1.150175 | −0.837105 |
| 010101 | 0.876141 | −0.599840 |
| 010110 | 0.335946 | −0.248000 |
| 010111 | 0.608728 | −0.420395 |
| 011000 | 0.255763 | −1.404577 |
| 011001 | 0.189712 | −1.014604 |
| 011010 | 0.088351 | −0.457627 |
| 011011 | 0.166639 | −0.679954 |
| 011100 | 0.768973 | −1.227892 |
| 011101 | 0.588939 | −0.901538 |
| 011110 | 0.105757 | −0.127560 |
| 011111 | 0.433169 | −0.631655 |
| 100000 | −1.484430 | 0.355657 |
| 100001 | −1.103689 | 0.241419 |
| 100010 | −0.483043 | 0.093713 |
| 100011 | −0.757638 | 0.144839 |
| 100100 | −1.150175 | 0.837105 |
| 100101 | −0.876141 | 0.599840 |
| 100110 | −0.335946 | 0.248000 |
| 100111 | −0.608728 | 0.420395 |
| 101000 | −0.255763 | 1.404577 |
| 101001 | −0.189712 | 1.014604 |
| 101010 | −0.088351 | 0.457627 |
| 101011 | −0.166639 | 0.679954 |
| 101100 | −0.768973 | 1.227892 |
| 101101 | −0.588939 | 0.901538 |
| 101110 | −0.105757 | 0.127560 |
| 101111 | −0.433169 | 0.631655 |
| 110000 | −1.484430 | −0.355657 |
| 110001 | −1.103689 | −0.241419 |
| 110010 | −0.483043 | −0.093713 |
| 110011 | −0.757638 | −0.144839 |
| 110100 | −1.150175 | −0.837105 |
| 110101 | −0.876141 | −0.599840 |
| 110110 | −0.335946 | −0.248000 |

TABLE 19D-continued

| COORDINATE BITS | SYMBOL X | SYMBOL Y |
|---|---|---|
| 110111 | −0.608728 | −0.420395 |
| 111000 | −0.255763 | −1.404577 |
| 111001 | −0.189712 | −1.014604 |
| 111010 | −0.088351 | −0.457627 |
| 111011 | −0.166639 | −0.679954 |
| 111100 | −0.768973 | −1.227892 |
| 111101 | −0.588939 | −0.901538 |
| 111110 | −0.105757 | −0.127560 |
| 111111 | −0.433169 | −0.631655 |

TABLE 20A

| COORDINATE BITS | SYMBOL X | SYMBOL Y |
|---|---|---|
| 0000000 | 0.737273 | 0.315203 |
| 0000001 | 0.782564 | 0.180128 |
| 0000010 | 0.471801 | 0.125755 |
| 0000011 | 0.472349 | 0.082889 |
| 0000100 | 0.584038 | 0.424801 |
| 0000101 | 0.600465 | 0.414587 |
| 0000110 | 0.411169 | 0.162424 |
| 0000111 | 0.431203 | 0.128962 |
| 0001000 | 0.113326 | 0.576184 |
| 0001001 | 0.132604 | 0.585352 |
| 0001010 | 0.109346 | 0.231247 |
| 0001011 | 0.109292 | 0.159056 |
| 0001100 | 0.265381 | 0.483973 |
| 0001101 | 0.265697 | 0.558228 |
| 0001110 | 0.164357 | 0.264453 |
| 0001111 | 0.142192 | 0.229753 |
| 0010000 | 0.987276 | 0.501105 |
| 0010001 | 1.073123 | 0.189336 |
| 0010010 | 1.238487 | 0.575437 |
| 0010011 | 1.328506 | 0.231640 |
| 0010100 | 0.751918 | 0.674743 |
| 0010101 | 0.679577 | 0.745095 |
| 0010110 | 1.248964 | 0.961337 |
| 0010111 | 1.793509 | 0.444665 |
| 0011000 | 0.178513 | 0.836678 |
| 0011001 | 0.146379 | 1.017268 |
| 0011010 | 0.280870 | 1.717180 |
| 0011011 | 0.220033 | 1.321346 |
| 0011100 | 0.371932 | 0.779634 |
| 0011101 | 0.467467 | 0.944880 |
| 0011110 | 0.933089 | 1.379959 |
| 0011111 | 0.606172 | 1.218326 |
| 0100000 | 0.737273 | −0.315203 |
| 0100001 | 0.782564 | −0.180128 |
| 0100010 | 0.471801 | −0.125755 |
| 0100011 | 0.472349 | −0.082889 |
| 0100100 | 0.584038 | −0.424801 |
| 0100101 | 0.600465 | −0.414587 |
| 0100110 | 0.411169 | −0.162424 |
| 0100111 | 0.431203 | −0.128962 |
| 0101000 | 0.113326 | −0.576184 |
| 0101001 | 0.132604 | −0.585352 |
| 0101010 | 0.109346 | −0.231247 |
| 0101011 | 0.109292 | −0.159056 |
| 0101100 | 0.265381 | −0.483973 |
| 0101101 | 0.265697 | −0.558228 |
| 0101110 | 0.164357 | −0.264453 |
| 0101111 | 0.142192 | −0.229753 |
| 0110000 | 0.987276 | −0.501105 |
| 0110001 | 1.073123 | −0.189336 |
| 0110010 | 1.238487 | −0.575437 |
| 0110011 | 1.328506 | −0.231640 |
| 0110100 | 0.751918 | −0.674743 |
| 0110101 | 0.679577 | −0.745095 |
| 0110110 | 1.248964 | −0.961337 |
| 0110111 | 1.793509 | −0.444665 |
| 0111000 | 0.178513 | −0.836678 |

TABLE 20A-continued

| COORDINATE BITS | SYMBOL X | SYMBOL Y |
|---|---|---|
| 0111001 | 0.146379 | −1.017268 |
| 0111010 | 0.280870 | −1.717180 |
| 0111011 | 0.220033 | −1.321346 |
| 0111100 | 0.371932 | −0.779634 |
| 0111101 | 0.467467 | −0.944880 |
| 0111110 | 0.933089 | −1.379959 |
| 0111111 | 0.606172 | −1.218326 |
| 1000000 | −0.737273 | 0.315203 |
| 1000001 | −0.782564 | 0.180128 |
| 1000010 | −0.471801 | 0.125755 |
| 1000011 | −0.472349 | 0.082889 |
| 1000100 | −0.584038 | 0.424801 |
| 1000101 | −0.600465 | 0.414587 |
| 1000110 | −0.411169 | 0.162424 |
| 1000111 | −0.431203 | 0.128962 |
| 1001000 | −0.113326 | 0.576184 |
| 1001001 | −0.132604 | 0.585352 |
| 1001010 | −0.109346 | 0.231247 |
| 1001011 | −0.109292 | 0.159056 |
| 1001100 | −0.265381 | 0.483973 |
| 1001101 | −0.265697 | 0.558228 |
| 1001110 | −0.164357 | 0.264453 |
| 1001111 | −0.142192 | 0.229753 |
| 1010000 | −0.987276 | 0.501105 |
| 1010001 | −1.073123 | 0.189336 |
| 1010010 | −1.238487 | 0.575437 |
| 1010011 | −1.328506 | 0.231640 |
| 1010100 | −0.751918 | 0.674743 |
| 1010101 | −0.679577 | 0.745095 |
| 1010110 | −1.248964 | 0.961337 |
| 1010111 | −1.793509 | 0.444665 |
| 1011000 | −0.178513 | 0.836678 |
| 1011001 | −0.146379 | 1.017268 |
| 1011010 | −0.280870 | 1.717180 |
| 1011011 | −0.220033 | 1.321346 |
| 1011100 | −0.371932 | 0.779634 |
| 1011101 | −0.467467 | 0.944880 |
| 1011110 | −0.933089 | 1.379959 |
| 1011111 | −0.606172 | 1.218326 |
| 1100000 | −0.737273 | −0.315203 |
| 1100001 | −0.782564 | −0.180128 |
| 1100010 | −0.471801 | −0.125755 |
| 1100011 | −0.472349 | −0.082889 |
| 1100100 | −0.584038 | −0.424801 |
| 1100101 | −0.600465 | −0.414587 |
| 1100110 | −0.411169 | −0.162424 |
| 1100111 | −0.431203 | −0.128962 |
| 1101000 | −0.113326 | −0.576184 |
| 1101001 | −0.132604 | −0.585352 |
| 1101010 | −0.109346 | −0.231247 |
| 1101011 | −0.109292 | −0.159056 |
| 1101100 | −0.265381 | −0.483973 |
| 1101101 | −0.265697 | −0.558228 |
| 1101110 | −0.164357 | −0.264453 |
| 1101111 | −0.142192 | −0.229753 |
| 1110000 | −0.987276 | −0.501105 |
| 1110001 | −1.073123 | −0.189336 |
| 1110010 | −1.238487 | −0.575437 |
| 1110011 | −1.328506 | −0.231640 |
| 1110100 | −0.751918 | −0.674743 |
| 1110101 | −0.679577 | −0.745095 |
| 1110110 | −1.248964 | −0.961337 |
| 1110111 | −1.793509 | −0.444665 |
| 1111000 | −0.178513 | −0.836678 |
| 1111001 | −0.146379 | −1.017268 |
| 1111010 | −0.280870 | −1.717180 |
| 1111011 | −0.220033 | −1.321346 |
| 1111100 | −0.371932 | −0.779634 |
| 1111101 | −0.467467 | −0.944880 |
| 1111110 | −0.933089 | −1.379959 |
| 1111111 | −0.606172 | −1.218326 |

TABLE 20B

| COORDINATE BITS | SYMBOL X | SYMBOL Y |
|---|---|---|
| 0000000 | 0.779391 | 0.338303 |
| 0000001 | 0.705151 | 0.165321 |
| 0000010 | 0.392817 | 0.073826 |
| 0000011 | 0.566840 | 0.098610 |
| 0000100 | 0.591096 | 0.495628 |
| 0000101 | 0.506207 | 0.386704 |
| 0000110 | 0.333309 | 0.129562 |
| 0000111 | 0.431485 | 0.259293 |
| 0001000 | 0.133150 | 0.720478 |
| 0001001 | 0.112303 | 0.521489 |
| 0001010 | 0.088988 | 0.094762 |
| 0001011 | 0.084578 | 0.331907 |
| 0001100 | 0.369721 | 0.688796 |
| 0001101 | 0.245135 | 0.489948 |
| 0001110 | 0.173144 | 0.142180 |
| 0001111 | 0.187579 | 0.326278 |
| 0010000 | 0.960305 | 0.408119 |
| 0010001 | 1.024151 | 0.117108 |
| 0010010 | 1.193232 | 0.494688 |
| 0010011 | 1.308642 | 0.184615 |
| 0010100 | 0.755084 | 0.676471 |
| 0010101 | 0.815391 | 0.852249 |
| 0010110 | 1.225372 | 0.896021 |
| 0010111 | 1.673595 | 0.351190 |
| 0011000 | 0.153929 | 0.914118 |
| 0011001 | 0.210848 | 1.095014 |
| 0011010 | 0.311339 | 1.668426 |
| 0011011 | 0.184999 | 1.301075 |
| 0011100 | 0.468118 | 0.850595 |
| 0011101 | 0.563693 | 0.998855 |
| 0011110 | 0.958825 | 1.358356 |
| 0011111 | 0.578328 | 1.241114 |
| 0100000 | 0.779391 | −0.338303 |
| 0100001 | 0.705151 | −0.165321 |
| 0100010 | 0.392817 | −0.073826 |
| 0100011 | 0.566840 | −0.098610 |
| 0100100 | 0.591096 | −0.495628 |
| 0100101 | 0.506207 | −0.386704 |
| 0100110 | 0.333309 | −0.129562 |
| 0100111 | 0.431485 | −0.259293 |
| 0101000 | 0.133150 | −0.720478 |
| 0101001 | 0.112303 | −0.521489 |
| 0101010 | 0.088988 | −0.094762 |
| 0101011 | 0.084578 | −0.331907 |
| 0101100 | 0.369721 | −0.688796 |
| 0101101 | 0.245135 | −0.489948 |
| 0101110 | 0.173144 | −0.142180 |
| 0101111 | 0.187579 | −0.326278 |
| 0110000 | 0.960305 | −0.408119 |
| 0110001 | 1.024151 | −0.117108 |
| 0110010 | 1.193232 | −0.494688 |
| 0110011 | 1.308642 | −0.184615 |
| 0110100 | 0.755084 | −0.676471 |
| 0110101 | 0.815391 | −0.852249 |
| 0110110 | 1.225372 | −0.896021 |
| 0110111 | 1.673595 | −0.351190 |
| 0111000 | 0.153929 | −0.914118 |
| 0111001 | 0.210848 | −1.095014 |
| 0111010 | 0.311339 | −1.668426 |
| 0111011 | 0.184999 | −1.301075 |
| 0111100 | 0.468118 | −0.850595 |
| 0111101 | 0.563693 | −0.998855 |
| 0111110 | 0.958825 | −1.358356 |
| 0111111 | 0.578328 | −1.241114 |
| 1000000 | −0.779391 | 0.338303 |
| 1000001 | −0.705151 | 0.165321 |
| 1000010 | −0.392817 | 0.073826 |
| 1000011 | −0.566840 | 0.098610 |
| 1000100 | −0.591096 | 0.495628 |
| 1000101 | −0.506207 | 0.386704 |
| 1000110 | −0.333309 | 0.129562 |
| 1000111 | −0.431485 | 0.259293 |
| 1001000 | −0.133150 | 0.720478 |
| 1001001 | −0.112303 | 0.521489 |
| 1001010 | −0.088988 | 0.094762 |
| 1001011 | −0.084578 | 0.331907 |
| 1001100 | −0.369721 | 0.688796 |
| 1001101 | −0.245135 | 0.489948 |
| 1001110 | −0.173144 | 0.142180 |
| 1001111 | −0.187579 | 0.326278 |
| 1010000 | −0.960305 | 0.408119 |
| 1010001 | −1.024151 | 0.117108 |
| 1010010 | −1.193232 | 0.494688 |
| 1010011 | −1.308642 | 0.184615 |
| 1010100 | −0.755084 | 0.676471 |
| 1010101 | −0.815391 | 0.852249 |
| 1010110 | −1.225372 | 0.896021 |
| 1010111 | −1.673595 | 0.351190 |
| 1011000 | −0.153929 | 0.914118 |
| 1011001 | −0.210848 | 1.095014 |
| 1011010 | −0.311339 | 1.668426 |
| 1011011 | −0.184999 | 1.301075 |
| 1011100 | −0.468118 | 0.850595 |
| 1011101 | −0.563693 | 0.998855 |
| 1011110 | −0.958825 | 1.358356 |
| 1011111 | −0.578328 | 1.241114 |
| 1100000 | −0.779391 | −0.338303 |
| 1100001 | −0.705151 | −0.165321 |
| 1100010 | −0.392817 | −0.073826 |
| 1100011 | −0.566840 | −0.098610 |
| 1100100 | −0.591096 | −0.495628 |
| 1100101 | −0.506207 | −0.386704 |
| 1100110 | −0.333309 | −0.129562 |
| 1100111 | −0.431485 | −0.259293 |
| 1101000 | −0.133150 | −0.720478 |
| 1101001 | −0.112303 | −0.521489 |
| 1101010 | −0.088988 | −0.094762 |
| 1101011 | −0.084578 | −0.331907 |
| 1101100 | −0.369721 | −0.688796 |
| 1101101 | −0.245135 | −0.489948 |
| 1101110 | −0.173144 | −0.142180 |
| 1101111 | −0.187579 | −0.326278 |
| 1110000 | −0.960305 | −0.408119 |
| 1110001 | −1.024151 | −0.117108 |
| 1110010 | −1.193232 | −0.494688 |
| 1110011 | −1.308642 | −0.184615 |
| 1110100 | −0.755084 | −0.676471 |
| 1110101 | −0.815391 | −0.852249 |
| 1110110 | −1.225372 | −0.896021 |
| 1110111 | −1.673595 | −0.351190 |
| 1111000 | −0.153929 | −0.914118 |
| 1111001 | −0.210848 | −1.095014 |
| 1111010 | −0.311339 | −1.668426 |
| 1111011 | −0.184999 | −1.301075 |
| 1111100 | −0.468118 | −0.850595 |
| 1111101 | −0.563693 | −0.998855 |
| 1111110 | −0.958825 | −1.358356 |
| 1111111 | −0.578328 | −1.241114 |

TABLE 20C

| COORDINATE BITS | SYMBOL X | SYMBOL Y |
|---|---|---|
| 0000000 | 0.676205 | 0.590907 |
| 0000001 | 0.696016 | 0.362489 |
| 0000010 | 0.553277 | 0.064967 |
| 0000011 | 0.641368 | 0.195573 |
| 0000100 | 0.526012 | 0.596882 |
| 0000101 | 0.490563 | 0.432520 |
| 0000110 | 0.372395 | 0.089910 |
| 0000111 | 0.433984 | 0.256395 |
| 0001000 | 0.133129 | 0.680380 |
| 0001001 | 0.140357 | 0.511313 |
| 0001010 | 0.073689 | 0.113398 |
| 0001011 | 0.073957 | 0.342801 |
| 0001100 | 0.335239 | 0.697471 |
| 0001101 | 0.293873 | 0.462352 |

TABLE 20C-continued

| COORDINATE BITS | SYMBOL X | SYMBOL Y |
|---|---|---|
| 0001110 | 0.223478 | 0.122727 |
| 0001111 | 0.250692 | 0.291177 |
| 0010000 | 0.849307 | 0.605280 |
| 0010001 | 0.910806 | 0.371753 |
| 0010010 | 1.121469 | 0.096631 |
| 0010011 | 0.889883 | 0.100840 |
| 0010100 | 1.044658 | 0.689042 |
| 0010101 | 1.351312 | 0.747663 |
| 0010110 | 1.653554 | 0.212837 |
| 0010111 | 1.334308 | 0.348076 |
| 0011000 | 0.106020 | 0.847896 |
| 0011001 | 0.110430 | 1.108822 |
| 0011010 | 0.790965 | 1.102054 |
| 0011011 | 0.991785 | 1.277338 |
| 0011100 | 0.409035 | 0.918111 |
| 0011101 | 0.191275 | 1.371272 |
| 0011110 | 0.580772 | 1.045388 |
| 0011111 | 0.545581 | 1.581968 |
| 0100000 | 0.676205 | −0.590907 |
| 0100001 | 0.696016 | −0.362489 |
| 0100010 | 0.553277 | −0.064967 |
| 0100011 | 0.641368 | −0.195573 |
| 0100100 | 0.526012 | −0.596882 |
| 0100101 | 0.490563 | −0.432520 |
| 0100110 | 0.372395 | −0.089910 |
| 0100111 | 0.433984 | −0.256395 |
| 0101000 | 0.133129 | −0.680380 |
| 0101001 | 0.140357 | −0.511313 |
| 0101010 | 0.073689 | −0.113398 |
| 0101011 | 0.073957 | −0.342801 |
| 0101100 | 0.335239 | −0.697471 |
| 0101101 | 0.293873 | −0.462352 |
| 0101110 | 0.223478 | −0.122727 |
| 0101111 | 0.250692 | −0.291177 |
| 0110000 | 0.849307 | −0.605280 |
| 0110001 | 0.910806 | −0.371753 |
| 0110010 | 1.121469 | −0.096631 |
| 0110011 | 0.889883 | −0.100840 |
| 0110100 | 1.044658 | −0.689042 |
| 0110101 | 1.351312 | −0.747663 |
| 0110110 | 1.653554 | −0.212837 |
| 0110111 | 1.334308 | −0.348076 |
| 0111000 | 0.106020 | −0.847896 |
| 0111001 | 0.110430 | −1.108822 |
| 0111010 | 0.790965 | −1.102054 |
| 0111011 | 0.991785 | −1.277338 |
| 0111100 | 0.409035 | −0.918111 |
| 0111101 | 0.191275 | −1.371272 |
| 0111110 | 0.580772 | −1.045388 |
| 0111111 | 0.545581 | −1.581968 |
| 1000000 | −0.676205 | 0.590907 |
| 1000001 | −0.696016 | 0.362489 |
| 1000010 | −0.553277 | 0.064967 |
| 1000011 | −0.641368 | 0.195573 |
| 1000100 | −0.526012 | 0.596882 |
| 1000101 | −0.490563 | 0.432520 |
| 1000110 | −0.372395 | 0.089910 |
| 1000111 | −0.433984 | 0.256395 |
| 1001000 | −0.133129 | 0.680380 |
| 1001001 | −0.140357 | 0.511313 |
| 1001010 | −0.073689 | 0.113398 |
| 1001011 | −0.073957 | 0.342801 |
| 1001100 | −0.335239 | 0.697471 |
| 1001101 | −0.293873 | 0.462352 |
| 1001110 | −0.223478 | 0.122727 |
| 1001111 | −0.250692 | 0.291177 |
| 1010000 | −0.849307 | 0.605280 |
| 1010001 | −0.910806 | 0.371753 |
| 1010010 | −1.121469 | 0.096631 |
| 1010011 | −0.889883 | 0.100840 |
| 1010100 | −1.044658 | 0.689042 |
| 1010101 | −1.351312 | 0.747663 |
| 1010110 | −1.653554 | 0.212837 |
| 1010111 | −1.334308 | 0.348076 |
| 1011000 | −0.106020 | 0.847896 |
| 1011001 | −0.110430 | 1.108822 |
| 1011010 | −0.790965 | 1.102054 |
| 1011011 | −0.991785 | 1.277338 |
| 1011100 | −0.409035 | 0.918111 |
| 1011101 | −0.191275 | 1.371272 |
| 1011110 | −0.580772 | 1.045388 |
| 1011111 | −0.545581 | 1.581968 |
| 1100000 | −0.676205 | −0.590907 |
| 1100001 | −0.696016 | −0.362489 |
| 1100010 | −0.553277 | −0.064967 |
| 1100011 | −0.641368 | −0.195573 |
| 1100100 | −0.526012 | −0.596882 |
| 1100101 | −0.490563 | −0.432520 |
| 1100110 | −0.372395 | −0.089910 |
| 1100111 | −0.433984 | −0.256395 |
| 1101000 | −0.133129 | −0.680380 |
| 1101001 | −0.140357 | −0.511313 |
| 1101010 | −0.073689 | −0.113398 |
| 1101011 | −0.073957 | −0.342801 |
| 1101100 | −0.335239 | −0.697471 |
| 1101101 | −0.293873 | −0.462352 |
| 1101110 | −0.223478 | −0.122727 |
| 1101111 | −0.250692 | −0.291177 |
| 1110000 | −0.849307 | −0.605280 |
| 1110001 | −0.910806 | −0.371753 |
| 1110010 | −1.121469 | −0.096631 |
| 1110011 | −0.889883 | −0.100840 |
| 1110100 | −1.044658 | −0.689042 |
| 1110101 | −1.351312 | −0.747663 |
| 1110110 | −1.653554 | −0.212837 |
| 1110111 | −1.334308 | −0.348076 |
| 1111000 | −0.106020 | −0.847896 |
| 1111001 | −0.110430 | −1.108822 |
| 1111010 | −0.790965 | −1.102054 |
| 1111011 | −0.991785 | −1.277338 |
| 1111100 | −0.409035 | −0.918111 |
| 1111101 | −0.191275 | −1.371272 |
| 1111110 | −0.580772 | −1.045388 |
| 1111111 | −0.545581 | −1.581968 |

TABLE 20D

| COORDINATE BITS | SYMBOL X | SYMBOL Y |
|---|---|---|
| 0000000 | 0.752060 | 0.302196 |
| 0000001 | 0.788983 | 0.113122 |
| 0000010 | 0.325356 | 0.054462 |
| 0000011 | 0.573961 | 0.098934 |
| 0000100 | 0.579122 | 0.497202 |
| 0000101 | 0.471776 | 0.396048 |
| 0000110 | 0.294917 | 0.133438 |
| 0000111 | 0.433938 | 0.245088 |
| 0001000 | 0.132847 | 0.742015 |
| 0001001 | 0.122253 | 0.604949 |
| 0001010 | 0.068657 | 0.075472 |
| 0001011 | 0.060983 | 0.445207 |
| 0001100 | 0.382346 | 0.652673 |
| 0001101 | 0.302064 | 0.494450 |
| 0001110 | 0.166497 | 0.233502 |
| 0001111 | 0.196116 | 0.340897 |
| 0010000 | 0.907567 | 0.452354 |
| 0010001 | 1.043922 | 0.158157 |
| 0010010 | 1.130081 | 0.548716 |
| 0010011 | 1.320594 | 0.181413 |
| 0010100 | 0.712483 | 0.646623 |
| 0010101 | 0.815526 | 0.865815 |
| 0010110 | 1.157076 | 0.928991 |
| 0010111 | 1.532471 | 0.508968 |
| 0011000 | 0.120519 | 0.915797 |
| 0011001 | 0.148259 | 1.123784 |
| 0011010 | 0.282652 | 1.690100 |
| 0011011 | 0.221465 | 1.387236 |

TABLE 20D-continued

| COORDINATE BITS | SYMBOL X | SYMBOL Y |
|---|---|---|
| 0011100 | 0.423824 | 0.821654 |
| 0011101 | 0.488704 | 1.037583 |
| 0011110 | 0.872546 | 1.413810 |
| 0011111 | 0.675009 | 1.247576 |
| 0100000 | 0.752060 | −0.302196 |
| 0100001 | 0.788983 | −0.113122 |
| 0100010 | 0.325356 | −0.054462 |
| 0100011 | 0.573961 | −0.098934 |
| 0100100 | 0.579122 | −0.497202 |
| 0100101 | 0.471776 | −0.396048 |
| 0100110 | 0.294917 | −0.133438 |
| 0100111 | 0.433938 | −0.245088 |
| 0101000 | 0.132847 | −0.742015 |
| 0101001 | 0.122253 | −0.604949 |
| 0101010 | 0.068657 | −0.075472 |
| 0101011 | 0.060983 | −0.445207 |
| 0101100 | 0.382346 | −0.652673 |
| 0101101 | 0.302064 | −0.494450 |
| 0101110 | 0.166497 | −0.233502 |
| 0101111 | 0.196116 | −0.340897 |
| 0110000 | 0.907567 | −0.452354 |
| 0110001 | 1.043922 | −0.158157 |
| 0110010 | 1.130081 | −0.548716 |
| 0110011 | 1.320594 | −0.181413 |
| 0110100 | 0.712483 | −0.646623 |
| 0110101 | 0.815526 | −0.865815 |
| 0110110 | 1.157076 | −0.928991 |
| 0110111 | 1.532471 | −0.508968 |
| 0111000 | 0.120519 | −0.915797 |
| 0111001 | 0.148259 | −1.123784 |
| 0111010 | 0.282652 | −1.690100 |
| 0111011 | 0.221465 | −1.387236 |
| 0111100 | 0.423824 | −0.821654 |
| 0111101 | 0.488704 | −1.037583 |
| 0111110 | 0.872546 | −1.413810 |
| 0111111 | 0.675009 | −1.247576 |
| 1000000 | −0.752060 | 0.302196 |
| 1000001 | −0.788983 | 0.113122 |
| 1000010 | −0.325356 | 0.054462 |
| 1000011 | −0.573961 | 0.098934 |
| 1000100 | −0.579122 | 0.497202 |
| 1000101 | −0.471776 | 0.396048 |
| 1000110 | −0.294917 | 0.133438 |
| 1000111 | −0.433938 | 0.245088 |
| 1001000 | −0.132847 | 0.742015 |
| 1001001 | −0.122253 | 0.604949 |
| 1001010 | −0.068657 | 0.075472 |
| 1001011 | −0.060983 | 0.445207 |
| 1001100 | −0.382346 | 0.652673 |
| 1001101 | −0.302064 | 0.494450 |
| 1001110 | −0.166497 | 0.233502 |
| 1001111 | −0.196116 | 0.340897 |
| 1010000 | −0.907567 | 0.452354 |
| 1010001 | −1.043922 | 0.158157 |
| 1010010 | −1.130081 | 0.548716 |
| 1010011 | −1.320594 | 0.181413 |
| 1010100 | −0.712483 | 0.646623 |
| 1010101 | −0.815526 | 0.865815 |
| 1010110 | −1.157076 | 0.928991 |
| 1010111 | −1.532471 | 0.508968 |
| 1011000 | −0.120519 | 0.915797 |
| 1011001 | −0.148259 | 1.123784 |
| 1011010 | −0.282652 | 1.690100 |
| 1011011 | −0.221465 | 1.387236 |
| 1011100 | −0.423824 | 0.821654 |
| 1011101 | −0.488704 | 1.037583 |
| 1011110 | −0.872546 | 1.413810 |
| 1011111 | −0.675009 | 1.247576 |
| 1100000 | −0.752060 | −0.302196 |
| 1100001 | −0.788983 | −0.113122 |
| 1100010 | −0.325356 | −0.054462 |
| 1100011 | −0.573961 | −0.098934 |
| 1100100 | −0.579122 | −0.497202 |
| 1100101 | −0.471776 | −0.396048 |
| 1100110 | −0.294917 | −0.133438 |
| 1100111 | −0.433938 | −0.245088 |
| 1101000 | −0.132847 | −0.742015 |
| 1101001 | −0.122253 | −0.604949 |
| 1101010 | −0.068657 | −0.075472 |
| 1101011 | −0.060983 | −0.445207 |
| 1101100 | −0.382346 | −0.652673 |
| 1101101 | −0.302064 | −0.494450 |
| 1101110 | −0.166497 | −0.233502 |
| 1101111 | −0.196116 | −0.340897 |
| 1110000 | −0.907567 | −0.452354 |
| 1110001 | −1.043922 | −0.158157 |
| 1110010 | −1.130081 | −0.548716 |
| 1110011 | −1.320594 | −0.181413 |
| 1110100 | −0.712483 | −0.646623 |
| 1110101 | −0.815526 | −0.865815 |
| 1110110 | −1.157076 | −0.928991 |
| 1110111 | −1.532471 | −0.508968 |
| 1111000 | −0.120519 | −0.915797 |
| 1111001 | −0.148259 | −1.123784 |
| 1111010 | −0.282652 | −1.690100 |
| 1111011 | −0.221465 | −1.387236 |
| 1111100 | −0.423824 | −0.821654 |
| 1111101 | −0.488704 | −1.037583 |
| 1111110 | −0.872546 | −1.413810 |
| 1111111 | −0.675009 | −1.247576 |

TABLE 21A

| COORDINATE BITS | SYMBOL X | SYMBOL Y |
|---|---|---|
| 00000000 | 1.443706 | 0.533189 |
| 00000001 | 1.269957 | 0.814447 |
| 00000010 | 1.190815 | 0.494955 |
| 00000011 | 1.099458 | 0.637493 |
| 00000100 | 1.465098 | 0.242389 |
| 00000101 | 0.756113 | 0.035702 |
| 00000110 | 1.757959 | 0.251458 |
| 00000111 | 0.780617 | 0.113362 |
| 00001000 | 1.032269 | 1.540287 |
| 00001001 | 1.450983 | 1.025801 |
| 00001010 | 1.044843 | 0.407507 |
| 00001011 | 0.920903 | 0.474471 |
| 00001100 | 1.061180 | 0.094137 |
| 00001101 | 0.942993 | 0.109431 |
| 00001110 | 1.146865 | 0.181476 |
| 00001111 | 0.863666 | 0.236933 |
| 00010000 | 1.028531 | 1.046265 |
| 00010001 | 0.903477 | 0.907951 |
| 00010010 | 0.580224 | 0.575049 |
| 00010011 | 0.741607 | 0.728471 |
| 00010100 | 0.418728 | 0.083169 |
| 00010101 | 0.537914 | 0.122315 |
| 00010110 | 0.581523 | 0.384883 |
| 00010111 | 0.655016 | 0.231039 |
| 00011000 | 0.844978 | 1.282582 |
| 00011001 | 0.713419 | 0.974473 |
| 00011010 | 0.662139 | 0.570492 |
| 00011011 | 0.764324 | 0.614172 |
| 00011100 | 0.401000 | 0.062964 |
| 00011101 | 0.510837 | 0.125696 |
| 00011110 | 0.576609 | 0.374709 |
| 00011111 | 0.692682 | 0.292587 |
| 00100000 | 0.276792 | 1.794144 |
| 00100001 | 0.158046 | 1.018387 |
| 00100010 | 0.104813 | 0.702356 |
| 00100011 | 0.124613 | 0.885016 |
| 00100100 | 0.110294 | 0.045410 |
| 00100101 | 0.068892 | 0.234221 |
| 00100110 | 0.112344 | 0.534452 |
| 00100111 | 0.089452 | 0.398340 |
| 00101000 | 0.132300 | 1.285556 |
| 00101001 | 0.180106 | 1.107457 |

TABLE 21A-continued

| COORDINATE BITS | SYMBOL X | SYMBOL Y |
|---|---|---|
| 00101010 | 0.190850 | 0.723373 |
| 00101011 | 0.170166 | 0.861137 |
| 00101100 | 0.088520 | 0.064328 |
| 00101101 | 0.063584 | 0.193067 |
| 00101110 | 0.118919 | 0.539605 |
| 00101111 | 0.097923 | 0.408426 |
| 00110000 | 0.215811 | 1.558150 |
| 00110001 | 0.404454 | 1.021596 |
| 00110010 | 0.411119 | 0.597529 |
| 00110011 | 0.429107 | 0.835089 |
| 00110100 | 0.269636 | 0.105598 |
| 00110101 | 0.260922 | 0.234821 |
| 00110110 | 0.375258 | 0.455253 |
| 00110111 | 0.242072 | 0.352853 |
| 00111000 | 0.498501 | 1.328103 |
| 00111001 | 0.496854 | 1.034589 |
| 00111010 | 0.351667 | 0.652324 |
| 00111011 | 0.454845 | 0.854758 |
| 00111100 | 0.278962 | 0.076488 |
| 00111101 | 0.267573 | 0.245109 |
| 00111110 | 0.374077 | 0.452024 |
| 00111111 | 0.248176 | 0.363324 |
| 01000000 | 1.443706 | −0.533189 |
| 01000001 | 1.269957 | −0.814447 |
| 01000010 | 1.190815 | −0.494955 |
| 01000011 | 1.099458 | −0.637493 |
| 01000100 | 1.465098 | −0.242389 |
| 01000101 | 0.756113 | −0.035702 |
| 01000110 | 1.757959 | −0.251458 |
| 01000111 | 0.780617 | −0.113362 |
| 01001000 | 1.032269 | −1.540287 |
| 01001001 | 1.450983 | −1.025801 |
| 01001010 | 1.044843 | −0.407507 |
| 01001011 | 0.920903 | −0.474471 |
| 01001100 | 1.061180 | −0.094137 |
| 01001101 | 0.942993 | −0.109431 |
| 01001110 | 1.146865 | −0.181476 |
| 01001111 | 0.863666 | −0.236933 |
| 01010000 | 1.028531 | −1.046265 |
| 01010001 | 0.903477 | −0.907951 |
| 01010010 | 0.580224 | −0.575049 |
| 01010011 | 0.741607 | −0.728471 |
| 01010100 | 0.418728 | −0.083169 |
| 01010101 | 0.537914 | −0.122315 |
| 01010110 | 0.581523 | −0.384883 |
| 01010111 | 0.655016 | −0.231039 |
| 01011000 | 0.844978 | −1.282582 |
| 01011001 | 0.713419 | −0.974473 |
| 01011010 | 0.662139 | −0.570492 |
| 01011011 | 0.764324 | −0.614172 |
| 01011100 | 0.401000 | −0.062964 |
| 01011101 | 0.510837 | −0.125696 |
| 01011110 | 0.576609 | −0.374709 |
| 01011111 | 0.692682 | −0.292587 |
| 01100000 | 0.276792 | −1.794144 |
| 01100001 | 0.158046 | −1.018387 |
| 01100010 | 0.104813 | −0.702356 |
| 01100011 | 0.124613 | −0.885016 |
| 01100100 | 0.110294 | −0.045410 |
| 01100101 | 0.068892 | −0.234221 |
| 01100110 | 0.112344 | −0.534452 |
| 01100111 | 0.089452 | −0.398340 |
| 01101000 | 0.132300 | −1.285556 |
| 01101001 | 0.180106 | −1.107457 |
| 01101010 | 0.190850 | −0.723373 |
| 01101011 | 0.170166 | −0.861137 |
| 01101100 | 0.088520 | −0.064328 |
| 01101101 | 0.063584 | −0.193067 |
| 01101110 | 0.118919 | −0.539605 |
| 01101111 | 0.097923 | −0.408426 |
| 01110000 | 0.215811 | −1.558150 |
| 01110001 | 0.404454 | −1.021596 |
| 01110010 | 0.411119 | −0.597529 |
| 01110011 | 0.429107 | −0.835089 |
| 01110100 | 0.269636 | −0.105598 |
| 01110101 | 0.260922 | −0.234821 |
| 01110110 | 0.375258 | −0.455253 |
| 01110111 | 0.242072 | −0.352853 |
| 01111000 | 0.498501 | −1.328103 |
| 01111001 | 0.496854 | −1.034589 |
| 01111010 | 0.351667 | −0.652324 |
| 01111011 | 0.454845 | −0.854758 |
| 01111100 | 0.278962 | −0.076488 |
| 01111101 | 0.267573 | −0.245109 |
| 01111110 | 0.374077 | −0.452024 |
| 01111111 | 0.248176 | −0.363324 |
| 10000000 | −1.443706 | 0.533189 |
| 10000001 | −1.269957 | 0.814447 |
| 10000010 | −1.190815 | 0.494955 |
| 10000011 | −1.099458 | 0.637493 |
| 10000100 | −1.465098 | 0.242389 |
| 10000101 | −0.756113 | 0.035702 |
| 10000110 | −1.757959 | 0.251458 |
| 10000111 | −0.780617 | 0.113362 |
| 10001000 | −1.032269 | 1.540287 |
| 10001001 | −1.450983 | 1.025801 |
| 10001010 | −1.044843 | 0.407507 |
| 10001011 | −0.920903 | 0.474471 |
| 10001100 | −1.061180 | 0.094137 |
| 10001101 | −0.942993 | 0.109431 |
| 10001110 | −1.146865 | 0.181476 |
| 10001111 | −0.863666 | 0.236933 |
| 10010000 | −1.028531 | 1.046265 |
| 10010001 | −0.903477 | 0.907951 |
| 10010010 | −0.580224 | 0.575049 |
| 10010011 | −0.741607 | 0.728471 |
| 10010100 | −0.418728 | 0.083169 |
| 10010101 | −0.537914 | 0.122315 |
| 10010110 | −0.581523 | 0.384883 |
| 10010111 | −0.655016 | 0.231039 |
| 10011000 | −0.844978 | 1.282582 |
| 10011001 | −0.713419 | 0.974473 |
| 10011010 | −0.662139 | 0.570492 |
| 10011011 | −0.764324 | 0.614172 |
| 10011100 | −0.401000 | 0.062964 |
| 10011101 | −0.510837 | 0.125696 |
| 10011110 | −0.576609 | 0.374709 |
| 10011111 | −0.692682 | 0.292587 |
| 10100000 | −0.276792 | 1.794144 |
| 10100001 | −0.158046 | 1.018387 |
| 10100010 | −0.104813 | 0.702356 |
| 10100011 | −0.124613 | 0.885016 |
| 10100100 | −0.110294 | 0.045410 |
| 10100101 | −0.068892 | 0.234221 |
| 10100110 | −0.112344 | 0.534452 |
| 10100111 | −0.089452 | 0.398340 |
| 10101000 | −0.132300 | 1.285556 |
| 10101001 | −0.180106 | 1.107457 |
| 10101010 | −0.190850 | 0.723373 |
| 10101011 | −0.170166 | 0.861137 |
| 10101100 | −0.088520 | 0.064328 |
| 10101101 | −0.063584 | 0.193067 |
| 10101110 | −0.118919 | 0.539605 |
| 10101111 | −0.097923 | 0.408426 |
| 10110000 | −0.215811 | 1.558150 |
| 10110001 | −0.404454 | 1.021596 |
| 10110010 | −0.411119 | 0.597529 |
| 10110011 | −0.429107 | 0.835089 |
| 10110100 | −0.269636 | 0.105598 |
| 10110101 | −0.260922 | 0.234821 |
| 10110110 | −0.375258 | 0.455253 |
| 10110111 | −0.242072 | 0.352853 |
| 10111000 | −0.498501 | 1.328103 |
| 10111001 | −0.496854 | 1.034589 |
| 10111010 | −0.351667 | 0.652324 |
| 10111011 | −0.454845 | 0.854758 |
| 10111100 | −0.278962 | 0.076488 |
| 10111101 | −0.267573 | 0.245109 |
| 10111110 | −0.374077 | 0.452024 |
| 10111111 | −0.248176 | 0.363324 |
| 11000000 | −1.443706 | −0.533189 |
| 11000001 | −1.269957 | −0.814447 |

TABLE 21A-continued

| COORDINATE BITS | SYMBOL X | SYMBOL Y |
|---|---|---|
| 11000010 | −1.190815 | −0.494955 |
| 11000011 | −1.099458 | −0.637493 |
| 11000100 | −1.465098 | −0.242389 |
| 11000101 | −0.756113 | −0.035702 |
| 11000110 | −1.757959 | −0.251458 |
| 11000111 | −0.780617 | −0.113362 |
| 11001000 | −1.032269 | −1.540287 |
| 11001001 | −1.450983 | −1.025801 |
| 11001010 | −1.044843 | −0.407507 |
| 11001011 | −0.920903 | −0.474471 |
| 11001100 | −1.061180 | −0.094137 |
| 11001101 | −0.942993 | −0.109431 |
| 11001110 | −1.146865 | −0.181476 |
| 11001111 | −0.863666 | −0.236933 |
| 11010000 | −1.028531 | −1.046265 |
| 11010001 | −0.903477 | −0.907951 |
| 11010010 | −0.580224 | −0.575049 |
| 11010011 | −0.741607 | −0.728471 |
| 11010100 | −0.418728 | −0.083169 |
| 11010101 | −0.537914 | −0.122315 |
| 11010110 | −0.581523 | −0.384883 |
| 11010111 | −0.655016 | −0.231039 |
| 11011000 | −0.844978 | −1.282582 |
| 11011001 | −0.713419 | −0.974473 |
| 11011010 | −0.662139 | −0.570492 |
| 11011011 | −0.764324 | −0.614172 |
| 11011100 | −0.401000 | −0.062964 |
| 11011101 | −0.510837 | −0.125696 |
| 11011110 | −0.576609 | −0.374709 |
| 11011111 | −0.692682 | −0.292587 |
| 11100000 | −0.276792 | −1.794144 |
| 11100001 | −0.158046 | −1.018387 |
| 11100010 | −0.104813 | −0.702356 |
| 11100011 | −0.124613 | −0.885016 |
| 11100100 | −0.110294 | −0.045410 |
| 11100101 | −0.068892 | −0.234221 |
| 11100110 | −0.112344 | −0.534452 |
| 11100111 | −0.089452 | −0.398340 |
| 11101000 | −0.132300 | −1.285556 |
| 11101001 | −0.180106 | −1.107457 |
| 11101010 | −0.190850 | −0.723373 |
| 11101011 | −0.170166 | −0.861137 |
| 11101100 | −0.088520 | −0.064328 |
| 11101101 | −0.063584 | −0.193067 |
| 11101110 | −0.118919 | −0.539605 |
| 11101111 | −0.097923 | −0.408426 |
| 11110000 | −0.215811 | −1.558150 |
| 11110001 | −0.404454 | −1.021596 |
| 11110010 | −0.411119 | −0.597529 |
| 11110011 | −0.429107 | −0.835089 |
| 11110100 | −0.269636 | −0.105598 |
| 11110101 | −0.260922 | −0.234821 |
| 11110110 | −0.375258 | −0.455253 |
| 11110111 | −0.242072 | −0.352853 |
| 11111000 | −0.498501 | −1.328103 |
| 11111001 | −0.496854 | −1.034589 |
| 11111010 | −0.351667 | −0.652324 |
| 11111011 | −0.454845 | −0.854758 |
| 11111100 | −0.278962 | −0.076488 |
| 11111101 | −0.267573 | −0.245109 |
| 11111110 | −0.374077 | −0.452024 |
| 11111111 | −0.248176 | −0.363324 |

TABLE 21B

| COORDINATE BITS | SYMBOL X | SYMBOL Y |
|---|---|---|
| 00000000 | 0.975369 | 1.374032 |
| 00000001 | 1.481139 | 0.719889 |
| 00000010 | 1.218020 | 0.537432 |
| 00000011 | 1.572273 | 1.013574 |
| 00000100 | 1.187472 | 0.140021 |
| 00000101 | 1.528894 | 0.437163 |
| 00000110 | 1.209428 | 0.325388 |
| 00000111 | 1.451803 | 0.133447 |
| 00001000 | 1.150324 | 0.991883 |
| 00001001 | 0.920560 | 1.027887 |
| 00001010 | 1.130859 | 0.690274 |
| 00001011 | 0.935148 | 0.791094 |
| 00001100 | 1.046905 | 0.109020 |
| 00001101 | 0.905564 | 0.126090 |
| 00001110 | 0.986845 | 0.392801 |
| 00001111 | 0.888567 | 0.278893 |
| 00010000 | 0.311629 | 1.734362 |
| 00010001 | 0.529664 | 1.037246 |
| 00010010 | 0.623019 | 0.619800 |
| 00010011 | 0.545408 | 0.794517 |
| 00010100 | 0.590997 | 0.100302 |
| 00010101 | 0.593410 | 0.246925 |
| 00010110 | 0.607152 | 0.477790 |
| 00010111 | 0.629036 | 0.343531 |
| 00011000 | 0.563423 | 1.365187 |
| 00011001 | 0.710907 | 1.103897 |
| 00011010 | 0.763953 | 0.637666 |
| 00011011 | 0.728679 | 0.837901 |
| 00011100 | 0.699119 | 0.052387 |
| 00011101 | 0.778520 | 0.167574 |
| 00011110 | 0.841139 | 0.487476 |
| 00011111 | 0.768298 | 0.365852 |
| 00100000 | 0.127333 | 1.155716 |
| 00100001 | 0.307801 | 1.071269 |
| 00100010 | 0.054226 | 0.569000 |
| 00100011 | 0.045338 | 0.681811 |
| 00100100 | 0.028860 | 0.067281 |
| 00100101 | 0.073608 | 0.181658 |
| 00100110 | 0.036820 | 0.425876 |
| 00100111 | 0.052368 | 0.277893 |
| 00101000 | 0.043419 | 0.999378 |
| 00101001 | 0.134293 | 0.871130 |
| 00101010 | 0.167741 | 0.582866 |
| 00101011 | 0.144323 | 0.745869 |
| 00101100 | 0.216884 | 0.055250 |
| 00101101 | 0.186854 | 0.164842 |
| 00101110 | 0.160698 | 0.411437 |
| 00101111 | 0.184735 | 0.310456 |
| 00110000 | 0.173083 | 1.310422 |
| 00110001 | 0.373110 | 0.990945 |
| 00110010 | 0.442036 | 0.572513 |
| 00110011 | 0.450171 | 0.761992 |
| 00110100 | 0.448273 | 0.078434 |
| 00110101 | 0.429733 | 0.223957 |
| 00110110 | 0.433525 | 0.483009 |
| 00110111 | 0.442487 | 0.351997 |
| 00111000 | 0.234057 | 1.493126 |
| 00111001 | 0.245349 | 0.871117 |
| 00111010 | 0.278032 | 0.601780 |
| 00111011 | 0.299117 | 0.752566 |
| 00111100 | 0.343828 | 0.049983 |
| 00111101 | 0.307660 | 0.197631 |
| 00111110 | 0.256888 | 0.459299 |
| 00111111 | 0.301477 | 0.340566 |
| 01000000 | 0.975369 | −1.374032 |
| 01000001 | 1.481139 | −0.719889 |
| 01000010 | 1.218020 | −0.537432 |
| 01000011 | 1.572273 | −1.013574 |
| 01000100 | 1.187472 | −0.140021 |
| 01000101 | 1.528894 | −0.437163 |
| 01000110 | 1.209428 | −0.325388 |
| 01000111 | 1.451803 | −0.133447 |
| 01001000 | 1.150324 | −0.991883 |
| 01001001 | 0.920560 | −1.027887 |
| 01001010 | 1.130859 | −0.690274 |
| 01001011 | 0.935148 | −0.791094 |
| 01001100 | 1.046905 | −0.109020 |
| 01001101 | 0.905564 | −0.126090 |
| 01001110 | 0.986845 | −0.392801 |
| 01001111 | 0.888567 | −0.278893 |

TABLE 21B-continued

| COORDINATE BITS | SYMBOL X | SYMBOL Y |
|---|---|---|
| 01010000 | 0.311973 | −1.734362 |
| 01010001 | 0.529664 | −1.037246 |
| 01010010 | 0.623019 | −0.619800 |
| 01010011 | 0.545408 | −0.794517 |
| 01010100 | 0.590997 | −0.100302 |
| 01010101 | 0.593410 | −0.246925 |
| 01010110 | 0.607152 | −0.477790 |
| 01010111 | 0.629036 | −0.343531 |
| 01011000 | 0.563423 | −1.365187 |
| 01011001 | 0.710907 | −1.103897 |
| 01011010 | 0.763953 | −0.637666 |
| 01011011 | 0.728679 | −0.837901 |
| 01011100 | 0.699119 | −0.052387 |
| 01011101 | 0.778520 | −0.167574 |
| 01011110 | 0.841139 | −0.487476 |
| 01011111 | 0.768298 | −0.365852 |
| 01100000 | 0.127333 | −1.155716 |
| 01100001 | 0.307801 | −1.071269 |
| 01100010 | 0.054226 | −0.569000 |
| 01100011 | 0.045338 | −0.681811 |
| 01100100 | 0.028860 | −0.067281 |
| 01100101 | 0.073608 | −0.181658 |
| 01100110 | 0.036820 | −0.425876 |
| 01100111 | 0.052368 | −0.277893 |
| 01101000 | 0.043419 | −0.999378 |
| 01101001 | 0.134293 | −0.871130 |
| 01101010 | 0.167741 | −0.582866 |
| 01101011 | 0.144323 | −0.745869 |
| 01101100 | 0.216884 | −0.055250 |
| 01101101 | 0.186854 | −0.164842 |
| 01101110 | 0.160698 | −0.411437 |
| 01101111 | 0.184735 | −0.310456 |
| 01110000 | 0.173083 | −1.310422 |
| 01110001 | 0.373110 | −0.990945 |
| 01110010 | 0.442036 | −0.572513 |
| 01110011 | 0.450171 | −0.761992 |
| 01110100 | 0.448273 | −0.078434 |
| 01110101 | 0.429733 | −0.223957 |
| 01110110 | 0.433525 | −0.483009 |
| 01110111 | 0.442487 | −0.351997 |
| 01111000 | 0.234057 | −1.493126 |
| 01111001 | 0.245349 | −0.871117 |
| 01111010 | 0.278032 | −0.601780 |
| 01111011 | 0.299117 | −0.752566 |
| 01111100 | 0.343828 | −0.049983 |
| 01111101 | 0.307660 | −0.197631 |
| 01111110 | 0.256888 | −0.459299 |
| 01111111 | 0.301477 | −0.340566 |
| 10000000 | −0.975369 | 1.374032 |
| 10000001 | −1.481139 | 0.719889 |
| 10000010 | −1.218020 | 0.537432 |
| 10000011 | −1.572273 | 1.013574 |
| 10000100 | −1.187472 | 0.140021 |
| 10000101 | −1.528894 | 0.437163 |
| 10000110 | −1.209428 | 0.325388 |
| 10000111 | −1.451803 | 0.133447 |
| 10001000 | −1.150324 | 0.991883 |
| 10001001 | −0.920560 | 1.027887 |
| 10001010 | −1.130859 | 0.690274 |
| 10001011 | −0.935148 | 0.791094 |
| 10001100 | −1.046905 | 0.109020 |
| 10001101 | −0.905564 | 0.126090 |
| 10001110 | −0.986845 | 0.392801 |
| 10001111 | −0.888567 | 0.278893 |
| 10010000 | −0.311973 | 1.734362 |
| 10010001 | −0.529664 | 1.037246 |
| 10010010 | −0.623019 | 0.619800 |
| 10010011 | −0.545408 | 0.794517 |
| 10010100 | −0.590997 | 0.100302 |
| 10010101 | −0.593410 | 0.246925 |
| 10010110 | −0.607152 | 0.477790 |
| 10010111 | −0.629036 | 0.343531 |
| 10011000 | −0.563423 | 1.365187 |
| 10011001 | −0.710907 | 1.103897 |
| 10011010 | −0.763953 | 0.637666 |
| 10011011 | −0.728679 | 0.837901 |
| 10011100 | −0.699119 | 0.052387 |
| 10011101 | −0.778520 | 0.167574 |
| 10011110 | −0.841139 | 0.487476 |
| 10011111 | −0.768298 | 0.365852 |
| 10100000 | −0.127333 | 1.155716 |
| 10100001 | −0.307801 | 1.071269 |
| 10100010 | −0.054226 | 0.569000 |
| 10100011 | −0.045338 | 0.681811 |
| 10100100 | −0.028860 | 0.067281 |
| 10100101 | −0.073608 | 0.181658 |
| 10100110 | −0.036820 | 0.425876 |
| 10100111 | −0.052368 | 0.277893 |
| 10101000 | −0.043419 | 0.999378 |
| 10101001 | −0.134293 | 0.871130 |
| 10101010 | −0.167741 | 0.582866 |
| 10101011 | −0.144323 | 0.745869 |
| 10101100 | −0.216884 | 0.055250 |
| 10101101 | −0.186854 | 0.164842 |
| 10101110 | −0.160698 | 0.411437 |
| 10101111 | −0.184735 | 0.310456 |
| 10110000 | −0.173083 | 1.310422 |
| 10110001 | −0.373110 | 0.990945 |
| 10110010 | −0.442036 | 0.572513 |
| 10110011 | −0.450171 | 0.761992 |
| 10110100 | −0.448273 | 0.078434 |
| 10110101 | −0.429733 | 0.223957 |
| 10110110 | −0.433525 | 0.483009 |
| 10110111 | −0.442487 | 0.351997 |
| 10111000 | −0.234057 | 1.493126 |
| 10111001 | −0.245349 | 0.871117 |
| 10111010 | −0.278032 | 0.601780 |
| 10111011 | −0.299117 | 0.752566 |
| 10111100 | −0.343828 | 0.049983 |
| 10111101 | −0.307660 | 0.197631 |
| 10111110 | −0.256888 | 0.459299 |
| 10111111 | −0.301477 | 0.340566 |
| 11000000 | −0.975369 | −1.374032 |
| 11000001 | −1.481139 | −0.719889 |
| 11000010 | −1.218020 | −0.537432 |
| 11000011 | −1.572273 | −1.013574 |
| 11000100 | −1.187472 | −0.140021 |
| 11000101 | −1.528894 | −0.437163 |
| 11000110 | −1.209428 | −0.325388 |
| 11000111 | −1.451803 | −0.133447 |
| 11001000 | −1.150324 | −0.991883 |
| 11001001 | −0.920560 | −1.027887 |
| 11001010 | −1.130859 | −0.690274 |
| 11001011 | −0.935148 | −0.791094 |
| 11001100 | −1.046905 | −0.109020 |
| 11001101 | −0.905564 | −0.126090 |
| 11001110 | −0.986845 | −0.392801 |
| 11001111 | −0.888567 | −0.278893 |
| 11010000 | −0.311973 | −1.734362 |
| 11010001 | −0.529664 | −1.037246 |
| 11010010 | −0.623019 | −0.619800 |
| 11010011 | −0.545408 | −0.794517 |
| 11010100 | −0.590997 | −0.100302 |
| 11010101 | −0.593410 | −0.246925 |
| 11010110 | −0.607152 | −0.477790 |
| 11010111 | −0.629036 | −0.343531 |
| 11011000 | −0.563423 | −1.365187 |
| 11011001 | −0.710907 | −1.103897 |
| 11011010 | −0.763953 | −0.637666 |
| 11011011 | −0.728679 | −0.837901 |
| 11011100 | −0.699119 | −0.052387 |
| 11011101 | −0.778520 | −0.167574 |
| 11011110 | −0.841139 | −0.487476 |
| 11011111 | −0.768298 | −0.365852 |
| 11100000 | −0.127333 | −1.155716 |
| 11100001 | −0.307801 | −1.071269 |
| 11100010 | −0.054226 | −0.569000 |
| 11100011 | −0.045338 | −0.681811 |
| 11100100 | −0.028860 | −0.067281 |
| 11100101 | −0.073608 | −0.181658 |
| 11100110 | −0.036820 | −0.425876 |
| 11100111 | −0.052368 | −0.277893 |

TABLE 21B-continued

| COORDINATE | SYMBOL | |
|---|---|---|
| BITS | X | Y |
| 11101000 | −0.043419 | −0.999378 |
| 11101001 | −0.134293 | −0.871130 |
| 11101010 | −0.167741 | −0.582866 |
| 11101011 | −0.144323 | −0.745869 |
| 11101100 | −0.216884 | −0.055250 |
| 11101101 | −0.186854 | −0.164842 |
| 11101110 | −0.160698 | −0.411437 |
| 11101111 | −0.184735 | −0.310456 |
| 11110000 | −0.173083 | −1.310422 |
| 11110001 | −0.373110 | −0.990945 |
| 11110010 | −0.442036 | −0.572513 |
| 11110011 | −0.450171 | −0.761992 |
| 11110100 | −0.448273 | −0.078434 |
| 11110101 | −0.429733 | −0.223957 |
| 11110110 | −0.433525 | −0.483009 |
| 11110111 | −0.442487 | −0.351997 |
| 11111000 | −0.234057 | −1.493126 |
| 11111001 | −0.245349 | −0.871117 |
| 11111010 | −0.278032 | −0.601780 |
| 11111011 | −0.299117 | −0.752566 |
| 11111100 | −0.343828 | −0.049983 |
| 11111101 | −0.307660 | −0.197631 |
| 11111110 | −0.256888 | −0.459299 |
| 11111111 | −0.301477 | −0.340566 |

TABLE 21C

| COORDINATE | SYMBOL | |
|---|---|---|
| BITS | X | Y |
| 00000000 | 1.305348 | 0.483686 |
| 00000001 | 1.385995 | 0.667682 |
| 00000010 | 1.079272 | 0.658809 |
| 00000011 | 0.952913 | 0.612614 |
| 00000100 | 1.407955 | 0.162208 |
| 00000101 | 0.743036 | 0.093077 |
| 00000110 | 1.664544 | 0.277796 |
| 00000111 | 0.700449 | 0.240646 |
| 00001000 | 1.057746 | 1.546204 |
| 00001001 | 1.364655 | 0.938592 |
| 00001010 | 1.159648 | 0.316961 |
| 00001011 | 0.982972 | 0.392157 |
| 00001100 | 0.953812 | 0.086185 |
| 00001101 | 0.865433 | 0.202042 |
| 00001110 | 1.125799 | 0.109188 |
| 00001111 | 0.884989 | 0.377701 |
| 00010000 | 0.998762 | 0.983475 |
| 00010001 | 0.752453 | 0.974676 |
| 00010010 | 0.441612 | 0.542222 |
| 00010011 | 0.762558 | 0.774613 |
| 00010100 | 0.542471 | 0.050180 |
| 00010101 | 0.566038 | 0.143317 |
| 00010110 | 0.540193 | 0.413002 |
| 00010111 | 0.564199 | 0.285899 |
| 00011000 | 0.861634 | 1.190812 |
| 00011001 | 0.496817 | 1.189830 |
| 00011010 | 0.530301 | 0.608420 |
| 00011011 | 0.692344 | 0.638263 |
| 00011100 | 0.415573 | 0.053395 |
| 00011101 | 0.452110 | 0.157963 |
| 00011110 | 0.613213 | 0.496838 |
| 00011111 | 0.742823 | 0.455828 |
| 00100000 | 0.299991 | 1.828537 |
| 00100001 | 0.234715 | 1.027308 |
| 00100010 | 0.101242 | 0.654205 |
| 00100011 | 0.216049 | 0.940458 |
| 00100100 | 0.149232 | 0.065752 |
| 00100101 | 0.079653 | 0.216567 |
| 00100110 | 0.103154 | 0.579257 |
| 00100111 | 0.075918 | 0.328242 |
| 00101000 | 0.253926 | 1.421727 |
| 00101001 | 0.068626 | 1.125115 |

TABLE 21C-continued

| COORDINATE | SYMBOL | |
|---|---|---|
| BITS | X | Y |
| 00101010 | 0.102520 | 0.767709 |
| 00101011 | 0.074965 | 0.884980 |
| 00101100 | 0.075988 | 0.053940 |
| 00101101 | 0.026120 | 0.146113 |
| 00101110 | 0.089699 | 0.491963 |
| 00101111 | 0.071658 | 0.412884 |
| 00110000 | 0.292967 | 1.624754 |
| 00110001 | 0.492228 | 1.002755 |
| 00110010 | 0.286607 | 0.646480 |
| 00110011 | 0.503324 | 0.866300 |
| 00110100 | 0.230317 | 0.127990 |
| 00110101 | 0.244364 | 0.221890 |
| 00110110 | 0.252236 | 0.527795 |
| 00110111 | 0.199080 | 0.311608 |
| 00111000 | 0.838132 | 1.415418 |
| 00111001 | 0.163432 | 1.243384 |
| 00111010 | 0.321389 | 0.731153 |
| 00111011 | 0.426149 | 0.802687 |
| 00111100 | 0.302291 | 0.076239 |
| 00111101 | 0.350515 | 0.224507 |
| 00111110 | 0.311265 | 0.430253 |
| 00111111 | 0.333302 | 0.349304 |
| 01000000 | 1.305348 | −0.483686 |
| 01000001 | 1.385995 | −0.667682 |
| 01000010 | 1.079272 | −0.658809 |
| 01000011 | 0.952913 | −0.612614 |
| 01000100 | 1.407955 | −0.162208 |
| 01000101 | 0.743036 | −0.093077 |
| 01000110 | 1.664544 | −0.277796 |
| 01000111 | 0.700449 | −0.240646 |
| 01001000 | 1.057746 | −1.546204 |
| 01001001 | 1.364655 | −0.938592 |
| 01001010 | 1.159648 | −0.316961 |
| 01001011 | 0.982972 | −0.392157 |
| 01001100 | 0.953812 | −0.086185 |
| 01001101 | 0.865433 | −0.202042 |
| 01001110 | 1.125799 | −0.109188 |
| 01001111 | 0.884989 | −0.377701 |
| 01010000 | 0.998762 | −0.983475 |
| 01010001 | 0.752453 | −0.974676 |
| 01010010 | 0.441612 | −0.542222 |
| 01010011 | 0.762558 | −0.774613 |
| 01010100 | 0.542471 | −0.050180 |
| 01010101 | 0.566038 | −0.143317 |
| 01010110 | 0.540193 | −0.413002 |
| 01010111 | 0.564199 | −0.285899 |
| 01011000 | 0.861634 | −1.190812 |
| 01011001 | 0.496817 | −1.189830 |
| 01011010 | 0.530301 | −0.608420 |
| 01011011 | 0.692344 | −0.638263 |
| 01011100 | 0.415573 | −0.053395 |
| 01011101 | 0.452110 | −0.157963 |
| 01011110 | 0.613213 | −0.496838 |
| 01011111 | 0.742823 | −0.455828 |
| 01100000 | 0.299991 | −1.828537 |
| 01100001 | 0.234715 | −1.027308 |
| 01100010 | 0.101242 | −0.654205 |
| 01100011 | 0.216049 | −0.940458 |
| 01100100 | 0.149232 | −0.065752 |
| 01100101 | 0.079653 | −0.216567 |
| 01100110 | 0.103154 | −0.579257 |
| 01100111 | 0.075918 | −0.328242 |
| 01101000 | 0.253926 | −1.421727 |
| 01101001 | 0.068626 | −1.125115 |
| 01101010 | 0.102520 | −0.767709 |
| 01101011 | 0.074965 | −0.884980 |
| 01101100 | 0.075988 | −0.053940 |
| 01101101 | 0.026120 | −0.146113 |
| 01101110 | 0.089699 | −0.491963 |
| 01101111 | 0.071658 | −0.412884 |
| 01110000 | 0.292967 | −1.624754 |
| 01110001 | 0.492228 | −1.002755 |
| 01110010 | 0.286607 | −0.646480 |
| 01110011 | 0.503324 | −0.866300 |
| 01110100 | 0.230317 | −0.127990 |
| 01110101 | 0.244364 | −0.221890 |

TABLE 21C-continued

| COORDINATE BITS | SYMBOL X | SYMBOL Y |
|---|---|---|
| 01110110 | 0.252236 | −0.527795 |
| 01110111 | 0.199080 | −0.311608 |
| 01111000 | 0.838132 | −1.415418 |
| 01111001 | 0.163432 | −1.243384 |
| 01111010 | 0.321389 | −0.731153 |
| 01111011 | 0.426149 | −0.802687 |
| 01111100 | 0.302291 | −0.076239 |
| 01111101 | 0.350515 | −0.224507 |
| 01111110 | 0.311265 | −0.430253 |
| 01111111 | 0.333302 | −0.349304 |
| 10000000 | −1.305348 | 0.483686 |
| 10000001 | −1.385995 | 0.667682 |
| 10000010 | −1.079272 | 0.658809 |
| 10000011 | −0.952913 | 0.612614 |
| 10000100 | −1.407955 | 0.162208 |
| 10000101 | −0.743036 | 0.093077 |
| 10000110 | −1.664544 | 0.277796 |
| 10000111 | −0.700449 | 0.240646 |
| 10001000 | −1.057746 | 1.546204 |
| 10001001 | −1.364655 | 0.938592 |
| 10001010 | −1.159648 | 0.316961 |
| 10001011 | −0.982972 | 0.392157 |
| 10001100 | −0.953812 | 0.086185 |
| 10001101 | −0.865433 | 0.202042 |
| 10001110 | −1.125799 | 0.109188 |
| 10001111 | −0.884989 | 0.377701 |
| 10010000 | −0.998762 | 0.983475 |
| 10010001 | −0.752453 | 0.974676 |
| 10010010 | −0.441612 | 0.542222 |
| 10010011 | −0.762558 | 0.774613 |
| 10010100 | −0.542471 | 0.050180 |
| 10010101 | −0.566038 | 0.143317 |
| 10010110 | −0.540193 | 0.413002 |
| 10010111 | −0.564199 | 0.285899 |
| 10011000 | −0.861634 | 1.190812 |
| 10011001 | −0.496817 | 1.189830 |
| 10011010 | −0.530301 | 0.608420 |
| 10011011 | −0.692344 | 0.638263 |
| 10011100 | −0.415573 | 0.053395 |
| 10011101 | −0.452110 | 0.157963 |
| 10011110 | −0.613213 | 0.496838 |
| 10011111 | −0.742823 | 0.455828 |
| 10100000 | −0.299991 | 1.828537 |
| 10100001 | −0.234715 | 1.027308 |
| 10100010 | −0.101242 | 0.654205 |
| 10100011 | −0.216049 | 0.940458 |
| 10100100 | −0.149232 | 0.065752 |
| 10100101 | −0.079653 | 0.216567 |
| 10100110 | −0.103154 | 0.579257 |
| 10100111 | −0.075918 | 0.328242 |
| 10101000 | −0.253926 | 1.421727 |
| 10101001 | −0.068626 | 1.125115 |
| 10101010 | −0.102520 | 0.767709 |
| 10101011 | −0.074965 | 0.884980 |
| 10101100 | −0.075988 | 0.053940 |
| 10101101 | −0.026120 | 0.146113 |
| 10101110 | −0.089699 | 0.491963 |
| 10101111 | −0.071658 | 0.412884 |
| 10110000 | −0.292967 | 1.624754 |
| 10110001 | −0.492228 | 1.002755 |
| 10110010 | −0.286607 | 0.646480 |
| 10110011 | −0.503324 | 0.866300 |
| 10110100 | −0.230317 | 0.127990 |
| 10110101 | −0.244364 | 0.221890 |
| 10110110 | −0.252236 | 0.527795 |
| 10110111 | −0.199080 | 0.311608 |
| 10111000 | −0.838132 | 1.415418 |
| 10111001 | −0.163432 | 1.243384 |
| 10111010 | −0.321389 | 0.731153 |
| 10111011 | −0.426149 | 0.802687 |
| 10111100 | −0.302291 | 0.076239 |
| 10111101 | −0.350515 | 0.224507 |
| 10111110 | −0.311265 | 0.430253 |
| 10111111 | −0.333302 | 0.349304 |
| 11000000 | −1.305348 | −0.483686 |
| 11000001 | −1.385995 | −0.667682 |
| 11000010 | −1.079272 | −0.658809 |
| 11000011 | −0.952913 | −0.612614 |
| 11000100 | −1.407955 | −0.162208 |
| 11000101 | −0.743036 | −0.093077 |
| 11000110 | −1.664544 | −0.277796 |
| 11000111 | −0.700449 | −0.240646 |
| 11001000 | −1.057746 | −1.546204 |
| 11001001 | −1.364655 | −0.938592 |
| 11001010 | −1.159648 | −0.316961 |
| 11001011 | −0.982972 | −0.392157 |
| 11001100 | −0.953812 | −0.086185 |
| 11001101 | −0.865433 | −0.202042 |
| 11001110 | −1.125799 | −0.109188 |
| 11001111 | −0.884989 | −0.377701 |
| 11010000 | −0.998762 | −0.983475 |
| 11010001 | −0.752453 | −0.974676 |
| 11010010 | −0.441612 | −0.542222 |
| 11010011 | −0.762558 | −0.774613 |
| 11010100 | −0.542471 | −0.050180 |
| 11010101 | −0.566038 | −0.143317 |
| 11010110 | −0.540193 | −0.413002 |
| 11010111 | −0.564199 | −0.285899 |
| 11011000 | −0.861634 | −1.190812 |
| 11011001 | −0.496817 | −1.189830 |
| 11011010 | −0.530301 | −0.608420 |
| 11011011 | −0.692344 | −0.638263 |
| 11011100 | −0.415573 | −0.053395 |
| 11011101 | −0.452110 | −0.157963 |
| 11011110 | −0.613213 | −0.496838 |
| 11011111 | −0.742823 | −0.455828 |
| 11100000 | −0.299991 | −1.828537 |
| 11100001 | −0.234715 | −1.027308 |
| 11100010 | −0.101242 | −0.654205 |
| 11100011 | −0.216049 | −0.940458 |
| 11100100 | −0.149232 | −0.065752 |
| 11100101 | −0.079653 | −0.216567 |
| 11100110 | −0.103154 | −0.579257 |
| 11100111 | −0.075918 | −0.328242 |
| 11101000 | −0.253926 | −1.421727 |
| 11101001 | −0.068626 | −1.125115 |
| 11101010 | −0.102520 | −0.767709 |
| 11101011 | −0.074965 | −0.884980 |
| 11101100 | −0.075988 | −0.053940 |
| 11101101 | −0.026120 | −0.146113 |
| 11101110 | −0.089699 | −0.491963 |
| 11101111 | −0.071658 | −0.412884 |
| 11110000 | −0.292967 | −1.624754 |
| 11110001 | −0.492228 | −1.002755 |
| 11110010 | −0.286607 | −0.646480 |
| 11110011 | −0.503324 | −0.866300 |
| 11110100 | −0.230317 | −0.127990 |
| 11110101 | −0.244364 | −0.221890 |
| 11110110 | −0.252236 | −0.527795 |
| 11110111 | −0.199080 | −0.311608 |
| 11111000 | −0.838132 | −1.415418 |
| 11111001 | −0.163432 | −1.243384 |
| 11111010 | −0.321389 | −0.731153 |
| 11111011 | −0.426149 | −0.802687 |
| 11111100 | −0.302291 | −0.076239 |
| 11111101 | −0.350515 | −0.224507 |
| 11111110 | −0.311265 | −0.430253 |
| 11111111 | −0.333302 | −0.349304 |

TABLE 22

| COORDINATE BITS | SYMBOL X | SYMBOL Y |
|---|---|---|
| 0000 | 0.270682 | 0.962663 |
| 0001 | 0.253573 | 0.248544 |
| 0010 | 0.707302 | 0.706911 |
| 0011 | 0.961176 | 0.275819 |

TABLE 22-continued

| COORDINATE BITS | SYMBOL X | SYMBOL Y |
|---|---|---|
| 0100 | 0.270682 | −0.962663 |
| 0101 | 0.253573 | −0.248544 |
| 0110 | 0.707302 | −0.706911 |
| 0111 | 0.961176 | −0.275819 |
| 1000 | −0.270682 | 0.962663 |
| 1001 | −0.253573 | 0.248544 |
| 1010 | −0.707302 | 0.706911 |
| 1011 | −0.961176 | 0.275819 |
| 1100 | −0.270682 | −0.962663 |
| 1101 | −0.253573 | −0.248544 |
| 1110 | −0.707302 | −0.706911 |
| 1111 | −0.961176 | −0.275819 |

TABLE 23

| COORDINATE BITS | SYMBOL X | SYMBOL Y |
|---|---|---|
| 00000 | 0.358210 | 0.139403 |
| 00001 | 0.235261 | 0.421763 |
| 00010 | 0.930790 | 0.364753 |
| 00011 | 0.787656 | 0.614713 |
| 00100 | 0.125482 | 0.991921 |
| 00101 | 0.382784 | 0.922993 |
| 00110 | 0.990631 | 0.136566 |
| 00111 | 0.626638 | 0.778830 |
| 01000 | 0.358210 | −0.139403 |
| 01001 | 0.235261 | −0.421763 |
| 01010 | 0.930790 | −0.364753 |
| 01011 | 0.787656 | −0.614713 |
| 01100 | 0.125482 | −0.991921 |
| 01101 | 0.382784 | −0.922993 |
| 01110 | 0.990631 | −0.136566 |
| 01111 | 0.626638 | −0.778830 |
| 10000 | −0.358210 | 0.139403 |
| 10001 | −0.235261 | 0.421763 |
| 10010 | −0.930790 | 0.364753 |
| 10011 | −0.787656 | 0.614713 |
| 10100 | −0.125482 | 0.991921 |
| 10101 | −0.382784 | 0.922993 |
| 10110 | −0.990631 | 0.136566 |
| 10111 | −0.626638 | 0.778830 |
| 11000 | −0.358210 | −0.139403 |
| 11001 | −0.235261 | −0.421763 |
| 11010 | −0.930790 | −0.364753 |
| 11011 | −0.787656 | −0.614713 |
| 11100 | −0.125482 | −0.991921 |
| 11101 | −0.382784 | −0.922993 |
| 11110 | −0.990631 | −0.136566 |
| 11111 | −0.626638 | −0.778830 |

TABLE 24A

| COORDINATE BITS | SYMBOL X | SYMBOL Y |
|---|---|---|
| 000000 | 0.894480 | 0.445822 |
| 000001 | 0.890395 | 0.455110 |
| 000010 | 0.984821 | 0.172554 |
| 000011 | 0.985411 | 0.170142 |
| 000100 | 0.730858 | 0.679601 |
| 000101 | 0.731787 | 0.681533 |
| 000110 | 0.594365 | 0.254018 |
| 000111 | 0.545682 | 0.183541 |
| 001000 | 0.172908 | 0.983278 |
| 001001 | 0.144365 | 0.988438 |
| 001010 | 0.103984 | 0.512065 |
| 001011 | 0.110135 | 0.138733 |
| 001100 | 0.453133 | 0.891044 |

TABLE 24A-continued

| COORDINATE BITS | SYMBOL X | SYMBOL Y |
|---|---|---|
| 001101 | 0.458751 | 0.888174 |
| 001110 | 0.237903 | 0.413635 |
| 001111 | 0.327635 | 0.213996 |
| 010000 | 0.894480 | −0.445822 |
| 010001 | 0.890395 | −0.455110 |
| 010010 | 0.984821 | −0.172554 |
| 010011 | 0.985411 | −0.170142 |
| 010100 | 0.730858 | −0.679601 |
| 010101 | 0.731787 | −0.681533 |
| 010110 | 0.594365 | −0.254018 |
| 010111 | 0.545682 | −0.183541 |
| 011000 | 0.172908 | −0.983278 |
| 011001 | 0.144365 | −0.988438 |
| 011010 | 0.103984 | −0.512065 |
| 011011 | 0.110135 | −0.138733 |
| 011100 | 0.453133 | −0.891044 |
| 011101 | 0.458751 | −0.888174 |
| 011110 | 0.237903 | −0.413635 |
| 011111 | 0.327635 | −0.213996 |
| 100000 | −0.894480 | 0.445822 |
| 100001 | −0.890395 | 0.455110 |
| 100010 | −0.984821 | 0.172554 |
| 100011 | −0.985411 | 0.170142 |
| 100100 | −0.730858 | 0.679601 |
| 100101 | −0.731787 | 0.681533 |
| 100110 | −0.594365 | 0.254018 |
| 100111 | −0.545682 | 0.183541 |
| 101000 | −0.172908 | 0.983278 |
| 101001 | −0.144365 | 0.988438 |
| 101010 | −0.103984 | 0.512065 |
| 101011 | −0.110135 | 0.138733 |
| 101100 | −0.453133 | 0.891044 |
| 101101 | −0.458751 | 0.888174 |
| 101110 | −0.237903 | 0.413635 |
| 101111 | −0.327635 | 0.213996 |
| 110000 | −0.894480 | −0.445822 |
| 110001 | −0.890395 | −0.455110 |
| 110010 | −0.984821 | −0.172554 |
| 110011 | −0.985411 | −0.170142 |
| 110100 | −0.730858 | −0.679601 |
| 110101 | −0.731787 | −0.681533 |
| 110110 | −0.594365 | −0.254018 |
| 110111 | −0.545682 | −0.183541 |
| 111000 | −0.172908 | −0.983278 |
| 111001 | −0.144365 | −0.988438 |
| 111010 | −0.103984 | −0.512065 |
| 111011 | −0.110135 | −0.138733 |
| 111100 | −0.453133 | −0.891044 |
| 111101 | −0.458751 | −0.888174 |
| 111110 | −0.237903 | −0.413635 |
| 111111 | −0.327635 | −0.213996 |

TABLE 24B

| COORDINATE BITS | SYMBOL X | SYMBOL Y |
|---|---|---|
| 000000 | 0.847425 | 0.528328 |
| 000001 | 0.724032 | 0.689761 |
| 000010 | 0.949712 | 0.313126 |
| 000011 | 0.993100 | 0.116019 |
| 000100 | 0.561795 | 0.514360 |
| 000101 | 0.575688 | 0.817191 |
| 000110 | 0.586661 | 0.291101 |
| 000111 | 0.623692 | 0.093506 |
| 001000 | 0.114854 | 0.716644 |
| 001001 | 0.141761 | 0.989893 |
| 001010 | 0.099426 | 0.429732 |
| 001011 | 0.092178 | 0.159156 |
| 001100 | 0.344522 | 0.588449 |
| 001101 | 0.385307 | 0.921869 |
| 001110 | 0.314441 | 0.342702 |

TABLE 24B-continued

| COORDINATE BITS | SYMBOL X | SYMBOL Y |
|---|---|---|
| 001111 | 0.309723 | 0.111529 |
| 010000 | 0.847425 | −0.528328 |
| 010001 | 0.724032 | −0.689761 |
| 010010 | 0.949712 | −0.313126 |
| 010011 | 0.993100 | −0.116019 |
| 010100 | 0.561795 | −0.514360 |
| 010101 | 0.575688 | −0.817191 |
| 010110 | 0.586661 | −0.291101 |
| 010111 | 0.623692 | −0.093506 |
| 011000 | 0.114854 | −0.716644 |
| 011001 | 0.141761 | −0.989893 |
| 011010 | 0.099426 | −0.429732 |
| 011011 | 0.092178 | −0.159156 |
| 011100 | 0.344522 | −0.588449 |
| 011101 | 0.385307 | −0.921869 |
| 011110 | 0.314441 | −0.342702 |
| 011111 | 0.309723 | −0.111529 |
| 100000 | −0.847425 | 0.528328 |
| 100001 | −0.724032 | 0.689761 |
| 100010 | −0.949712 | 0.313126 |
| 100011 | −0.993100 | 0.116019 |
| 100100 | −0.561795 | 0.514360 |
| 100101 | −0.575688 | 0.817191 |
| 100110 | −0.586661 | 0.291101 |
| 100111 | −0.623692 | 0.093506 |
| 101000 | −0.114854 | 0.716644 |
| 101001 | −0.141761 | 0.989893 |
| 101010 | −0.099426 | 0.429732 |
| 101011 | −0.092178 | 0.159156 |
| 101100 | −0.344522 | 0.588449 |
| 101101 | −0.385307 | 0.921869 |
| 101110 | −0.314441 | 0.342702 |
| 101111 | −0.309723 | 0.111529 |
| 110000 | −0.847425 | −0.528328 |
| 110001 | −0.724032 | −0.689761 |
| 110010 | −0.949712 | −0.313126 |
| 110011 | −0.993100 | −0.116019 |
| 110100 | −0.561795 | −0.514360 |
| 110101 | −0.575688 | −0.817191 |
| 110110 | −0.586661 | −0.291101 |
| 110111 | −0.623692 | −0.093506 |
| 111000 | −0.114854 | −0.716644 |
| 111001 | −0.141761 | −0.989893 |
| 111010 | −0.099426 | −0.429732 |
| 111011 | −0.092178 | −0.159156 |
| 111100 | −0.344522 | −0.588449 |
| 111101 | −0.385307 | −0.921869 |
| 111110 | −0.314441 | −0.342702 |
| 111111 | −0.309723 | −0.111529 |

TABLE 24C

| COORDINATE BITS | SYMBOL X | SYMBOL Y |
|---|---|---|
| 000000 | 0.089757 | 0.995927 |
| 000001 | 0.871842 | 0.489415 |
| 000010 | 0.992114 | 0.111242 |
| 000011 | 0.947926 | 0.318276 |
| 000100 | 0.624995 | 0.779546 |
| 000101 | 0.766239 | 0.642268 |
| 000110 | 0.631056 | 0.095979 |
| 000111 | 0.627559 | 0.304108 |
| 001000 | 0.276549 | 0.960689 |
| 001001 | 0.111329 | 0.622856 |
| 001010 | 0.150023 | 0.138919 |
| 001011 | 0.116201 | 0.363483 |
| 001100 | 0.453255 | 0.891381 |
| 001101 | 0.390500 | 0.599215 |
| 001110 | 0.332423 | 0.100418 |
| 001111 | 0.436529 | 0.401382 |
| 010000 | 0.089757 | −0.995927 |

TABLE 24C-continued

| COORDINATE BITS | SYMBOL X | SYMBOL Y |
|---|---|---|
| 010001 | 0.871842 | −0.489415 |
| 010010 | 0.992114 | −0.111242 |
| 010011 | 0.947926 | −0.318276 |
| 010100 | 0.624995 | −0.779546 |
| 010101 | 0.766239 | −0.642268 |
| 010110 | 0.631056 | −0.095979 |
| 010111 | 0.627559 | −0.304108 |
| 011000 | 0.276549 | −0.960689 |
| 011001 | 0.111329 | −0.622856 |
| 011010 | 0.150023 | −0.138919 |
| 011011 | 0.116201 | −0.363483 |
| 011100 | 0.453255 | −0.891381 |
| 011101 | 0.390500 | −0.599215 |
| 011110 | 0.332423 | −0.100418 |
| 011111 | 0.436529 | −0.401382 |
| 100000 | −0.089757 | 0.995927 |
| 100001 | −0.871842 | 0.489415 |
| 100010 | −0.992114 | 0.111242 |
| 100011 | −0.947926 | 0.318276 |
| 100100 | −0.624995 | 0.779546 |
| 100101 | −0.766239 | 0.642268 |
| 100110 | −0.631056 | 0.095979 |
| 100111 | −0.627559 | 0.304108 |
| 101000 | −0.276549 | 0.960689 |
| 101001 | −0.111329 | 0.622856 |
| 101010 | −0.150023 | 0.138919 |
| 101011 | −0.116201 | 0.363483 |
| 101100 | −0.453255 | 0.891381 |
| 101101 | −0.390500 | 0.599215 |
| 101110 | −0.332423 | 0.100418 |
| 101111 | −0.436529 | 0.401382 |
| 110000 | −0.089757 | −0.995927 |
| 110001 | −0.871842 | −0.489415 |
| 110010 | −0.992114 | −0.111242 |
| 110011 | −0.947926 | −0.318276 |
| 110100 | −0.624995 | −0.779546 |
| 110101 | −0.766239 | −0.642268 |
| 110110 | −0.631056 | −0.095979 |
| 110111 | −0.627559 | −0.304108 |
| 111000 | −0.276549 | −0.960689 |
| 111001 | −0.111329 | −0.622856 |
| 111010 | −0.150023 | −0.138919 |
| 111011 | −0.116201 | −0.363483 |
| 111100 | −0.453255 | −0.891381 |
| 111101 | −0.390500 | −0.599215 |
| 111110 | −0.332423 | −0.100418 |
| 111111 | −0.436529 | −0.401382 |

TABLE 24D

| COORDINATE BITS | SYMBOL X | SYMBOL Y |
|---|---|---|
| 000000 | 0.825394 | 0.564557 |
| 000001 | 0.679474 | 0.733233 |
| 000010 | 0.934649 | 0.354296 |
| 000011 | 0.992113 | 0.124306 |
| 000100 | 0.547499 | 0.538212 |
| 000101 | 0.512966 | 0.857155 |
| 000110 | 0.667874 | 0.319131 |
| 000111 | 0.704023 | 0.112315 |
| 001000 | 0.105064 | 0.673007 |
| 001001 | 0.104623 | 0.989353 |
| 001010 | 0.128136 | 0.390102 |
| 001011 | 0.131864 | 0.120209 |
| 001100 | 0.337537 | 0.644600 |
| 001101 | 0.310475 | 0.949750 |
| 001110 | 0.364337 | 0.376712 |
| 001111 | 0.404674 | 0.115168 |
| 010000 | 0.825394 | −0.564557 |
| 010001 | 0.679474 | −0.733233 |
| 010010 | 0.934649 | −0.354296 |

TABLE 24D-continued

| COORDINATE BITS | SYMBOL X | SYMBOL Y |
|---|---|---|
| 010011 | 0.992113 | −0.124306 |
| 010100 | 0.547499 | −0.538212 |
| 010101 | 0.512966 | −0.857155 |
| 010110 | 0.667874 | −0.319131 |
| 010111 | 0.704023 | −0.112315 |
| 011000 | 0.105064 | −0.673007 |
| 011001 | 0.104623 | −0.989353 |
| 011010 | 0.128136 | −0.390102 |
| 011011 | 0.131864 | −0.120209 |
| 011100 | 0.337537 | −0.644600 |
| 011101 | 0.310475 | −0.949750 |
| 011110 | 0.364337 | −0.376712 |
| 011111 | 0.404674 | −0.115168 |
| 100000 | −0.825394 | 0.564557 |
| 100001 | −0.679474 | 0.733233 |
| 100010 | −0.934649 | 0.354296 |
| 100011 | −0.992113 | 0.124306 |
| 100100 | −0.547499 | 0.538212 |
| 100101 | −0.512966 | 0.857155 |
| 100110 | −0.667874 | 0.319131 |
| 100111 | −0.704023 | 0.112315 |
| 101000 | −0.105064 | 0.673007 |
| 101001 | −0.104623 | 0.989353 |
| 101010 | −0.128136 | 0.390102 |
| 101011 | −0.131864 | 0.120209 |
| 101100 | −0.337537 | 0.644600 |
| 101101 | −0.310475 | 0.949750 |
| 101110 | −0.364337 | 0.376712 |
| 101111 | −0.404674 | 0.115168 |
| 110000 | −0.825394 | −0.564557 |
| 110001 | −0.679474 | −0.733233 |
| 110010 | −0.934649 | −0.354296 |
| 110011 | −0.992113 | −0.124306 |
| 110100 | −0.547499 | −0.538212 |
| 110101 | −0.512966 | −0.857155 |
| 110110 | −0.667874 | −0.319131 |
| 110111 | −0.704023 | −0.112315 |
| 111000 | −0.105064 | −0.673007 |
| 111001 | −0.104623 | −0.989353 |
| 111010 | −0.128136 | −0.390102 |
| 111011 | −0.131864 | −0.120209 |
| 111100 | −0.337537 | −0.644600 |
| 111101 | −0.310475 | −0.949750 |
| 111110 | −0.364337 | −0.376712 |
| 111111 | −0.404674 | −0.115168 |

TABLE 25A

| COORDINATE BITS | SYMBOL X | SYMBOL Y |
|---|---|---|
| 0000000 | 0.401618 | 0.182455 |
| 0000001 | 0.432271 | 0.238332 |
| 0000010 | 0.210211 | 0.077897 |
| 0000011 | 0.188527 | 0.106144 |
| 0000100 | 0.690013 | 0.077217 |
| 0000101 | 0.658899 | 0.105155 |
| 0000110 | 0.991792 | 0.108289 |
| 0000111 | 0.994471 | 0.097881 |
| 0001000 | 0.266643 | 0.496767 |
| 0001001 | 0.335273 | 0.407525 |
| 0001010 | 0.087396 | 0.426683 |
| 0001011 | 0.081485 | 0.285545 |
| 0001100 | 0.157416 | 0.730291 |
| 0001101 | 0.144214 | 0.989148 |
| 0001110 | 0.075548 | 0.683943 |
| 0001111 | 0.123780 | 0.992051 |
| 0010000 | 0.632012 | 0.419775 |
| 0010001 | 0.581779 | 0.400034 |
| 0010010 | 0.818321 | 0.574028 |
| 0010011 | 0.808932 | 0.585710 |
| 0010100 | 0.772679 | 0.293599 |

TABLE 25A-continued

| COORDINATE BITS | SYMBOL X | SYMBOL Y |
|---|---|---|
| 0010101 | 0.753516 | 0.255345 |
| 0010110 | 0.937056 | 0.349179 |
| 0010111 | 0.937889 | 0.344474 |
| 0011000 | 0.484355 | 0.600452 |
| 0011001 | 0.469372 | 0.569456 |
| 0011010 | 0.650758 | 0.755708 |
| 0011011 | 0.663597 | 0.743786 |
| 0011100 | 0.362030 | 0.806477 |
| 0011101 | 0.324343 | 0.942537 |
| 0011110 | 0.457817 | 0.888570 |
| 0011111 | 0.394670 | 0.918198 |
| 0100000 | 0.401618 | −0.182455 |
| 0100001 | 0.432271 | −0.238332 |
| 0100010 | 0.210211 | −0.077897 |
| 0100011 | 0.188527 | −0.106144 |
| 0100100 | 0.690013 | −0.077217 |
| 0100101 | 0.658899 | −0.105155 |
| 0100110 | 0.991792 | −0.108289 |
| 0100111 | 0.994471 | −0.097881 |
| 0101000 | 0.266643 | −0.496767 |
| 0101001 | 0.335273 | −0.407525 |
| 0101010 | 0.087396 | −0.426683 |
| 0101011 | 0.081485 | −0.285545 |
| 0101100 | 0.157416 | −0.730291 |
| 0101101 | 0.144214 | −0.989148 |
| 0101110 | 0.075548 | −0.683943 |
| 0101111 | 0.123780 | −0.992051 |
| 0110000 | 0.632012 | −0.419775 |
| 0110001 | 0.581779 | −0.400034 |
| 0110010 | 0.818321 | −0.574028 |
| 0110011 | 0.808932 | −0.585710 |
| 0110100 | 0.772679 | −0.293599 |
| 0110101 | 0.753516 | −0.255345 |
| 0110110 | 0.937056 | −0.349179 |
| 0110111 | 0.937889 | −0.344474 |
| 0111000 | 0.484355 | −0.600452 |
| 0111001 | 0.469372 | −0.569456 |
| 0111010 | 0.650758 | −0.755708 |
| 0111011 | 0.663597 | −0.743786 |
| 0111100 | 0.362030 | −0.806477 |
| 0111101 | 0.324343 | −0.942537 |
| 0111110 | 0.457817 | −0.888570 |
| 0111111 | 0.394670 | −0.918198 |
| 1000000 | −0.401618 | 0.182455 |
| 1000001 | −0.432271 | 0.238332 |
| 1000010 | −0.210211 | 0.077897 |
| 1000011 | −0.188527 | 0.106144 |
| 1000100 | −0.690013 | 0.077217 |
| 1000101 | −0.658899 | 0.105155 |
| 1000110 | −0.991792 | 0.108289 |
| 1000111 | −0.994471 | 0.097881 |
| 1001000 | −0.266643 | 0.496767 |
| 1001001 | −0.335273 | 0.407525 |
| 1001010 | −0.087396 | 0.426683 |
| 1001011 | −0.081485 | 0.285545 |
| 1001100 | −0.157416 | 0.730291 |
| 1001101 | −0.144214 | 0.989148 |
| 1001110 | −0.075548 | 0.683943 |
| 1001111 | −0.123780 | 0.992051 |
| 1010000 | −0.632012 | 0.419775 |
| 1010001 | −0.581779 | 0.400034 |
| 1010010 | −0.818321 | 0.574028 |
| 1010011 | −0.808932 | 0.585710 |
| 1010100 | −0.772679 | 0.293599 |
| 1010101 | −0.753516 | 0.255345 |
| 1010110 | −0.937056 | 0.349179 |
| 1010111 | −0.937889 | 0.344474 |
| 1011000 | −0.484355 | 0.600452 |
| 1011001 | −0.469372 | 0.569456 |
| 1011010 | −0.650758 | 0.755708 |
| 1011011 | −0.663597 | 0.743786 |
| 1011100 | −0.362030 | 0.806477 |
| 1011101 | −0.324343 | 0.942537 |
| 1011110 | −0.457817 | 0.888570 |
| 1011111 | −0.394670 | 0.918198 |
| 1100000 | −0.401618 | −0.182455 |

TABLE 25A-continued

| COORDINATE BITS | SYMBOL X | SYMBOL Y |
|---|---|---|
| 1100001 | −0.432271 | −0.238332 |
| 1100010 | −0.210211 | −0.077897 |
| 1100011 | −0.188527 | −0.106144 |
| 1100100 | −0.690013 | −0.077217 |
| 1100101 | −0.658899 | −0.105155 |
| 1100110 | −0.991792 | −0.108289 |
| 1100111 | −0.994471 | −0.097881 |
| 1101000 | −0.266643 | −0.496767 |
| 1101001 | −0.335273 | −0.407525 |
| 1101010 | −0.087396 | −0.426683 |
| 1101011 | −0.081485 | −0.285545 |
| 1101100 | −0.157416 | −0.730291 |
| 1101101 | −0.144214 | −0.989148 |
| 1101110 | −0.075548 | −0.683943 |
| 1101111 | −0.123780 | −0.992051 |
| 1110000 | −0.632012 | −0.419775 |
| 1110001 | −0.581779 | −0.400034 |
| 1110010 | −0.818321 | −0.574028 |
| 1110011 | −0.808932 | −0.585710 |
| 1110100 | −0.772679 | −0.293599 |
| 1110101 | −0.753516 | −0.255345 |
| 1110110 | −0.937056 | −0.349179 |
| 1110111 | −0.937889 | −0.344474 |
| 1111000 | −0.484355 | −0.600452 |
| 1111001 | −0.469372 | −0.569456 |
| 1111010 | −0.650758 | −0.755708 |
| 1111011 | −0.663597 | −0.743786 |
| 1111100 | −0.362030 | −0.806477 |
| 1111101 | −0.324343 | −0.942537 |
| 1111110 | −0.457817 | −0.888570 |
| 1111111 | −0.394670 | −0.918198 |

TABLE 25B

| COORDINATE BITS | SYMBOL X | SYMBOL Y |
|---|---|---|
| 0000000 | 0.349139 | 0.084873 |
| 0000001 | 0.444253 | 0.223961 |
| 0000010 | 0.200465 | 0.076363 |
| 0000011 | 0.076729 | 0.165391 |
| 0000100 | 0.661752 | 0.074430 |
| 0000101 | 0.569082 | 0.152245 |
| 0000110 | 0.867463 | 0.058010 |
| 0000111 | 0.994165 | 0.101734 |
| 0001000 | 0.276140 | 0.483395 |
| 0001001 | 0.360395 | 0.354916 |
| 0001010 | 0.105450 | 0.423216 |
| 0001011 | 0.112712 | 0.306408 |
| 0001100 | 0.157400 | 0.694676 |
| 0001101 | 0.092859 | 0.872214 |
| 0001110 | 0.073573 | 0.584372 |
| 0001111 | 0.086593 | 0.996244 |
| 0010000 | 0.664424 | 0.454352 |
| 0010001 | 0.620132 | 0.459156 |
| 0010010 | 0.822650 | 0.566931 |
| 0010011 | 0.811832 | 0.583371 |
| 0010100 | 0.734535 | 0.287119 |
| 0010101 | 0.698954 | 0.273938 |
| 0010110 | 0.932816 | 0.357106 |
| 0010111 | 0.955383 | 0.292872 |
| 0011000 | 0.415243 | 0.605429 |
| 0011001 | 0.487527 | 0.551685 |
| 0011010 | 0.624474 | 0.780353 |
| 0011011 | 0.654058 | 0.755420 |
| 0011100 | 0.291362 | 0.740066 |
| 0011101 | 0.280086 | 0.955742 |
| 0011110 | 0.463177 | 0.885940 |
| 0011111 | 0.351608 | 0.935764 |
| 0100000 | 0.349139 | −0.084873 |
| 0100001 | 0.444253 | −0.223961 |
| 0100010 | 0.200465 | −0.076363 |

TABLE 25B-continued

| COORDINATE BITS | SYMBOL X | SYMBOL Y |
|---|---|---|
| 0100011 | 0.076729 | −0.165391 |
| 0100100 | 0.661752 | −0.074430 |
| 0100101 | 0.569082 | −0.152245 |
| 0100110 | 0.867463 | −0.058010 |
| 0100111 | 0.994165 | −0.101734 |
| 0101000 | 0.276140 | −0.483395 |
| 0101001 | 0.360395 | −0.354916 |
| 0101010 | 0.105450 | −0.423216 |
| 0101011 | 0.112712 | −0.306408 |
| 0101100 | 0.157400 | −0.694676 |
| 0101101 | 0.092859 | −0.872214 |
| 0101110 | 0.073573 | −0.584372 |
| 0101111 | 0.086593 | −0.996244 |
| 0110000 | 0.664424 | −0.454352 |
| 0110001 | 0.620132 | −0.459156 |
| 0110010 | 0.822650 | −0.566931 |
| 0110011 | 0.811832 | −0.583371 |
| 0110100 | 0.734535 | −0.287119 |
| 0110101 | 0.698954 | −0.273938 |
| 0110110 | 0.932816 | −0.357106 |
| 0110111 | 0.955383 | −0.292872 |
| 0111000 | 0.415243 | −0.605429 |
| 0111001 | 0.487527 | −0.551685 |
| 0111010 | 0.624474 | −0.780353 |
| 0111011 | 0.654058 | −0.755420 |
| 0111100 | 0.291362 | −0.740066 |
| 0111101 | 0.280086 | −0.955742 |
| 0111110 | 0.463177 | −0.885940 |
| 0111111 | 0.351608 | −0.935764 |
| 1000000 | −0.349139 | 0.084873 |
| 1000001 | −0.444253 | 0.223961 |
| 1000010 | −0.200465 | 0.076363 |
| 1000011 | −0.076729 | 0.165391 |
| 1000100 | −0.661752 | 0.074430 |
| 1000101 | −0.569082 | 0.152245 |
| 1000110 | −0.867463 | 0.058010 |
| 1000111 | −0.994165 | 0.101734 |
| 1001000 | −0.276140 | 0.483395 |
| 1001001 | −0.360395 | 0.354916 |
| 1001010 | −0.105450 | 0.423216 |
| 1001011 | −0.112712 | 0.306408 |
| 1001100 | −0.157400 | 0.694676 |
| 1001101 | −0.092859 | 0.872214 |
| 1001110 | −0.073573 | 0.584372 |
| 1001111 | −0.086593 | 0.996244 |
| 1010000 | −0.664424 | 0.454352 |
| 1010001 | −0.620132 | 0.459156 |
| 1010010 | −0.822650 | 0.566931 |
| 1010011 | −0.811832 | 0.583371 |
| 1010100 | −0.734535 | 0.287119 |
| 1010101 | −0.698954 | 0.273938 |
| 1010110 | −0.932816 | 0.357106 |
| 1010111 | −0.955383 | 0.292872 |
| 1011000 | −0.415243 | 0.605429 |
| 1011001 | −0.487527 | 0.551685 |
| 1011010 | −0.624474 | 0.780353 |
| 1011011 | −0.654058 | 0.755420 |
| 1011100 | −0.291362 | 0.740066 |
| 1011101 | −0.280086 | 0.955742 |
| 1011110 | −0.463177 | 0.885940 |
| 1011111 | −0.351608 | 0.935764 |
| 1100000 | −0.349139 | −0.084873 |
| 1100001 | −0.444253 | −0.223961 |
| 1100010 | −0.200465 | −0.076363 |
| 1100011 | −0.076729 | −0.165391 |
| 1100100 | −0.661752 | −0.074430 |
| 1100101 | −0.569082 | −0.152245 |
| 1100110 | −0.867463 | −0.058010 |
| 1100111 | −0.994165 | −0.101734 |
| 1101000 | −0.276140 | −0.483395 |
| 1101001 | −0.360395 | −0.354916 |
| 1101010 | −0.105450 | −0.423216 |
| 1101011 | −0.112712 | −0.306408 |
| 1101100 | −0.157400 | −0.694676 |
| 1101101 | −0.092859 | −0.872214 |
| 1101110 | −0.073573 | −0.584372 |

TABLE 25B-continued

| COORDINATE | SYMBOL | |
|---|---|---|
| BITS | X | Y |
| 1101111 | −0.086593 | −0.996244 |
| 1110000 | −0.664424 | −0.454352 |
| 1110001 | −0.620132 | −0.459156 |
| 1110010 | −0.822650 | −0.566931 |
| 1110011 | −0.811832 | −0.583371 |
| 1110100 | −0.734535 | −0.287119 |
| 1110101 | −0.698954 | −0.273938 |
| 1110110 | −0.932816 | −0.357106 |
| 1110111 | −0.955383 | −0.292872 |
| 1111000 | −0.415243 | −0.605429 |
| 1111001 | −0.487527 | −0.551685 |
| 1111010 | −0.624474 | −0.780353 |
| 1111011 | −0.654058 | −0.755420 |
| 1111100 | −0.291362 | −0.740066 |
| 1111101 | −0.280086 | −0.955742 |
| 1111110 | −0.463177 | −0.885940 |
| 1111111 | −0.351608 | −0.935764 |

TABLE 25C

| COORDINATE | SYMBOL | |
|---|---|---|
| BITS | X | Y |
| 0000000 | 0.179332 | 0.062318 |
| 0000001 | 0.264529 | 0.196526 |
| 0000010 | 0.055320 | 0.109173 |
| 0000011 | 0.101863 | 0.235172 |
| 0000100 | 0.669962 | 0.075558 |
| 0000101 | 0.419174 | 0.070925 |
| 0000110 | 0.861092 | 0.104401 |
| 0000111 | 0.992390 | 0.118291 |
| 0001000 | 0.195476 | 0.575233 |
| 0001001 | 0.219531 | 0.412072 |
| 0001010 | 0.060970 | 0.560996 |
| 0001011 | 0.085387 | 0.369804 |
| 0001100 | 0.213900 | 0.756034 |
| 0001101 | 0.279980 | 0.959448 |
| 0001110 | 0.078356 | 0.804679 |
| 0001111 | 0.089502 | 0.994559 |
| 0010000 | 0.552393 | 0.333246 |
| 0010001 | 0.396346 | 0.273296 |
| 0010010 | 0.683752 | 0.404797 |
| 0010011 | 0.858560 | 0.511264 |
| 0010100 | 0.642493 | 0.197800 |
| 0010101 | 0.462109 | 0.164180 |
| 0010110 | 0.801694 | 0.290343 |
| 0010111 | 0.937916 | 0.339763 |
| 0011000 | 0.412951 | 0.509479 |
| 0011001 | 0.336567 | 0.413951 |
| 0011010 | 0.600289 | 0.546834 |
| 0011011 | 0.763765 | 0.644626 |
| 0011100 | 0.385655 | 0.691063 |
| 0011101 | 0.443902 | 0.896057 |
| 0011110 | 0.536473 | 0.674051 |
| 0011111 | 0.606478 | 0.795101 |
| 0100000 | 0.179332 | −0.062318 |
| 0100001 | 0.264529 | −0.196526 |
| 0100010 | 0.055320 | −0.109173 |
| 0100011 | 0.101863 | −0.235172 |
| 0100100 | 0.669962 | −0.075558 |
| 0100101 | 0.419174 | −0.070925 |
| 0100110 | 0.861092 | −0.104401 |
| 0100111 | 0.992390 | −0.118291 |
| 0101000 | 0.195476 | −0.575233 |
| 0101001 | 0.219531 | −0.412072 |
| 0101010 | 0.060970 | −0.560996 |
| 0101011 | 0.085387 | −0.369804 |
| 0101100 | 0.213900 | −0.756034 |
| 0101101 | 0.279980 | −0.959448 |

TABLE 25C-continued

| COORDINATE | SYMBOL | |
|---|---|---|
| BITS | X | Y |
| 0101110 | 0.078356 | −0.804679 |
| 0101111 | 0.089502 | −0.994559 |
| 0110000 | 0.552393 | −0.333246 |
| 0110001 | 0.396346 | −0.273296 |
| 0110010 | 0.683752 | −0.404797 |
| 0110011 | 0.858560 | −0.511264 |
| 0110100 | 0.642493 | −0.197800 |
| 0110101 | 0.462109 | −0.164180 |
| 0110110 | 0.801694 | −0.290343 |
| 0110111 | 0.937916 | −0.339763 |
| 0111000 | 0.412951 | −0.509479 |
| 0111001 | 0.336567 | −0.413951 |
| 0111010 | 0.600289 | −0.546834 |
| 0111011 | 0.763765 | −0.644626 |
| 0111100 | 0.385655 | −0.691063 |
| 0111101 | 0.443902 | −0.896057 |
| 0111110 | 0.536473 | −0.674051 |
| 0111111 | 0.606478 | −0.795101 |
| 1000000 | −0.179332 | 0.062318 |
| 1000001 | −0.264529 | 0.196526 |
| 1000010 | −0.055320 | 0.109173 |
| 1000011 | −0.101863 | 0.235172 |
| 1000100 | −0.669962 | 0.075558 |
| 1000101 | −0.419174 | 0.070925 |
| 1000110 | −0.861092 | 0.104401 |
| 1000111 | −0.992390 | 0.118291 |
| 1001000 | −0.195476 | 0.575233 |
| 1001001 | −0.219531 | 0.412072 |
| 1001010 | −0.060970 | 0.560996 |
| 1001011 | −0.085387 | 0.369804 |
| 1001100 | −0.213900 | 0.756034 |
| 1001101 | −0.279980 | 0.959448 |
| 1001110 | −0.078356 | 0.804679 |
| 1001111 | −0.089502 | 0.994559 |
| 1010000 | −0.552393 | 0.333246 |
| 1010001 | −0.396346 | 0.273296 |
| 1010010 | −0.683752 | 0.404797 |
| 1010011 | −0.858560 | 0.511264 |
| 1010100 | −0.642493 | 0.197800 |
| 1010101 | −0.462109 | 0.164180 |
| 1010110 | −0.801694 | 0.290343 |
| 1010111 | −0.937916 | 0.339763 |
| 1011000 | −0.412951 | 0.509479 |
| 1011001 | −0.336567 | 0.413951 |
| 1011010 | −0.600289 | 0.546834 |
| 1011011 | −0.763765 | 0.644626 |
| 1011100 | −0.385655 | 0.691063 |
| 1011101 | −0.443902 | 0.896057 |
| 1011110 | −0.536473 | 0.674051 |
| 1011111 | −0.606478 | 0.795101 |
| 1100000 | −0.179332 | −0.062318 |
| 1100001 | −0.264529 | −0.196526 |
| 1100010 | −0.055320 | −0.109173 |
| 1100011 | −0.101863 | −0.235172 |
| 1100100 | −0.669962 | −0.075558 |
| 1100101 | −0.419174 | −0.070925 |
| 1100110 | −0.861092 | −0.104401 |
| 1100111 | −0.992390 | −0.118291 |
| 1101000 | −0.195476 | −0.575233 |
| 1101001 | −0.219531 | −0.412072 |
| 1101010 | −0.060970 | −0.560996 |
| 1101011 | −0.085387 | −0.369804 |
| 1101100 | −0.213900 | −0.756034 |
| 1101101 | −0.279980 | −0.959448 |
| 1101110 | −0.078356 | −0.804679 |
| 1101111 | −0.089502 | −0.994559 |
| 1110000 | −0.552393 | −0.333246 |
| 1110001 | −0.396346 | −0.273296 |
| 1110010 | −0.683752 | −0.404797 |
| 1110011 | −0.858560 | −0.511264 |
| 1110100 | −0.642493 | −0.197800 |
| 1110101 | −0.462109 | −0.164180 |
| 1110110 | −0.801694 | −0.290343 |
| 1110111 | −0.937916 | −0.339763 |
| 1111000 | −0.412951 | −0.509479 |
| 1111001 | −0.336567 | −0.413951 |

TABLE 25C-continued

| COORDINATE BITS | SYMBOL X | SYMBOL Y |
|---|---|---|
| 1111010 | −0.600289 | −0.546834 |
| 1111011 | −0.763765 | −0.644626 |
| 1111100 | −0.385655 | −0.691063 |
| 1111101 | −0.443902 | −0.896057 |
| 1111110 | −0.536473 | −0.674051 |
| 1111111 | −0.606478 | −0.795101 |

TABLE 25D

| COORDINATE BITS | SYMBOL X | SYMBOL Y |
|---|---|---|
| 0000000 | 0.215659 | 0.071275 |
| 0000001 | 0.247193 | 0.239779 |
| 0000010 | 0.059723 | 0.089476 |
| 0000011 | 0.084352 | 0.256286 |
| 0000100 | 0.631601 | 0.086959 |
| 0000101 | 0.421425 | 0.060957 |
| 0000110 | 0.811036 | 0.081198 |
| 0000111 | 0.989141 | 0.115779 |
| 0001000 | 0.238961 | 0.619410 |
| 0001001 | 0.188755 | 0.432433 |
| 0001010 | 0.081970 | 0.619772 |
| 0001011 | 0.071916 | 0.446011 |
| 0001100 | 0.230093 | 0.798693 |
| 0001101 | 0.278409 | 0.959192 |
| 0001110 | 0.079376 | 0.797516 |
| 0001111 | 0.102980 | 0.994337 |
| 0010000 | 0.540893 | 0.373750 |
| 0010001 | 0.390688 | 0.300381 |
| 0010010 | 0.711286 | 0.403395 |
| 0010011 | 0.878402 | 0.477131 |
| 0010100 | 0.613230 | 0.218230 |
| 0010101 | 0.459120 | 0.180142 |
| 0010110 | 0.770540 | 0.249889 |
| 0010111 | 0.951364 | 0.303258 |
| 0011000 | 0.419831 | 0.530248 |
| 0011001 | 0.327094 | 0.416570 |
| 0011010 | 0.635577 | 0.561146 |
| 0011011 | 0.777941 | 0.627040 |
| 0011100 | 0.406760 | 0.706463 |
| 0011101 | 0.454097 | 0.890952 |
| 0011110 | 0.554936 | 0.677703 |
| 0011111 | 0.616155 | 0.785695 |
| 0100000 | 0.215659 | −0.071275 |
| 0100001 | 0.247193 | −0.239779 |
| 0100010 | 0.059723 | −0.089476 |
| 0100011 | 0.084352 | −0.256286 |
| 0100100 | 0.631601 | −0.086959 |
| 0100101 | 0.421425 | −0.060957 |
| 0100110 | 0.811036 | −0.081198 |
| 0100111 | 0.989141 | −0.115779 |
| 0101000 | 0.238961 | −0.619410 |
| 0101001 | 0.188755 | −0.432433 |
| 0101010 | 0.081970 | −0.619772 |
| 0101011 | 0.071916 | −0.446011 |
| 0101100 | 0.230093 | −0.798693 |
| 0101101 | 0.278409 | −0.959192 |
| 0101110 | 0.079376 | −0.797516 |
| 0101111 | 0.102980 | −0.994337 |
| 0110000 | 0.540893 | −0.373750 |
| 0110001 | 0.390688 | −0.300381 |
| 0110010 | 0.711286 | −0.403395 |
| 0110011 | 0.878402 | −0.477131 |
| 0110100 | 0.613230 | −0.218230 |
| 0110101 | 0.459120 | −0.180142 |
| 0110110 | 0.770540 | −0.249889 |
| 0110111 | 0.951364 | −0.303258 |
| 0111000 | 0.419831 | −0.530248 |
| 0111001 | 0.327094 | −0.416570 |
| 0111010 | 0.635577 | −0.561146 |
| 0111011 | 0.777941 | −0.627040 |

TABLE 25D-continued

| COORDINATE BITS | SYMBOL X | SYMBOL Y |
|---|---|---|
| 0111100 | 0.406760 | −0.706463 |
| 0111101 | 0.454097 | −0.890952 |
| 0111110 | 0.554936 | −0.677703 |
| 0111111 | 0.616155 | −0.785695 |
| 1000000 | −0.215659 | 0.071275 |
| 1000001 | −0.247193 | 0.239779 |
| 1000010 | −0.059723 | 0.089476 |
| 1000011 | −0.084352 | 0.256286 |
| 1000100 | −0.631601 | 0.086959 |
| 1000101 | −0.421425 | 0.060957 |
| 1000110 | −0.811036 | 0.081198 |
| 1000111 | −0.989141 | 0.115779 |
| 1001000 | −0.238961 | 0.619410 |
| 1001001 | −0.188755 | 0.432433 |
| 1001010 | −0.081970 | 0.619772 |
| 1001011 | −0.071916 | 0.446011 |
| 1001100 | −0.230093 | 0.798693 |
| 1001101 | −0.278409 | 0.959192 |
| 1001110 | −0.079376 | 0.797516 |
| 1001111 | −0.102980 | 0.994337 |
| 1010000 | −0.540893 | 0.373750 |
| 1010001 | −0.390688 | 0.300381 |
| 1010010 | −0.711286 | 0.403395 |
| 1010011 | −0.878402 | 0.477131 |
| 1010100 | −0.613230 | 0.218230 |
| 1010101 | −0.459120 | 0.180142 |
| 1010110 | −0.770540 | 0.249889 |
| 1010111 | −0.951364 | 0.303258 |
| 1011000 | −0.419831 | 0.530248 |
| 1011001 | −0.327094 | 0.416570 |
| 1011010 | −0.635577 | 0.561146 |
| 1011011 | −0.777941 | 0.627040 |
| 1011100 | −0.406760 | 0.706463 |
| 1011101 | −0.454097 | 0.890952 |
| 1011110 | −0.554936 | 0.677703 |
| 1011111 | −0.616155 | 0.785695 |
| 1100000 | −0.215659 | −0.071275 |
| 1100001 | −0.247193 | −0.239779 |
| 1100010 | −0.059723 | −0.089476 |
| 1100011 | −0.084352 | −0.256286 |
| 1100100 | −0.631601 | −0.086959 |
| 1100101 | −0.421425 | −0.060957 |
| 1100110 | −0.811036 | −0.081198 |
| 1100111 | −0.989141 | −0.115779 |
| 1101000 | −0.238961 | −0.619410 |
| 1101001 | −0.188755 | −0.432433 |
| 1101010 | −0.081970 | −0.619772 |
| 1101011 | −0.071916 | −0.446011 |
| 1101100 | −0.230093 | −0.798693 |
| 1101101 | −0.278409 | −0.959192 |
| 1101110 | −0.079376 | −0.797516 |
| 1101111 | −0.102980 | −0.994337 |
| 1110000 | −0.540893 | −0.373750 |
| 1110001 | −0.390688 | −0.300381 |
| 1110010 | −0.711286 | −0.403395 |
| 1110011 | −0.878402 | −0.477131 |
| 1110100 | −0.613230 | −0.218230 |
| 1110101 | −0.459120 | −0.180142 |
| 1110110 | −0.770540 | −0.249889 |
| 1110111 | −0.951364 | −0.303258 |
| 1111000 | −0.419831 | −0.530248 |
| 1111001 | −0.327094 | −0.416570 |
| 1111010 | −0.635577 | −0.561146 |
| 1111011 | −0.777941 | −0.627040 |
| 1111100 | −0.406760 | −0.706463 |
| 1111101 | −0.454097 | −0.890952 |
| 1111110 | −0.554936 | −0.677703 |
| 1111111 | −0.616155 | −0.785695 |

TABLE 26A

| COORDINATE BITS | SYMBOL X | SYMBOL Y |
|---|---|---|
| 00000000 | 0.729468 | 0.681354 |
| 00000001 | 0.738514 | 0.673491 |
| 00000010 | 0.855792 | 0.514140 |
| 00000011 | 0.849844 | 0.515379 |
| 00000100 | 0.968926 | 0.244322 |
| 00000101 | 0.961654 | 0.274266 |
| 00000110 | 0.846439 | 0.172785 |
| 00000111 | 0.814534 | 0.289437 |
| 00001000 | 0.660833 | 0.597951 |
| 00001001 | 0.635704 | 0.601179 |
| 00001010 | 0.703246 | 0.498537 |
| 00001011 | 0.713555 | 0.458342 |
| 00001100 | 0.982752 | 0.108821 |
| 00001101 | 0.995743 | 0.075153 |
| 00001110 | 0.835216 | 0.108792 |
| 00001111 | 0.734334 | 0.299494 |
| 00010000 | 0.563531 | 0.824212 |
| 00010001 | 0.538599 | 0.841459 |
| 00010010 | 0.422490 | 0.436968 |
| 00010011 | 0.486743 | 0.460303 |
| 00010100 | 0.533243 | 0.050591 |
| 00010101 | 0.625049 | 0.049186 |
| 00010110 | 0.460159 | 0.327276 |
| 00010111 | 0.545204 | 0.349786 |
| 00011000 | 0.466690 | 0.722489 |
| 00011001 | 0.472883 | 0.710099 |
| 00011010 | 0.416973 | 0.618858 |
| 00011011 | 0.459806 | 0.568347 |
| 00011100 | 0.496124 | 0.136766 |
| 00011101 | 0.632908 | 0.115646 |
| 00011110 | 0.478072 | 0.233508 |
| 00011111 | 0.637346 | 0.269821 |
| 00100000 | 0.150085 | 0.986638 |
| 00100001 | 0.096333 | 0.982163 |
| 00100010 | 0.054634 | 0.530674 |
| 00100011 | 0.124963 | 0.483488 |
| 00100100 | 0.039722 | 0.038334 |
| 00100101 | 0.135172 | 0.056012 |
| 00100110 | 0.055695 | 0.397262 |
| 00100111 | 0.117755 | 0.376976 |
| 00101000 | 0.077604 | 0.807366 |
| 00101001 | 0.114272 | 0.876917 |
| 00101010 | 0.077226 | 0.661268 |
| 00101011 | 0.142363 | 0.599635 |
| 00101100 | 0.048885 | 0.160450 |
| 00101101 | 0.167945 | 0.151950 |
| 00101110 | 0.046340 | 0.256559 |
| 00101111 | 0.151392 | 0.268874 |
| 00110000 | 0.368991 | 0.926086 |
| 00110001 | 0.380645 | 0.924004 |
| 00110010 | 0.333044 | 0.460912 |
| 00110011 | 0.244729 | 0.473505 |
| 00110100 | 0.373900 | 0.043782 |
| 00110101 | 0.245282 | 0.046720 |
| 00110110 | 0.338122 | 0.327772 |
| 00110111 | 0.246479 | 0.355455 |
| 00111000 | 0.271941 | 0.776781 |
| 00111001 | 0.314659 | 0.780426 |
| 00111010 | 0.281591 | 0.667979 |
| 00111011 | 0.269267 | 0.631313 |
| 00111100 | 0.391733 | 0.132460 |
| 00111101 | 0.267292 | 0.162978 |
| 00111110 | 0.375666 | 0.240801 |
| 00111111 | 0.260740 | 0.241834 |
| 01000000 | 0.729468 | −0.681354 |
| 01000001 | 0.738514 | −0.673491 |
| 01000010 | 0.855792 | −0.514140 |
| 01000011 | 0.849844 | −0.515379 |
| 01000100 | 0.968926 | −0.244322 |
| 01000101 | 0.961654 | −0.274266 |
| 01000110 | 0.846439 | −0.172785 |
| 01000111 | 0.814534 | −0.289437 |
| 01001000 | 0.660833 | −0.597951 |
| 01001001 | 0.635704 | −0.601179 |
| 01001010 | 0.703246 | −0.498537 |
| 01001011 | 0.713555 | −0.458342 |
| 01001100 | 0.982752 | −0.108821 |
| 01001101 | 0.995743 | −0.075153 |
| 01001110 | 0.835216 | −0.108792 |
| 01001111 | 0.734334 | −0.299494 |
| 01010000 | 0.563531 | −0.824212 |
| 01010001 | 0.538599 | −0.841459 |
| 01010010 | 0.422490 | −0.436968 |
| 01010011 | 0.486743 | −0.460303 |
| 01010100 | 0.533243 | −0.050591 |
| 01010101 | 0.625049 | −0.049186 |
| 01010110 | 0.460159 | −0.327276 |
| 01010111 | 0.545204 | −0.349786 |
| 01011000 | 0.466690 | −0.722489 |
| 01011001 | 0.472883 | −0.710099 |
| 01011010 | 0.416973 | −0.618858 |
| 01011011 | 0.459806 | −0.568347 |
| 01011100 | 0.496124 | −0.136766 |
| 01011101 | 0.632908 | −0.115646 |
| 01011110 | 0.478072 | −0.233508 |
| 01011111 | 0.637346 | −0.269821 |
| 01100000 | 0.150085 | −0.986638 |
| 01100001 | 0.096333 | −0.982163 |
| 01100010 | 0.054634 | −0.530674 |
| 01100011 | 0.124963 | −0.483488 |
| 01100100 | 0.039722 | −0.038334 |
| 01100101 | 0.135172 | −0.056012 |
| 01100110 | 0.055695 | −0.397262 |
| 01100111 | 0.117755 | −0.376976 |
| 01101000 | 0.077604 | −0.807366 |
| 01101001 | 0.114272 | −0.876917 |
| 01101010 | 0.077226 | −0.661268 |
| 01101011 | 0.142363 | −0.599635 |
| 01101100 | 0.048885 | −0.160450 |
| 01101101 | 0.167945 | −0.151950 |
| 01101110 | 0.046340 | −0.256559 |
| 01101111 | 0.151392 | −0.268874 |
| 01110000 | 0.368991 | −0.926086 |
| 01110001 | 0.380645 | −0.924004 |
| 01110010 | 0.333044 | −0.460912 |
| 01110011 | 0.244729 | −0.473505 |
| 01110100 | 0.373900 | −0.043782 |
| 01110101 | 0.245282 | −0.046720 |
| 01110110 | 0.338122 | −0.327772 |
| 01110111 | 0.246479 | −0.355455 |
| 01111000 | 0.271941 | −0.776781 |
| 01111001 | 0.314659 | −0.780426 |
| 01111010 | 0.281591 | −0.667979 |
| 01111011 | 0.269267 | −0.631313 |
| 01111100 | 0.391733 | −0.132460 |
| 01111101 | 0.267292 | −0.162978 |
| 01111110 | 0.375666 | −0.240801 |
| 01111111 | 0.260740 | −0.241834 |
| 10000000 | −0.729468 | 0.681354 |
| 10000001 | −0.738514 | 0.673491 |
| 10000010 | −0.855792 | 0.514140 |
| 10000011 | −0.849844 | 0.515379 |
| 10000100 | −0.968926 | 0.244322 |
| 10000101 | −0.961654 | 0.274266 |
| 10000110 | −0.846439 | 0.172785 |
| 10000111 | −0.814534 | 0.289437 |
| 10001000 | −0.660833 | 0.597951 |
| 10001001 | −0.635704 | 0.601179 |
| 10001010 | −0.703246 | 0.498537 |
| 10001011 | −0.713555 | 0.458342 |
| 10001100 | −0.982752 | 0.108821 |
| 10001101 | −0.995743 | 0.075153 |
| 10001110 | −0.835216 | 0.108792 |
| 10001111 | −0.734334 | 0.299494 |
| 10010000 | −0.563531 | 0.824212 |
| 10010001 | −0.538599 | 0.841459 |
| 10010010 | −0.422490 | 0.436968 |
| 10010011 | −0.486743 | 0.460303 |
| 10010100 | −0.533243 | 0.050591 |
| 10010101 | −0.625049 | 0.049186 |
| 10010110 | −0.460159 | 0.327276 |
| 10010111 | −0.545204 | 0.349786 |

TABLE 26A-continued

| COORDINATE BITS | SYMBOL X | SYMBOL Y |
|---|---|---|
| 10011000 | −0.466690 | 0.722489 |
| 10011001 | −0.472883 | 0.710099 |
| 10011010 | −0.416973 | 0.618858 |
| 10011011 | −0.459806 | 0.568347 |
| 10011100 | −0.496124 | 0.136766 |
| 10011101 | −0.632908 | 0.115646 |
| 10011110 | −0.478072 | 0.233508 |
| 10011111 | −0.637346 | 0.269821 |
| 10100000 | −0.150085 | 0.986638 |
| 10100001 | −0.096333 | 0.982163 |
| 10100010 | −0.054634 | 0.530674 |
| 10100011 | −0.124963 | 0.483488 |
| 10100100 | −0.039722 | 0.038334 |
| 10100101 | −0.135172 | 0.056012 |
| 10100110 | −0.055695 | 0.397262 |
| 10100111 | −0.117755 | 0.376976 |
| 10101000 | −0.077604 | 0.807366 |
| 10101001 | −0.114272 | 0.876917 |
| 10101010 | −0.077226 | 0.661268 |
| 10101011 | −0.142363 | 0.599635 |
| 10101100 | −0.048885 | 0.160450 |
| 10101101 | −0.167945 | 0.151950 |
| 10101110 | −0.046340 | 0.256559 |
| 10101111 | −0.151392 | 0.268874 |
| 10110000 | −0.368991 | 0.926086 |
| 10110001 | −0.380645 | 0.924004 |
| 10110010 | −0.333044 | 0.460912 |
| 10110011 | −0.244729 | 0.473505 |
| 10110100 | −0.373900 | 0.043782 |
| 10110101 | −0.245282 | 0.046720 |
| 10110110 | −0.338122 | 0.327772 |
| 10110111 | −0.246479 | 0.355455 |
| 10111000 | −0.271941 | 0.776781 |
| 10111001 | −0.314659 | 0.780426 |
| 10111010 | −0.281591 | 0.667979 |
| 10111011 | −0.269267 | 0.631313 |
| 10111100 | −0.391733 | 0.132460 |
| 10111101 | −0.267292 | 0.162978 |
| 10111110 | −0.375666 | 0.240801 |
| 10111111 | −0.260740 | 0.241834 |
| 11000000 | −0.729468 | −0.681354 |
| 11000001 | −0.738514 | −0.673491 |
| 11000010 | −0.855792 | −0.514140 |
| 11000011 | −0.849844 | −0.515379 |
| 11000100 | −0.968926 | −0.244322 |
| 11000101 | −0.961654 | −0.274266 |
| 11000110 | −0.846439 | −0.172785 |
| 11000111 | −0.814534 | −0.289437 |
| 11001000 | −0.660833 | −0.597951 |
| 11001001 | −0.635704 | −0.601179 |
| 11001010 | −0.703246 | −0.498537 |
| 11001011 | −0.713555 | −0.458342 |
| 11001100 | −0.982752 | −0.108821 |
| 11001101 | −0.995743 | −0.075153 |
| 11001110 | −0.835216 | −0.108792 |
| 11001111 | −0.734334 | −0.299494 |
| 11010000 | −0.563531 | −0.824212 |
| 11010001 | −0.538599 | −0.841459 |
| 11010010 | −0.422490 | −0.436968 |
| 11010011 | −0.486743 | −0.460303 |
| 11010100 | −0.533243 | −0.050591 |
| 11010101 | −0.625049 | −0.049186 |
| 11010110 | −0.460159 | −0.327276 |
| 11010111 | −0.545204 | −0.349786 |
| 11011000 | −0.466690 | −0.722489 |
| 11011001 | −0.472883 | −0.710099 |
| 11011010 | −0.416973 | −0.618858 |
| 11011011 | −0.459806 | −0.568347 |
| 11011100 | −0.496124 | −0.136766 |
| 11011101 | −0.632908 | −0.115646 |
| 11011110 | −0.478072 | −0.233508 |
| 11011111 | −0.637346 | −0.269821 |
| 11100000 | −0.150085 | −0.986638 |
| 11100001 | −0.096333 | −0.982163 |
| 11100010 | −0.054634 | −0.530674 |
| 11100011 | −0.124963 | −0.483488 |
| 11100100 | −0.039722 | −0.038334 |
| 11100101 | −0.135172 | −0.056012 |
| 11100110 | −0.055695 | −0.397262 |
| 11100111 | −0.117755 | −0.376976 |
| 11101000 | −0.077604 | −0.807366 |
| 11101001 | −0.114272 | −0.876917 |
| 11101010 | −0.077226 | −0.661268 |
| 11101011 | −0.142363 | −0.599635 |
| 11101100 | −0.048885 | −0.160450 |
| 11101101 | −0.167945 | −0.151950 |
| 11101110 | −0.046340 | −0.256559 |
| 11101111 | −0.151392 | −0.268874 |
| 11110000 | −0.368991 | −0.926086 |
| 11110001 | −0.380645 | −0.924004 |
| 11110010 | −0.333044 | −0.460912 |
| 11110011 | −0.244729 | −0.473505 |
| 11110100 | −0.373900 | −0.043782 |
| 11110101 | −0.245282 | −0.046720 |
| 11110110 | −0.338122 | −0.327772 |
| 11110111 | −0.246479 | −0.355455 |
| 11111000 | −0.271941 | −0.776781 |
| 11111001 | −0.314659 | −0.780426 |
| 11111010 | −0.281591 | −0.667979 |
| 11111011 | −0.269267 | −0.631313 |
| 11111100 | −0.391733 | −0.132460 |
| 11111101 | −0.267292 | −0.162978 |
| 11111110 | −0.375666 | −0.240801 |
| 11111111 | −0.260740 | −0.241834 |

TABLE 26B

| COORDINATE BITS | SYMBOL X | SYMBOL Y |
|---|---|---|
| 00000000 | 0.100722 | 0.994770 |
| 00000001 | 0.750351 | 0.661022 |
| 00000010 | 0.881575 | 0.471414 |
| 00000011 | 0.873252 | 0.483693 |
| 00000100 | 0.992123 | 0.101906 |
| 00000101 | 0.913440 | 0.102519 |
| 00000110 | 0.951789 | 0.302746 |
| 00000111 | 0.937645 | 0.339561 |
| 00001000 | 0.672550 | 0.570706 |
| 00001001 | 0.676544 | 0.624432 |
| 00001010 | 0.698643 | 0.418766 |
| 00001011 | 0.776531 | 0.393317 |
| 00001100 | 0.761618 | 0.102135 |
| 00001101 | 0.834592 | 0.108693 |
| 00001110 | 0.707515 | 0.282568 |
| 00001111 | 0.814401 | 0.272917 |
| 00010000 | 0.492252 | 0.870452 |
| 00010001 | 0.594583 | 0.796236 |
| 00010010 | 0.508862 | 0.423943 |
| 00010011 | 0.436952 | 0.512043 |
| 00010100 | 0.427335 | 0.024507 |
| 00010101 | 0.472640 | 0.103214 |
| 00010110 | 0.504587 | 0.325416 |
| 00010111 | 0.481372 | 0.201663 |
| 00011000 | 0.497458 | 0.750636 |
| 00011001 | 0.516303 | 0.690518 |
| 00011010 | 0.579766 | 0.455486 |
| 00011011 | 0.502377 | 0.570749 |
| 00011100 | 0.663972 | 0.082265 |
| 00011101 | 0.584150 | 0.076688 |
| 00011110 | 0.610969 | 0.277009 |
| 00011111 | 0.572290 | 0.199840 |
| 00100000 | 0.056666 | 0.691228 |
| 00100001 | 0.151272 | 0.675756 |
| 00100010 | 0.204894 | 0.530525 |
| 00100011 | 0.216699 | 0.584379 |
| 00100100 | 0.043480 | 0.044961 |
| 00100101 | 0.049099 | 0.162247 |

TABLE 26B-continued

| COORDINATE BITS | SYMBOL X | SYMBOL Y |
|---|---|---|
| 00100110 | 0.038237 | 0.360110 |
| 00100111 | 0.049416 | 0.284838 |
| 00101000 | 0.099703 | 0.839454 |
| 00101001 | 0.117273 | 0.821271 |
| 00101010 | 0.135244 | 0.463140 |
| 00101011 | 0.031880 | 0.529953 |
| 00101100 | 0.162184 | 0.047275 |
| 00101101 | 0.125789 | 0.162121 |
| 00101110 | 0.117611 | 0.404115 |
| 00101111 | 0.138289 | 0.256313 |
| 00110000 | 0.343736 | 0.937804 |
| 00110001 | 0.259185 | 0.697227 |
| 00110010 | 0.338770 | 0.448588 |
| 00110011 | 0.336399 | 0.578736 |
| 00110100 | 0.326500 | 0.064530 |
| 00110101 | 0.345811 | 0.144428 |
| 00110110 | 0.380906 | 0.330718 |
| 00110111 | 0.374826 | 0.247547 |
| 00111000 | 0.314588 | 0.835245 |
| 00111001 | 0.330246 | 0.739962 |
| 00111010 | 0.261873 | 0.406571 |
| 00111011 | 0.397693 | 0.622723 |
| 00111100 | 0.242090 | 0.072399 |
| 00111101 | 0.232395 | 0.167109 |
| 00111110 | 0.238175 | 0.347737 |
| 00111111 | 0.249935 | 0.249763 |
| 01000000 | 0.100722 | −0.994770 |
| 01000001 | 0.750351 | −0.661022 |
| 01000010 | 0.881575 | −0.471414 |
| 01000011 | 0.873252 | −0.483693 |
| 01000100 | 0.992123 | −0.101906 |
| 01000101 | 0.913440 | −0.102519 |
| 01000110 | 0.951789 | −0.302746 |
| 01000111 | 0.937645 | −0.339561 |
| 01001000 | 0.672550 | −0.570706 |
| 01001001 | 0.676544 | −0.624432 |
| 01001010 | 0.698643 | −0.418766 |
| 01001011 | 0.776531 | −0.393317 |
| 01001100 | 0.761618 | −0.102135 |
| 01001101 | 0.834592 | −0.108693 |
| 01001110 | 0.707515 | −0.282568 |
| 01001111 | 0.814401 | −0.272917 |
| 01010000 | 0.492252 | −0.870452 |
| 01010001 | 0.594583 | −0.796236 |
| 01010010 | 0.508862 | −0.423943 |
| 01010011 | 0.436952 | −0.512043 |
| 01010100 | 0.427335 | −0.024507 |
| 01010101 | 0.472640 | −0.103214 |
| 01010110 | 0.504587 | −0.325416 |
| 01010111 | 0.481372 | −0.201663 |
| 01011000 | 0.497458 | −0.750636 |
| 01011001 | 0.516303 | −0.690518 |
| 01011010 | 0.579766 | −0.455486 |
| 01011011 | 0.502377 | −0.570749 |
| 01011100 | 0.663972 | −0.082265 |
| 01011101 | 0.584150 | −0.076688 |
| 01011110 | 0.610969 | −0.277009 |
| 01011111 | 0.572290 | −0.199840 |
| 01100000 | 0.056666 | −0.691228 |
| 01100001 | 0.151272 | −0.675756 |
| 01100010 | 0.204894 | −0.530525 |
| 01100011 | 0.216699 | −0.584379 |
| 01100100 | 0.043480 | −0.044961 |
| 01100101 | 0.049099 | −0.162247 |
| 01100110 | 0.038237 | −0.360110 |
| 01100111 | 0.049416 | −0.284838 |
| 01101000 | 0.099703 | −0.839454 |
| 01101001 | 0.117273 | −0.821271 |
| 01101010 | 0.135244 | −0.463140 |
| 01101011 | 0.031880 | −0.529953 |
| 01101100 | 0.162184 | −0.047275 |
| 01101101 | 0.125789 | −0.162121 |
| 01101110 | 0.117611 | −0.404115 |
| 01101111 | 0.138289 | −0.256313 |
| 01110000 | 0.343736 | −0.937804 |
| 01110001 | 0.259185 | −0.697227 |
| 01110010 | 0.338770 | −0.448588 |
| 01110011 | 0.336399 | −0.578736 |
| 01110100 | 0.326500 | −0.064530 |
| 01110101 | 0.345811 | −0.144428 |
| 01110110 | 0.380906 | −0.330718 |
| 01110111 | 0.374826 | −0.247547 |
| 01111000 | 0.314588 | −0.835245 |
| 01111001 | 0.330246 | −0.739962 |
| 01111010 | 0.261873 | −0.406571 |
| 01111011 | 0.397693 | −0.622723 |
| 01111100 | 0.242090 | −0.072399 |
| 01111101 | 0.232395 | −0.167109 |
| 01111110 | 0.238175 | −0.347737 |
| 01111111 | 0.249935 | −0.249763 |
| 10000000 | −0.100722 | 0.994770 |
| 10000001 | −0.750351 | 0.661022 |
| 10000010 | −0.881575 | 0.471414 |
| 10000011 | −0.873252 | 0.483693 |
| 10000100 | −0.992123 | 0.101906 |
| 10000101 | −0.913440 | 0.102519 |
| 10000110 | −0.951789 | 0.302746 |
| 10000111 | −0.937645 | 0.339561 |
| 10001000 | −0.672550 | 0.570706 |
| 10001001 | −0.676544 | 0.624432 |
| 10001010 | −0.698643 | 0.418766 |
| 10001011 | −0.776531 | 0.393317 |
| 10001100 | −0.761618 | 0.102135 |
| 10001101 | −0.834592 | 0.108693 |
| 10001110 | −0.707515 | 0.282568 |
| 10001111 | −0.814401 | 0.272917 |
| 10010000 | −0.492252 | 0.870452 |
| 10010001 | −0.594583 | 0.796236 |
| 10010010 | −0.508862 | 0.423943 |
| 10010011 | −0.436952 | 0.512043 |
| 10010100 | −0.427335 | 0.024507 |
| 10010101 | −0.472640 | 0.103214 |
| 10010110 | −0.504587 | 0.325416 |
| 10010111 | −0.481372 | 0.201663 |
| 10011000 | −0.497458 | 0.750636 |
| 10011001 | −0.516303 | 0.690518 |
| 10011010 | −0.579766 | 0.455486 |
| 10011011 | −0.502377 | 0.570749 |
| 10011100 | −0.663972 | 0.082265 |
| 10011101 | −0.584150 | 0.076688 |
| 10011110 | −0.610969 | 0.277009 |
| 10011111 | −0.572290 | 0.199840 |
| 10100000 | −0.056666 | 0.691228 |
| 10100001 | −0.151272 | 0.675756 |
| 10100010 | −0.204894 | 0.530525 |
| 10100011 | −0.216699 | 0.584379 |
| 10100100 | −0.043480 | 0.044961 |
| 10100101 | −0.049099 | 0.162247 |
| 10100110 | −0.038237 | 0.360110 |
| 10100111 | −0.049416 | 0.284838 |
| 10101000 | −0.099703 | 0.839454 |
| 10101001 | −0.117273 | 0.821271 |
| 10101010 | −0.135244 | 0.463140 |
| 10101011 | −0.031880 | 0.529953 |
| 10101100 | −0.162184 | 0.047275 |
| 10101101 | −0.125789 | 0.162121 |
| 10101110 | −0.117611 | 0.404115 |
| 10101111 | −0.138289 | 0.256313 |
| 10110000 | −0.343736 | 0.937804 |
| 10110001 | −0.259185 | 0.697227 |
| 10110010 | −0.338770 | 0.448588 |
| 10110011 | −0.336399 | 0.578736 |
| 10110100 | −0.326500 | 0.064530 |
| 10110101 | −0.345811 | 0.144428 |
| 10110110 | −0.380906 | 0.330718 |
| 10110111 | −0.374826 | 0.247547 |
| 10111000 | −0.314588 | 0.835245 |
| 10111001 | −0.330246 | 0.739962 |
| 10111010 | −0.261873 | 0.406571 |
| 10111011 | −0.397693 | 0.622723 |
| 10111100 | −0.242090 | 0.072399 |
| 10111101 | −0.232395 | 0.167109 |

TABLE 26B-continued

| COORDINATE BITS | SYMBOL X | SYMBOL Y |
|---|---|---|
| 10111110 | −0.238175 | 0.347737 |
| 10111111 | −0.249935 | 0.249763 |
| 11000000 | −0.100722 | −0.994770 |
| 11000001 | −0.750351 | −0.661022 |
| 11000010 | −0.881575 | −0.471414 |
| 11000011 | −0.873252 | −0.483693 |
| 11000100 | −0.992123 | −0.101906 |
| 11000101 | −0.913440 | −0.102519 |
| 11000110 | −0.951789 | −0.302746 |
| 11000111 | −0.937645 | −0.339561 |
| 11001000 | −0.672550 | −0.570706 |
| 11001001 | −0.676544 | −0.624432 |
| 11001010 | −0.698643 | −0.418766 |
| 11001011 | −0.776531 | −0.393317 |
| 11001100 | −0.761618 | −0.102135 |
| 11001101 | −0.834592 | −0.108693 |
| 11001110 | −0.707515 | −0.282568 |
| 11001111 | −0.814401 | −0.272917 |
| 11010000 | −0.492252 | −0.870452 |
| 11010001 | −0.594583 | −0.796236 |
| 11010010 | −0.508862 | −0.423943 |
| 11010011 | −0.436952 | −0.512043 |
| 11010100 | −0.427335 | −0.024507 |
| 11010101 | −0.472640 | −0.103214 |
| 11010110 | −0.504587 | −0.325416 |
| 11010111 | −0.481372 | −0.201663 |
| 11011000 | −0.497458 | −0.750636 |
| 11011001 | −0.516303 | −0.690518 |
| 11011010 | −0.579766 | −0.455486 |
| 11011011 | −0.502377 | −0.570749 |
| 11011100 | −0.663972 | −0.082265 |
| 11011101 | −0.584150 | −0.076688 |
| 11011110 | −0.610969 | −0.277009 |
| 11011111 | −0.572290 | −0.199840 |
| 11100000 | −0.056666 | −0.691228 |
| 11100001 | −0.151272 | −0.675756 |
| 11100010 | −0.204894 | −0.530525 |
| 11100011 | −0.216699 | −0.584379 |
| 11100100 | −0.043480 | −0.044961 |
| 11100101 | −0.049099 | −0.162247 |
| 11100110 | −0.038237 | −0.360110 |
| 11100111 | −0.049416 | −0.284838 |
| 11101000 | −0.099703 | −0.839454 |
| 11101001 | −0.117273 | −0.821271 |
| 11101010 | −0.135244 | −0.463140 |
| 11101011 | −0.031880 | −0.529953 |
| 11101100 | −0.162184 | −0.047275 |
| 11101101 | −0.125789 | −0.162121 |
| 11101110 | −0.117611 | −0.404115 |
| 11101111 | −0.138289 | −0.256313 |
| 11110000 | −0.343736 | −0.937804 |
| 11110001 | −0.259185 | −0.697227 |
| 11110010 | −0.338770 | −0.448588 |
| 11110011 | −0.336399 | −0.578736 |
| 11110100 | −0.326500 | −0.064530 |
| 11110101 | −0.345811 | −0.144428 |
| 11110110 | −0.380906 | −0.330718 |
| 11110111 | −0.374826 | −0.247547 |
| 11111000 | −0.314588 | −0.835245 |
| 11111001 | −0.330246 | −0.739962 |
| 11111010 | −0.261873 | −0.406571 |
| 11111011 | −0.397693 | −0.622723 |
| 11111100 | −0.242090 | −0.072399 |
| 11111101 | −0.232395 | −0.167109 |
| 11111110 | −0.238175 | −0.347737 |
| 11111111 | −0.249935 | −0.249763 |

TABLE 26C

| COORDINATE BITS | SYMBOL X | SYMBOL Y |
|---|---|---|
| 00000000 | 0.704805 | 0.709401 |
| 00000001 | 0.653485 | 0.647271 |
| 00000010 | 0.839635 | 0.536645 |
| 00000011 | 0.779762 | 0.466418 |
| 00000100 | 0.950855 | 0.309585 |
| 00000101 | 0.898873 | 0.237975 |
| 00000110 | 0.791594 | 0.179828 |
| 00000111 | 0.816680 | 0.306330 |
| 00001000 | 0.505509 | 0.556460 |
| 00001001 | 0.578086 | 0.594539 |
| 00001010 | 0.604085 | 0.430430 |
| 00001011 | 0.675607 | 0.467474 |
| 00001100 | 0.995507 | 0.093945 |
| 00001101 | 0.927144 | 0.066550 |
| 00001110 | 0.798416 | 0.068850 |
| 00001111 | 0.692878 | 0.075290 |
| 00010000 | 0.479391 | 0.863511 |
| 00010001 | 0.505225 | 0.774265 |
| 00010010 | 0.484617 | 0.414350 |
| 00010011 | 0.520888 | 0.310957 |
| 00010100 | 0.381499 | 0.038864 |
| 00010101 | 0.487670 | 0.092097 |
| 00010110 | 0.411849 | 0.258755 |
| 00010111 | 0.487732 | 0.202001 |
| 00011000 | 0.406573 | 0.655126 |
| 00011001 | 0.462736 | 0.718925 |
| 00011010 | 0.664047 | 0.289395 |
| 00011011 | 0.596484 | 0.264203 |
| 00011100 | 0.355974 | 0.107909 |
| 00011101 | 0.560999 | 0.039644 |
| 00011110 | 0.359573 | 0.187393 |
| 00011111 | 0.615102 | 0.131990 |
| 00100000 | 0.115389 | 0.992829 |
| 00100001 | 0.099077 | 0.892498 |
| 00100010 | 0.049649 | 0.509714 |
| 00100011 | 0.145149 | 0.483577 |
| 00100100 | 0.041063 | 0.109972 |
| 00100101 | 0.054519 | 0.039305 |
| 00100110 | 0.056636 | 0.417591 |
| 00100111 | 0.146141 | 0.395735 |
| 00101000 | 0.120064 | 0.703253 |
| 00101001 | 0.072859 | 0.801344 |
| 00101010 | 0.058365 | 0.627881 |
| 00101011 | 0.138895 | 0.590276 |
| 00101100 | 0.039437 | 0.207733 |
| 00101101 | 0.107948 | 0.211695 |
| 00101110 | 0.044117 | 0.330946 |
| 00101111 | 0.135942 | 0.306297 |
| 00110000 | 0.296688 | 0.951488 |
| 00110001 | 0.300001 | 0.845945 |
| 00110010 | 0.381891 | 0.443738 |
| 00110011 | 0.259783 | 0.465152 |
| 00110100 | 0.258503 | 0.034355 |
| 00110101 | 0.161844 | 0.058432 |
| 00110110 | 0.366199 | 0.349348 |
| 00110111 | 0.261819 | 0.363870 |
| 00111000 | 0.262841 | 0.689677 |
| 00111001 | 0.249677 | 0.780505 |
| 00111010 | 0.347351 | 0.553715 |
| 00111011 | 0.238875 | 0.569146 |
| 00111100 | 0.254190 | 0.129082 |
| 00111101 | 0.178447 | 0.154862 |
| 00111110 | 0.285410 | 0.232281 |
| 00111111 | 0.211277 | 0.280009 |
| 01000000 | 0.704805 | −0.709401 |
| 01000001 | 0.653485 | −0.647271 |
| 01000010 | 0.839635 | −0.536645 |
| 01000011 | 0.779762 | −0.466418 |
| 01000100 | 0.950855 | −0.309585 |
| 01000101 | 0.898873 | −0.237975 |
| 01000110 | 0.791594 | −0.179828 |
| 01000111 | 0.816680 | −0.306330 |
| 01001000 | 0.505509 | −0.556460 |
| 01001001 | 0.578086 | −0.594539 |
| 01001010 | 0.604085 | −0.430430 |
| 01001011 | 0.675607 | −0.467474 |

TABLE 26C-continued

| COORDINATE BITS | SYMBOL X | SYMBOL Y |
|---|---|---|
| 01001100 | 0.995507 | −0.093945 |
| 01001101 | 0.927144 | −0.066550 |
| 01001110 | 0.798416 | −0.068850 |
| 01001111 | 0.692878 | −0.075290 |
| 01010000 | 0.479391 | −0.863511 |
| 01010001 | 0.505225 | −0.774265 |
| 01010010 | 0.484617 | −0.414350 |
| 01010011 | 0.520888 | −0.310957 |
| 01010100 | 0.381499 | −0.038864 |
| 01010101 | 0.487670 | −0.092097 |
| 01010110 | 0.411849 | −0.258755 |
| 01010111 | 0.487732 | −0.202001 |
| 01011000 | 0.406573 | −0.655126 |
| 01011001 | 0.462736 | −0.718925 |
| 01011010 | 0.664047 | −0.289395 |
| 01011011 | 0.596484 | −0.264203 |
| 01011100 | 0.355974 | −0.107909 |
| 01011101 | 0.560999 | −0.039644 |
| 01011110 | 0.359573 | −0.187393 |
| 01011111 | 0.615102 | −0.131990 |
| 01100000 | 0.115389 | −0.992829 |
| 01100001 | 0.099077 | −0.892498 |
| 01100010 | 0.049649 | −0.509714 |
| 01100011 | 0.145149 | −0.483577 |
| 01100100 | 0.041063 | −0.109972 |
| 01100101 | 0.054519 | −0.039305 |
| 01100110 | 0.056636 | −0.417591 |
| 01100111 | 0.146141 | −0.395735 |
| 01101000 | 0.120064 | −0.703253 |
| 01101001 | 0.072859 | −0.801344 |
| 01101010 | 0.058365 | −0.627881 |
| 01101011 | 0.138895 | −0.590276 |
| 01101100 | 0.039437 | −0.207733 |
| 01101101 | 0.107948 | −0.211695 |
| 01101110 | 0.044117 | −0.330946 |
| 01101111 | 0.135942 | −0.306297 |
| 01110000 | 0.296688 | −0.951488 |
| 01110001 | 0.300001 | −0.845945 |
| 01110010 | 0.381891 | −0.443738 |
| 01110011 | 0.259783 | −0.465152 |
| 01110100 | 0.258503 | −0.034355 |
| 01110101 | 0.161844 | −0.058432 |
| 01110110 | 0.366199 | −0.349348 |
| 01110111 | 0.261819 | −0.363870 |
| 01111000 | 0.262841 | −0.689677 |
| 01111001 | 0.249677 | −0.780505 |
| 01111010 | 0.347351 | −0.553715 |
| 01111011 | 0.238875 | −0.569146 |
| 01111100 | 0.254190 | −0.129082 |
| 01111101 | 0.178447 | −0.154862 |
| 01111110 | 0.285410 | −0.232281 |
| 01111111 | 0.211277 | −0.280009 |
| 10000000 | −0.704805 | 0.709401 |
| 10000001 | −0.653485 | 0.647271 |
| 10000010 | −0.839635 | 0.536645 |
| 10000011 | −0.779762 | 0.466418 |
| 10000100 | −0.950855 | 0.309585 |
| 10000101 | −0.898873 | 0.237975 |
| 10000110 | −0.791594 | 0.179828 |
| 10000111 | −0.816680 | 0.306330 |
| 10001000 | −0.505509 | 0.556460 |
| 10001001 | −0.578086 | 0.594539 |
| 10001010 | −0.604085 | 0.430430 |
| 10001011 | −0.675607 | 0.467474 |
| 10001100 | −0.995507 | 0.093945 |
| 10001101 | −0.927144 | 0.066550 |
| 10001110 | −0.798416 | 0.068850 |
| 10001111 | −0.692878 | 0.075290 |
| 10010000 | −0.479391 | 0.863511 |
| 10010001 | −0.505225 | 0.774265 |
| 10010010 | −0.484617 | 0.414350 |
| 10010011 | −0.520888 | 0.310957 |
| 10010100 | −0.381499 | 0.038864 |
| 10010101 | −0.487670 | 0.092097 |
| 10010110 | −0.411849 | 0.258755 |
| 10010111 | −0.487732 | 0.202001 |
| 10011000 | −0.406573 | 0.655126 |
| 10011001 | −0.462736 | 0.718925 |
| 10011010 | −0.664047 | 0.289395 |
| 10011011 | −0.596484 | 0.264203 |
| 10011100 | −0.355974 | 0.107909 |
| 10011101 | −0.560999 | 0.039644 |
| 10011110 | −0.359573 | 0.187393 |
| 10011111 | −0.615102 | 0.131990 |
| 10100000 | −0.115389 | 0.992829 |
| 10100001 | −0.099077 | 0.892498 |
| 10100010 | −0.049649 | 0.509714 |
| 10100011 | −0.145149 | 0.483577 |
| 10100100 | −0.041063 | 0.109972 |
| 10100101 | −0.054519 | 0.039305 |
| 10100110 | −0.056636 | 0.417591 |
| 10100111 | −0.146141 | 0.395735 |
| 10101000 | −0.120064 | 0.703253 |
| 10101001 | −0.072859 | 0.801344 |
| 10101010 | −0.058365 | 0.627881 |
| 10101011 | −0.138895 | 0.590276 |
| 10101100 | −0.039437 | 0.207733 |
| 10101101 | −0.107948 | 0.211695 |
| 10101110 | −0.044117 | 0.330946 |
| 10101111 | −0.135942 | 0.306297 |
| 10110000 | −0.296688 | 0.951488 |
| 10110001 | −0.300001 | 0.845945 |
| 10110010 | −0.381891 | 0.443738 |
| 10110011 | −0.259783 | 0.465152 |
| 10110100 | −0.258503 | 0.034355 |
| 10110101 | −0.161844 | 0.058432 |
| 10110110 | −0.366199 | 0.349348 |
| 10110111 | −0.261819 | 0.363870 |
| 10111000 | −0.262841 | 0.689677 |
| 10111001 | −0.249677 | 0.780505 |
| 10111010 | −0.347351 | 0.553715 |
| 10111011 | −0.238875 | 0.569146 |
| 10111100 | −0.254190 | 0.129082 |
| 10111101 | −0.178447 | 0.154862 |
| 10111110 | −0.285410 | 0.232281 |
| 10111111 | −0.211277 | 0.280009 |
| 11000000 | −0.704805 | −0.709401 |
| 11000001 | −0.653485 | −0.647271 |
| 11000010 | −0.839635 | −0.536645 |
| 11000011 | −0.779762 | −0.466418 |
| 11000100 | −0.950855 | −0.309585 |
| 11000101 | −0.898873 | −0.237975 |
| 11000110 | −0.791594 | −0.179828 |
| 11000111 | −0.816680 | −0.306330 |
| 11001000 | −0.505509 | −0.556460 |
| 11001001 | −0.578086 | −0.594539 |
| 11001010 | −0.604085 | −0.430430 |
| 11001011 | −0.675607 | −0.467474 |
| 11001100 | −0.995507 | −0.093945 |
| 11001101 | −0.927144 | −0.066550 |
| 11001110 | −0.798416 | −0.068850 |
| 11001111 | −0.692878 | −0.075290 |
| 11010000 | −0.479391 | −0.863511 |
| 11010001 | −0.505225 | −0.774265 |
| 11010010 | −0.484617 | −0.414350 |
| 11010011 | −0.520888 | −0.310957 |
| 11010100 | −0.381499 | −0.038864 |
| 11010101 | −0.487670 | −0.092097 |
| 11010110 | −0.411849 | −0.258755 |
| 11010111 | −0.487732 | −0.202001 |
| 11011000 | −0.406573 | −0.655126 |
| 11011001 | −0.462736 | −0.718925 |
| 11011010 | −0.664047 | −0.289395 |
| 11011011 | −0.596484 | −0.264203 |
| 11011100 | −0.355974 | −0.107909 |
| 11011101 | −0.560999 | −0.039644 |
| 11011110 | −0.359573 | −0.187393 |
| 11011111 | −0.615102 | −0.131990 |
| 11100000 | −0.115389 | −0.992829 |
| 11100001 | −0.099077 | −0.892498 |
| 11100010 | −0.049649 | −0.509714 |
| 11100011 | −0.145149 | −0.483577 |

TABLE 26C-continued

| COORDINATE BITS | SYMBOL X | SYMBOL Y |
|---|---|---|
| 11100100 | −0.041063 | −0.109972 |
| 11100101 | −0.054519 | −0.039305 |
| 11100110 | −0.056636 | −0.417591 |
| 11100111 | −0.146141 | −0.395735 |
| 11101000 | −0.120064 | −0.703253 |
| 11101001 | −0.072859 | −0.801344 |
| 11101010 | −0.058365 | −0.627881 |
| 11101011 | −0.138895 | −0.590276 |
| 11101100 | −0.039437 | −0.207733 |
| 11101101 | −0.107948 | −0.211695 |
| 11101110 | −0.044117 | −0.330946 |
| 11101111 | −0.135942 | −0.306297 |
| 11110000 | −0.296688 | −0.951488 |
| 11110001 | −0.300001 | −0.845945 |
| 11110010 | −0.381891 | −0.443738 |
| 11110011 | −0.259783 | −0.465152 |
| 11110100 | −0.258503 | −0.034355 |
| 11110101 | −0.161844 | −0.058432 |
| 11110110 | −0.366199 | −0.349348 |
| 11110111 | −0.261819 | −0.363870 |
| 11111000 | −0.262841 | −0.689677 |
| 11111001 | −0.249677 | −0.780505 |
| 11111010 | −0.347351 | −0.553715 |
| 11111011 | −0.238875 | −0.569146 |
| 11111100 | −0.254190 | −0.129082 |
| 11111101 | −0.178447 | −0.154862 |
| 11111110 | −0.285410 | −0.232281 |
| 11111111 | −0.211277 | −0.280009 |

Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A method for wireless communication using digital Quadrature Amplitude Modulation (QAM), the method comprising:
   translating between constellation symbols and bit sequences corresponding to the constellation symbols using a mapping module electronic component of a wireless communication device, in accordance with a 64-point constellation;
   wherein normalized magnitudes of the constellation symbols in a first quadrant of the 64-point constellation are defined by the following coordinate pairs to at least three decimal places of precision:

| | |
|---|---|
| 1.484430 | 0.355657 |
| 1.103689 | 0.241419 |
| 0.483043 | 0.093713 |
| 0.757638 | 0.144839 |
| 1.150175 | 0.837105 |
| 0.876141 | 0.599840 |
| 0.335946 | 0.248000 |
| 0.608728 | 0.420395 |
| 0.255763 | 1.404577 |
| 0.189712 | 1.014604 |
| 0.088351 | 0.457627 |
| 0.166639 | 0.679954 |
| 0.768973 | 1.227892 |
| 0.588939 | 0.901538 |
| 0.105757 | 0.127560 |
| 0.433169 | 0.631655 | and
   transmitting, by a transmitter of the wireless communication device, a wireless signal, the wireless signal modulated in accordance with the constellation symbols to mitigate phase noise.

2. The method of claim 1, wherein normalized magnitudes of the constellation symbols in the first quadrant of the 64-point constellation are defined by the coordinate pairs to at least four decimal places of precision.

3. The method of claim 1, wherein normalized magnitudes of the constellation symbols in the first quadrant of the 64-point constellation are defined by the coordinate pairs to at least five decimal places of precision.

4. The method of claim 1, wherein normalized magnitudes of the constellation symbols in the first quadrant of the 64-point constellation are defined by the coordinate pairs to six decimal places of precision.

5. The method of claim 1, wherein the constellation is a reflection-symmetric constellation.

6. The method of claim 1, wherein:
   the first coordinates of the coordinate pairs represent normalized magnitudes of one of: in-phase components; and quadrature components of the constellation symbols, and
   the second coordinates of the coordinate pairs represent normalized magnitudes of the other one of the in-phase components and the quadrature components of the constellation symbols.

7. The method of claim 1, wherein the bit sequences are assigned to the constellation symbols using Gray mapping.

8. The method of claim 1, wherein each of the bit sequences is of length 6 bits, including 4 quadrant non-specific bits, and wherein, for an index value k ranging from k=1 to k=16 inclusive: the quadrant non-specific bits of the bit sequence corresponding to the constellation symbol defined by a $k^{th}$-listed one of the coordinate pairs are equal to: a binary representation of k−1; the binary representation of k−1 added to a constant value under Modulo-16 addition; the binary representation of k−1 subjected to a consistent bit reordering, or the binary representation of k−1 added to a constant value under Modulo-16 addition and subjected to the consistent bit reordering.

9. The method of claim 8, wherein the constellation is a reflection symmetric constellation, and wherein bit sequences corresponding to constellation symbols within a common group of reflection symmetric constellation symbols have identical quadrant non-specific bits.

10. An apparatus for a wireless communication device configured for wireless communication using digital Quadrature Amplitude Modulation (QAM), the apparatus comprising:
- a mapping module electronic component configured to translate between constellation symbols and bit sequences corresponding to the constellation symbols in accordance with a 64-point constellation;
- wherein normalized magnitudes of the constellation symbols in a first quadrant of the 64-point constellation are defined by the following coordinate pairs to at least three decimal places of precision:

| | |
|---|---|
| 1.484430 | 0.355657 |
| 1.103689 | 0.241419 |
| 0.483043 | 0.093713 |
| 0.757638 | 0.144839 |
| 1.150175 | 0.837105 |
| 0.876141 | 0.599840 |
| 0.335946 | 0.248000 |
| 0.608728 | 0.420395 |
| 0.255763 | 1.404577 |
| 0.189712 | 1.014604 |
| 0.088351 | 0.457627 |
| 0.166639 | 0.679954 |
| 0.768973 | 1.227892 |
| 0.588939 | 0.901538 |
| 0.105757 | 0.127560 |
| 0.433169 | 0.631655 | and
- a transmitter configured to transmit a wireless signal, the wireless signal modulated in accordance with the constellation symbols to mitigate phase noise.

11. The apparatus of claim 10, wherein normalized magnitudes of the constellation symbols in the first quadrant of the 64-point constellation are defined by the coordinate pairs to at least four decimal places of precision.

12. The apparatus of claim 10, wherein normalized magnitudes of the constellation symbols in the first quadrant of the 64-point constellation are defined by the coordinate pairs to at least five decimal places of precision.

13. The apparatus of claim 10, wherein normalized magnitudes of the constellation symbols in the first quadrant of the 64-point constellation are defined by the coordinate pairs to six decimal places of precision.

14. The apparatus of claim 10, wherein the constellation is a reflection-symmetric constellation.

15. The apparatus of claim 10, wherein the left-hand-side coordinates the coordinate pairs represent normalized magnitudes of one of: in-phase components; and quadrature components of the constellation symbols, and the right-hand-side coordinates of the coordinate pairs represent normalized magnitudes of the other one of the in-phase components and the quadrature components of the constellation symbols.

16. The apparatus of claim 10, wherein the bit sequences are assigned to the constellation symbols using Gray mapping.

17. The apparatus of claim 10, wherein each of the bit sequences is of length 6 bits, including 4 quadrant non-specific bits, and wherein, for an index value k ranging from k=1 to k=16 inclusive: the quadrant non-specific bits of the bit sequence corresponding to the constellation symbol defined by a $k^{th}$-listed one of the coordinate pairs are equal to: a binary representation of k−1; the binary representation of k−1 added to a constant value under Modulo-16 addition; the binary representation of k−1 subjected to a consistent bit reordering, or the binary representation of k−1 added to a constant value under Modulo-16 addition and subjected to the consistent bit reordering.

18. The apparatus of claim 17, wherein the constellation is a reflection symmetric constellation, and wherein bit sequences corresponding to constellation symbols within a common group of reflection symmetric constellation symbols have identical quadrant non-specific bits.

* * * * *